United States Patent
Torii

(10) Patent No.: US 8,089,808 B2
(45) Date of Patent: *Jan. 3, 2012

(54) NONVOLATILE SEMICONDUCTOR MEMORY DEVICE, AND READING METHOD, WRITING METHOD AND ERASING METHOD OF NONVOLATILE SEMICONDUCTOR MEMORY DEVICE

(75) Inventor: Satoshi Torii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 167 days.

This patent is subject to a terminal disclaimer.

(21) Appl. No.: 12/413,052

(22) Filed: Mar. 27, 2009

(65) Prior Publication Data

US 2009/0180321 A1    Jul. 16, 2009

Related U.S. Application Data

(63) Continuation of application No. PCT/JP2006/319598, filed on Sep. 29, 2006.

(51) Int. Cl.
*G11C 16/94* (2006.01)
*G11C 16/86* (2006.01)

(52) U.S. Cl. .......... 365/185.05; 365/185.18; 365/185.29

(58) Field of Classification Search .......... None
See application file for complete search history.

(56) References Cited

U.S. PATENT DOCUMENTS

| | | | |
|---|---|---|---|
| 5,592,415 A | 1/1997 | Kato et al. | |
| 6,169,307 B1 | 1/2001 | Takahashi et al. | |
| 6,639,843 B2 | 10/2003 | Miyauchi | |
| 6,788,577 B2 | 9/2004 | Mihara | |
| 6,788,579 B2 | 9/2004 | Gregori et al. | |
| 6,940,762 B2 * | 9/2005 | Umezawa | 365/189.11 |
| 7,057,230 B2 | 6/2006 | Tanaka et al. | |
| 2002/0130314 A1 | 9/2002 | Yim et al. | |
| 2002/0191444 A1 | 12/2002 | Gregori et al. | |
| 2003/0058712 A1 | 3/2003 | Yamamoto et al. | |
| 2004/0252558 A1 | 12/2004 | Umezawa | |
| 2005/0083744 A1 | 4/2005 | Arai et al. | |
| 2005/0248992 A1 | 11/2005 | Hwang et al. | |

(Continued)

FOREIGN PATENT DOCUMENTS

JP    5-167044 A    7/1993

(Continued)

OTHER PUBLICATIONS

International Search Report of PCT/JP2006/319598, Mailing Date of Nov. 14, 2006.

(Continued)

*Primary Examiner* — Hoai V Ho
*Assistant Examiner* — James G Norman
(74) *Attorney, Agent, or Firm* — Westerman, Hattori, Daniels & Adrian, LLP

(57) ABSTRACT

A nonvolatile semiconductor memory including a memory cell array of memory cells arranged in a matrix, each of which includes a selective transistor and a memory cell transistor; the first column decoder for controlling the potentials of the bit lines and the source lines; the first row decoder for controlling the potential of the first word lines; the second row decoder for controlling the potential of the second word lines; and the second column decoder. The first column decoder includes a circuit whose withstand voltage is lower than the first row decoder and the second column decoder, and the second row decoder includes a circuit whose withstand voltage is lower than the first row decoder and the second column decoder.

15 Claims, 48 Drawing Sheets

U.S. PATENT DOCUMENTS

2008/0080247 A1 * 4/2008 Chang .................. 365/185.18

FOREIGN PATENT DOCUMENTS

| | | |
|---|---|---|
| JP | 6-77437 A | 3/1994 |
| JP | 11-177068 A | 7/1999 |
| JP | 11-260073 A | 9/1999 |
| JP | 2000-40808 A | 2/2002 |
| JP | 2002-319293 A | 10/2002 |
| JP | 2002-324860 A | 11/2002 |
| JP | 2003-100092 A | 4/2003 |
| JP | 2005-116970 A | 4/2005 |
| JP | 2005-122772 A | 5/2005 |
| TW | 525170 | 3/2003 |
| TW | 594724 | 6/2004 |
| WO | 03/012878 A1 | 2/2003 |
| WO | 2006/085373 A1 | 8/2006 |

OTHER PUBLICATIONS

Taiwanese Office Action dated Oct. 22, 2008, issued in corresponding Taiwanese Patent Application No. 095137268.

International Search Report of PCT/JP2007/068849 date of mailing Jan. 8, 2008.

* cited by examiner

FIG. 6

| | BIT LINE | SOURCE LINE | FIRST WORD LINE | SECOND WORD LINE | WELL |
|---|---|---|---|---|---|
| READ | Vcc (F) | SELECTED SOURCE LINE : 0V ADJACENT SOURCE LINE : Vcc OTHERS : F | CONSTANTLY Vcc | Vcc (0V) | 0V |
| WRITE | SELECTED BIT LINE : 0V ADJACENT BIT LINE : Vcc OTHERS : 0V | 5V (F) | 9V (0V or F) | Vcc (0V) | 0V |
| ERASE | FLOATING | FLOATING | −9V | FLOATING | +9V |

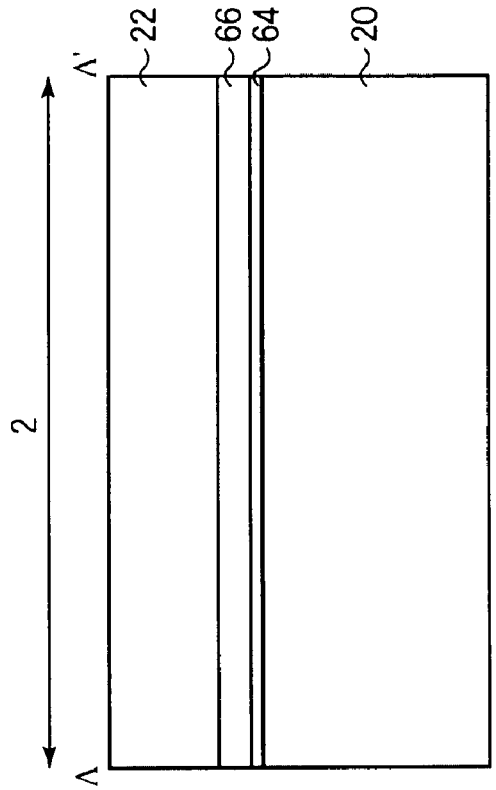
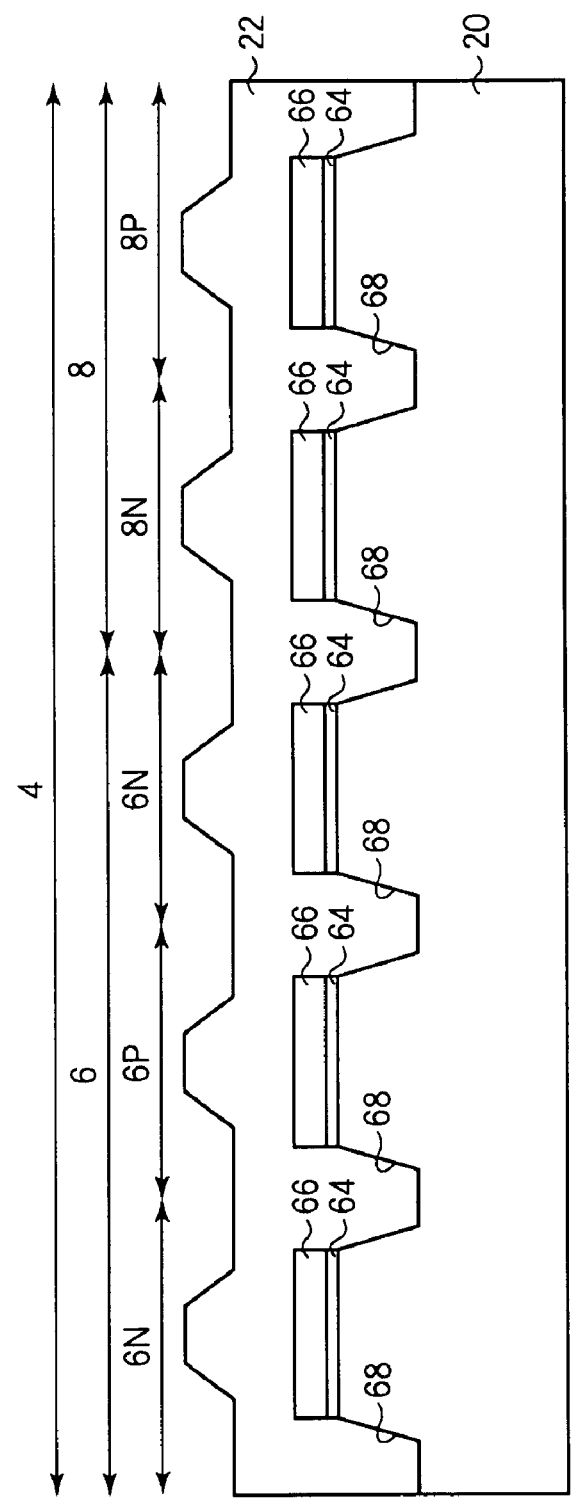
FIG. 12A
FIG. 12B

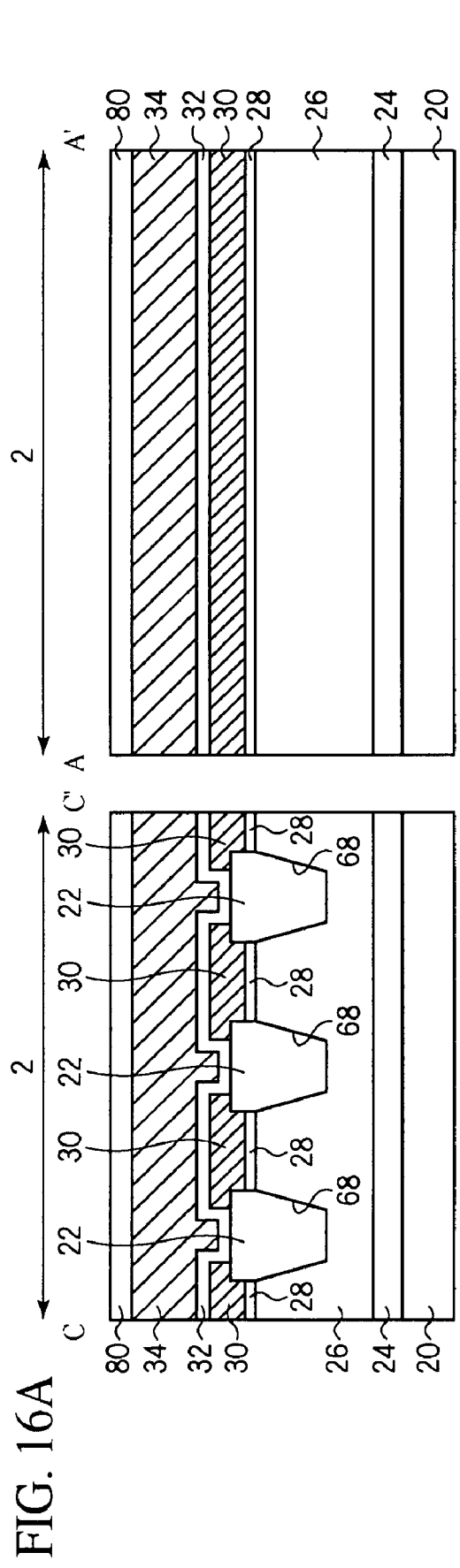
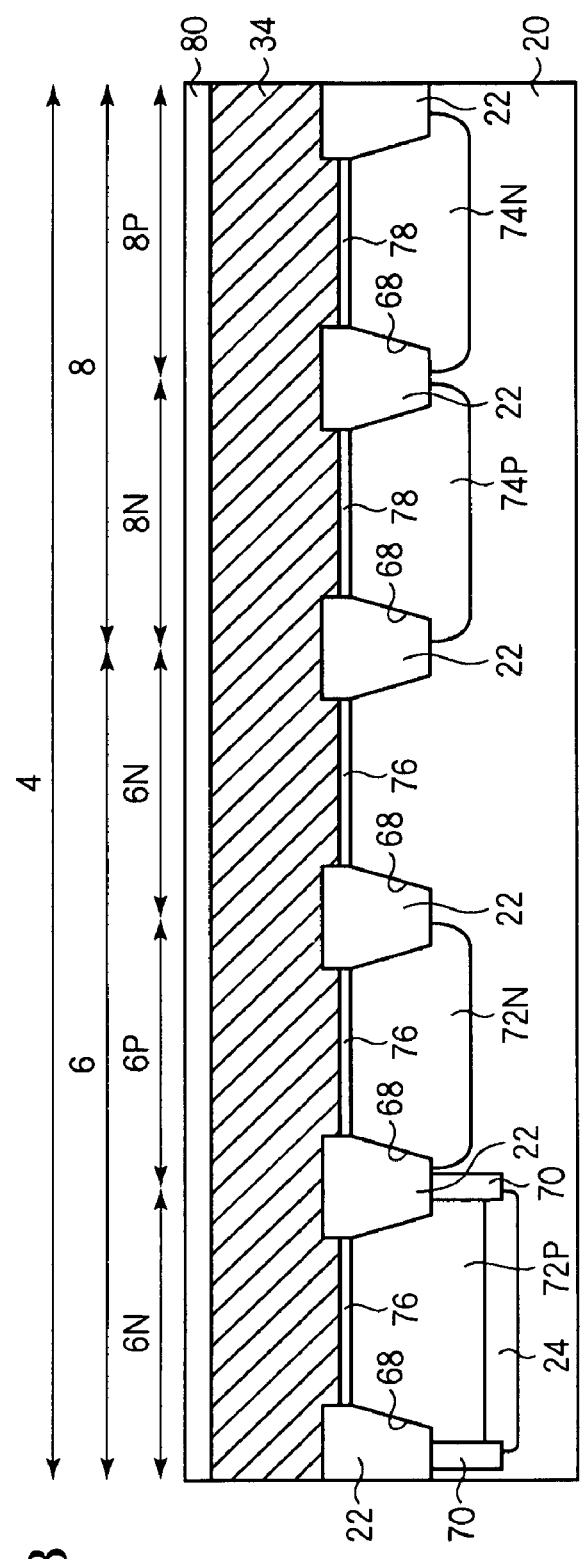
FIG. 16A
FIG. 16B

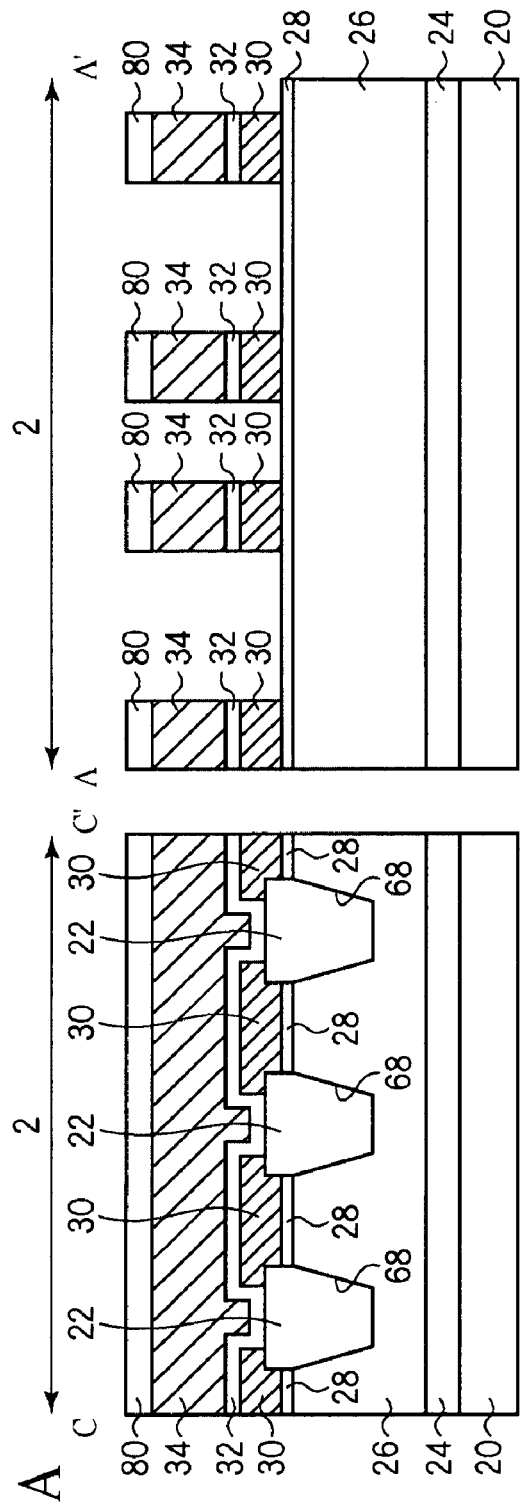
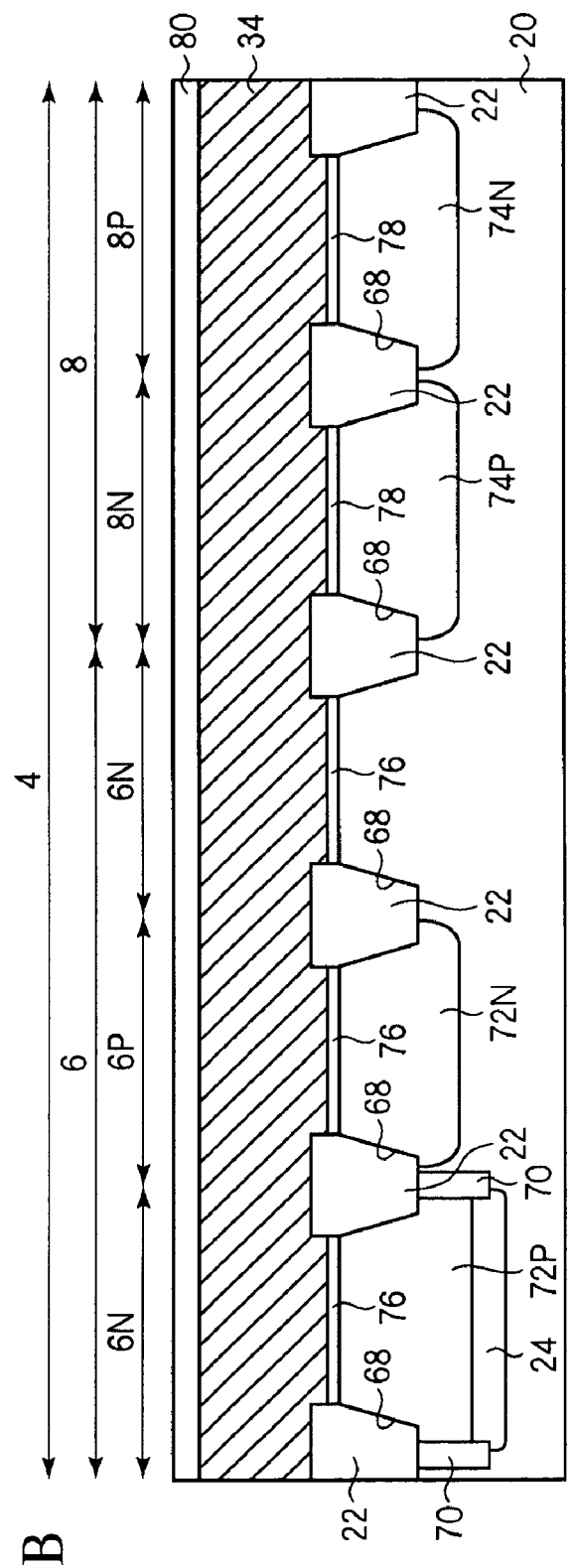
FIG. 17A
FIG. 17B

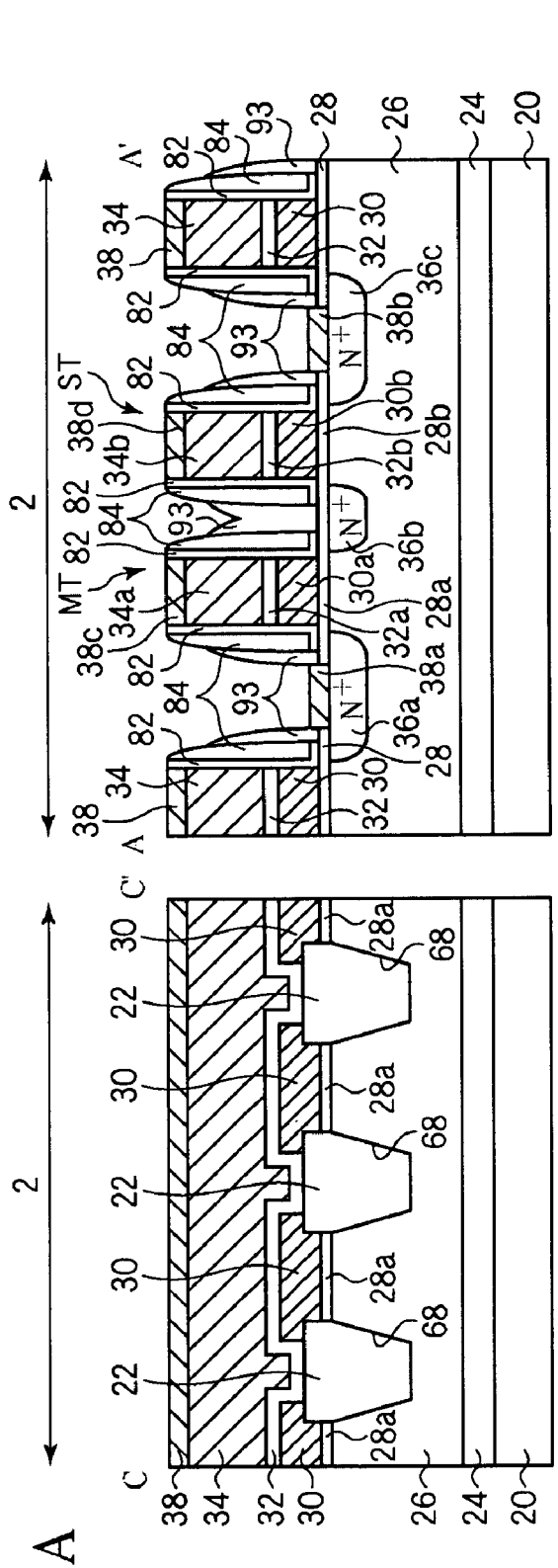
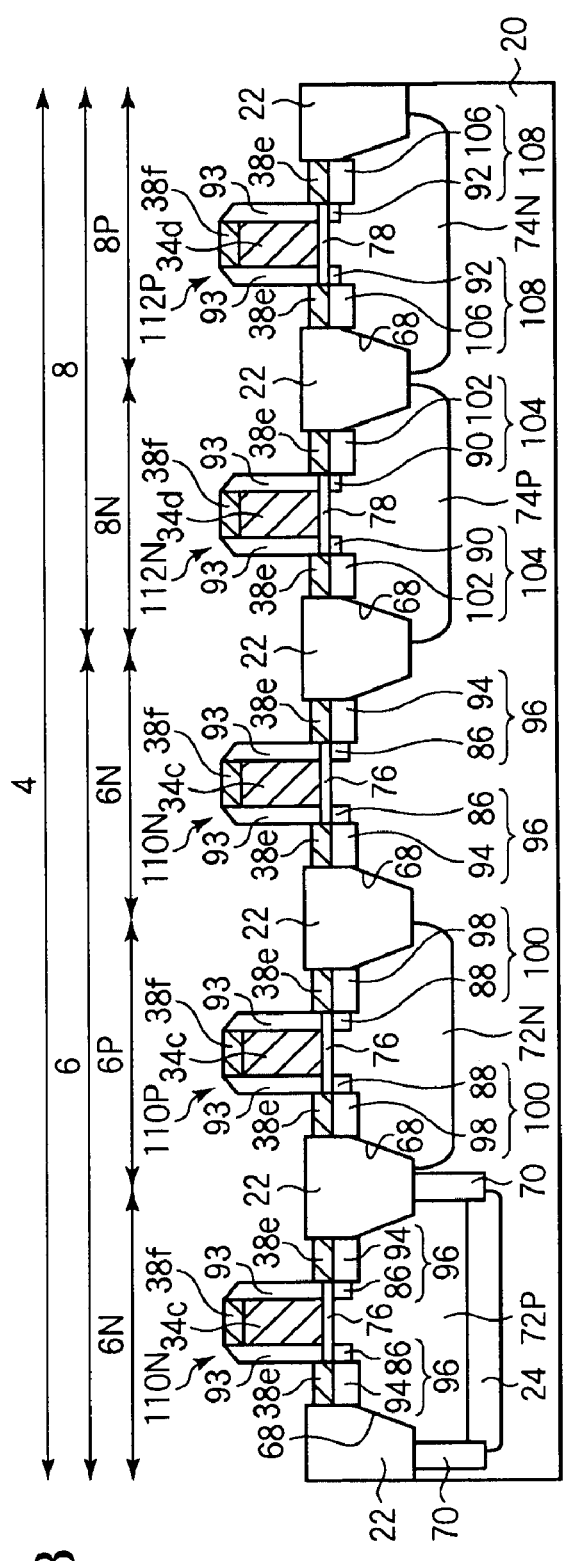
FIG. 20A
FIG. 20B

FIG. 27

|  | BIT LINE | SOURCE LINE | FIRST WORD LINE | SECOND WORD LINE | WELL |
|---|---|---|---|---|---|
| READ | SELECTED BIT LINE: Vcc ADJACENT BIT LINE: Vcc OTHERS: F | SELECTED SOURCE LINE: 0V ADJACENT SOURCE LINE: Vcc OTHERS: F | CONSTANTLY Vcc | Vcc (0V) | 0V |
| WRITE | SELECTED BIT LINE: 0V ADJACENT BIT LINE: Vcc OTHERS: 0V | 5V (F) | 9V (0V or F) | Vcc (0V) | 0V |
| ERASE | FLOATING | FLOATING | −9V | FLOATING | +9V |

FIG. 30

| | BIT LINE | SOURCE LINE | FIRST WORD LINE | SECOND WORD LINE | WELL |
|---|---|---|---|---|---|
| READ | Vcc (Vcc') | Vcc (Vcc') | CONSTANTLY Vcc | Vcc (0V) | 0V |
| WRITE | SELECTED BIT LINE : 0V ADJACENT BIT LINE : Vcc OTHERS : 0V | 5V (F) | 9V (0V or F) | Vcc (0V) | 0V |
| ERASE | FLOATING | FLOATING | −9V | FLOATING | +9V |

FIG. 36

|  | BIT LINE | SOURCE LINE | FIRST WORD LINE | SECOND WORD LINE | WELL |
|---|---|---|---|---|---|
| READ | Vcc (Vcc') | Vcc (Vcc') | CONSTANTLY Vcc | Vcc (0V) | 0V |
| WRITE | SELECTED BIT LINE: 0V ADJACENT BIT LINE: Vcc OTHERS: 0V | 5V (F) | 9V (0V or F) | Vcc (0V) | 0V |
| ERASE | FLOATING | FLOATING | −9V | FLOATING | +9V |

FIG. 42

| | BIT LINE | SOURCE LINE | FIRST WORD LINE | SECOND WORD LINE | FIRST CONTROL LINE | SECOND CONTROL LINE | THIRD CONTROL LINE | WELL |
|---|---|---|---|---|---|---|---|---|
| READ | Vcc (F) | SELECTED SOURCE LINE: 0V ADJACENT SOURCE LINE: Vcc OTHERS: 0V | CONSTANTLY Vcc | Vcc (0V) | 5V | 5V | 5V | 0V |
| WRITE | SELECTED BIT LINE: 0V ADJACENT BIT LINE: Vcc OTHERS: 0V | 5V (F) | 9V (0V or F) | Vcc (0V) | 5V | 0V | 5V | 0V |
| ERASE | F | F | −9V | F | 0V | 0V | 0V | +9V |

FIG. 43

| | BIT LINE | SOURCE LINE | FIRST WORD LINE | SECOND WORD LINE | WELL |
|---|---|---|---|---|---|
| READ | Vcc (F) | SELECTED SOURCE LINE : 0V ADJACENT SOURCE LINE : Vcc OTHERS : F | CONSTANTLY Vcc | Vcc (0V) | 0V |
| WRITE | SELECTED BIT LINE : 0V ADJACENT BIT LINE : Vcc OTHERS : 0V | 5V (F) | V step (0V or F) | Vcc (0V) | 0V |
| ERASE | FLOATING | FLOATING | 9V | FLOATING | 9V |

FIG. 48

| | BIT LINE | SOURCE LINE | FIRST WORD LINE | SECOND WORD LINE | FIRST CONTROL LINE | SECOND CONTROL LINE | THIRD CONTROL LINE | WELL |
|---|---|---|---|---|---|---|---|---|
| READ | Vcc (Vcc') | SELECTED SOURCE LINE: 0V ADJACENT SOURCE LINE: Vcc OTHERS: Vcc' | CONSTANTLY Vr | Vcc (0V) | 5V | 5V | 5V | 0V |
| WRITE | SELECTED BIT LINE: 0V ADJACENT BIT LINE: Vcc OTHERS: 0V | 5V (F) | V step (0V or F) | Vcc (0V) | 5V | 0V | 5V | 0V |
| ERASE | F | F | −9V | F | 0V | 0V | 0V | +9V |

US 8,089,808 B2

NONVOLATILE SEMICONDUCTOR MEMORY DEVICE, AND READING METHOD, WRITING METHOD AND ERASING METHOD OF NONVOLATILE SEMICONDUCTOR MEMORY DEVICE

CROSS-REFERENCE TO RELATED APPLICATION

This application is a Continuation of PCT application No. PCT/JP2006/319598, which was filed on Sep. 29, 2006, and which designated the United States of America, the entire contents of which are incorporated herein by reference.

FIELD

The embodiments discussed herein are related to a nonvolatile semiconductor memory device, and a reading method, a writing method and an erasing method of a nonvolatile semiconductor memory device.

BACKGROUND

Recently, nonvolatile semiconductor memory devices comprising memory cells each including a selecting transistor and a memory cell transistor are proposed (see Japanese Laid-open Patent Publication No. 2005-116970 and Japanese Laid-open Patent Publication No. 2005-122772).

In such nonvolatile semiconductor memories, bit lines, word lines and source lines, etc. are suitably selected by a column decoder and a row decoder to thereby select memory cells, and make read, write, erase, etc. of information for the selected memory cells.

SUMMARY

According to aspects of the embodiment, a nonvolatile semiconductor memory device including: a memory cell array of a plurality of memory cells arranged in a matrix, each memory cell including a selecting transistor and a memory cell transistor connected to the selecting transistor; a bit line commonly connecting drains of a plurality of selecting transistors present in two adjacent columns; a first word line commonly connecting control gates of a plurality of selecting transistors present in one and the same row; a second word line commonly connecting select gates of a plurality of selecting transistors present in one and the same row; a source line commonly connecting sources of a plurality of memory cell transistors present in two adjacent rows; a first column decoder connected to a plurality of bit lines and a plurality of source lines and controlling potentials of the plural bit lines and of the plural source lines; a first row decoder connected to a plurality of first word lines and controlling potentials of the plural first word lines; a second row decoder connected to a plurality of second word lines and controlling potentials of the plural second word lines; and a second column decoder connected to a plurality of source lines and controlling potentials of the plural source lines, the first column decoder being formed of a circuit whose withstand voltage is lower than the first row decoder and the second column decoder, and the second column decoder being formed of a circuit whose withstand voltage is lower than the first row decoder and the second column decoder.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 6 is a view illustrating a reading method, a writing method and an erasing method of the nonvolatile semiconductor memory device according to the first embodiment;

FIGS. 12A and 12B are sectional views of the nonvolatile semiconductor memory device according to the first embodiment in the steps of the method for manufacturing the nonvolatile semiconductor memory device, which illustrate the method (Part 2);

FIGS. 16A and 16B are sectional views of the nonvolatile semiconductor memory device according to the first embodiment in the steps of the method for manufacturing the nonvolatile semiconductor memory device, which illustrate the method (Part 6);

FIGS. 17A and 17B are sectional views of the nonvolatile semiconductor memory device according to the first embodiment in the steps of the method for manufacturing the nonvolatile semiconductor memory device, which illustrate the method (Part 7);

FIGS. 20A and 20B are sectional views of the nonvolatile semiconductor memory device according to the first embodiment in the steps of the method for manufacturing the nonvolatile semiconductor memory device, which illustrate the method (Part 10);

FIG. 27 is a view illustrating a reading method, a writing method and an erasing method of the nonvolatile semiconductor memory device according to a second embodiment;

FIG. 30 is a view illustrating a reading method, a writing method and an erasing method of the nonvolatile semiconductor memory device according to a third embodiment;

FIG. 36 is a view illustrating a reading method, a writing method and an erasing method of the nonvolatile semiconductor memory device according to the fourth embodiment;

FIG. 42 is a view illustrating a reading method, a writing method and an erasing method of the nonvolatile semiconductor memory device according to the fifth embodiment;

FIG. 43 is a view illustrating a reading method, a writing method and an erasing method of the nonvolatile semiconductor memory device according to a sixth embodiment;

FIG. 48 is a view illustrating a reading method, a writing method and an erasing method of the nonvolatile semiconductor memory device according to the seventh embodiment.

DESCRIPTION OF EMBODIMENTS

However, in the proposed nonvolatile semiconductor memories, both the column decoder and the row decoder use high withstand voltage circuits (high voltage circuits). The high withstand voltage circuits comprise high withstand voltage transistors having the gate insulation formed thick, which makes it difficult to read information written into the memory cells at high speed.

Preferred embodiments of the present invention will be explained with reference to accompanying drawings.

[a] First Embodiment

A nonvolatile semiconductor memory device according to a first embodiment, a reading method, a writing method and an erasing method of the nonvolatile semiconductor memory device, and a method for manufacturing the nonvolatile semiconductor memory device will be explained with reference to FIGS. 1 to 26.

(Nonvolatile Semiconductor Memory Device)

Figure 1:
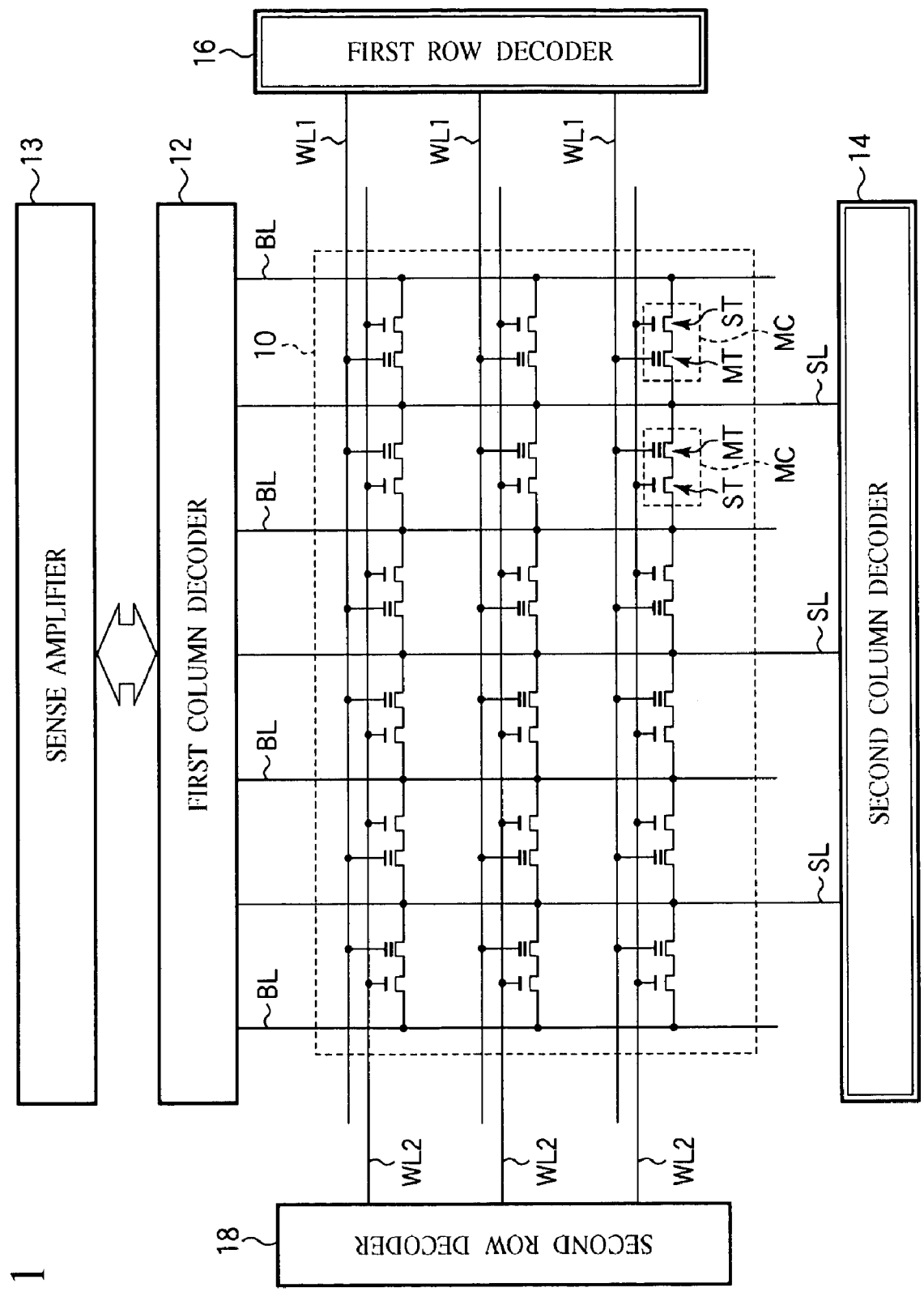
FIG. 1 is a circuit diagram of the nonvolatile semiconductor memory device according to a first embodiment.

First, the nonvolatile semiconductor memory device according to the present embodiment will be explained with reference to FIGS. 1 to 5. FIG. 1 is a circuit diagram of the nonvolatile semiconductor memory device according to the present embodiment.

As illustrated in FIG. 1, the nonvolatile semiconductor memory device according to the present embodiment comprises memory cells MC each including a selecting transistor ST and a memory cell transistor MT connected to the selecting transistor ST. The selecting transistor ST has the source connected to the drain of the memory cell transistor MT. More specifically, the source of the selecting transistor ST and the drain of the memory cell transistor MT are integrally formed of one impurity diffused layer.

A plurality of the memory cells MC are laid out in a matrix. The plural memory cells MC laid out in a matrix form a memory cell array 10.

The source of the memory cell transistor MT of the memory cell MC of one column, and the source of the memory cell transistor MT of the memory cell MC of another column adjacent to said one column are electrically connected to each other. That is, the sources of the plural memory cell transistors MT present in two columns adjacent to each other are electrically connected to each other.

The drain of the selecting transistor ST of the memory cell MC in one column is electrically connected to the drain of the selecting transistor ST of the memory cell MC of another column adjacent to said one column. That is, the drains of the plural selecting transistors ST present in two columns adjacent to each other are electrically connected to each other.

Source lines SL and bit lines BL are provided alternately. The source lines SL and the bit lines BL are provided in parallel with each other.

The drains of the plural selecting transistors ST present in two columns adjacent to each other are commonly connected by a bit line BL.

The sources of the plural memory transistors MT present in two columns adjacent to each other are commonly connected by a source line SL.

The first word lines WL1 and the second word lines WL2 are provided, intersecting the source lines SL and the bit lines BL. The first word lines WL1 and the second word lines WL2 are provided in parallel with each other.

The control gates of the plural memory cell transistors MT present in the same row are commonly connected by the first word line WL1.

The select gates of the plural selecting transistors ST present in the same row are commonly connected by the second word line WL2.

A plurality of the bit lines BL commonly connecting the drains of the selecting transistors ST are connected to the first column decoder 12. The column decoder 12 is for controlling the potential of the plural bit lines BL commonly connecting the drains of the selecting transistors ST. The column decoder 12 controls also the potential of the plural source lines SL commonly connecting the sources of the memory cell transistors MT when information written into the memory cell transistors MT is read. To the column decoder 12, a sense amplifier 13 for detecting the current flowing in the bit lines BL is connected. The column decoder 12 comprises a low voltage circuit (low withstand voltage circuit) which operates at a relatively low voltage. The low voltage circuit is a circuit whose withstand voltage is relatively low but which is operative at high speed. The gate insulation film (not illustrated) of the transistors (not illustrated) of the low voltage circuit is formed relatively thin. Accordingly, the transistors of the low voltage circuit used in the column decoder 12 are operative at relatively high speed. In the present embodiment, the column decoder 12 use a low voltage circuit, because it is not necessary to apply high voltage to the drains of the selecting transistors ST, but when information written into the memory cell transistors MT is read, it is necessary to operate the selecting transistors ST at high speed. In the present embodiment, because of the low voltage circuit is used in the column decoder 12, the selecting transistors ST can be operated at relatively high speed, and resultantly, the nonvolatile semiconductor memory device can have high read speed.

The plural source lines SL commonly connecting the sources of the memory cell transistors MT are connected to both of the first column decoder 12 and the second column decoder 14. The second column decoder 14 is for controlling the potential of the plural source lines SL commonly connecting the sources of the memory cell transistors MT when information is written into the memory cell transistors MT.

As described above, when information written into the memory cells MC is read, the source lines SL are controlled by the first column decoder 12.

The second column decoder 14 comprises a high voltage circuit (high withstand voltage circuit). In the present embodiment, the second column decoder 14 comprises a high voltage circuit, because when information is written into the memory cell transistors MT, a high voltage is applied to the source lines SL. As described above, when information written into the memory cell transistors MT is read, the source lines SL are controlled by the first column decoder 12, and the relatively low operation speed of the second column decoder 14 makes no special problem.

The plural first word lines WL1 commonly connecting the control gates of the memory cell transistors MT are connected to the first row decoder 16. The first row decoder 16 is for controlling the potential of the plural first word lines WL1 commonly connecting the control gates of the memory cell transistors MT. The first row decoder 16 comprises a high voltage circuit (high withstand voltage circuit). The high voltage circuit is a circuit whose operation speed is relatively slow but whose withstand voltage is relatively high. The gate insulation film (not illustrated) of the transistors of the high voltage circuit is formed relatively thick so as to ensure sufficient withstand voltage. Accordingly, the transistors of the high voltage circuit have lower operation speed than the transistors of the low voltage circuit. In the present embodiment, the first row decoder 16 comprises a high voltage circuit, because high voltages is applied to the first word lines WL1 when information is written into the memory cell transistors MT or when information written into the memory cell transistors MT is erased. As will be described later, when information written into the memory cell transistors MT is read, a source voltage (power supply voltage) $V_{CC}$ is constantly applied to the first word lines WL1. Thus, the relatively low operation speed of the high voltage circuit used in the first row decoder 16 makes not special problem.

The plural second word lines WL2 commonly connecting the select gates of the selecting transistors ST are connected to the second row decoder 18. The second row decoder 18 is for controlling the potential of the plural second word lines WL2 commonly connecting the select gates of the selecting transistors ST. The second row decoder 18 comprises a low voltage circuit (low withstand voltage circuit). In the present embodiment, the low voltage circuit is used in the second row decoder 18, because it is not necessary to apply high voltage to the select gates of the selecting transistors ST, but it is important to operate the selecting transistors ST at high speed. In the present embodiment, because of the second row decoder 18 comprising a low voltage circuit, the selecting transistors ST can be operated at relatively high speed, which resultantly makes it possible that the nonvolatile semiconductor memory device operates at high reading speed.

Figure 2:
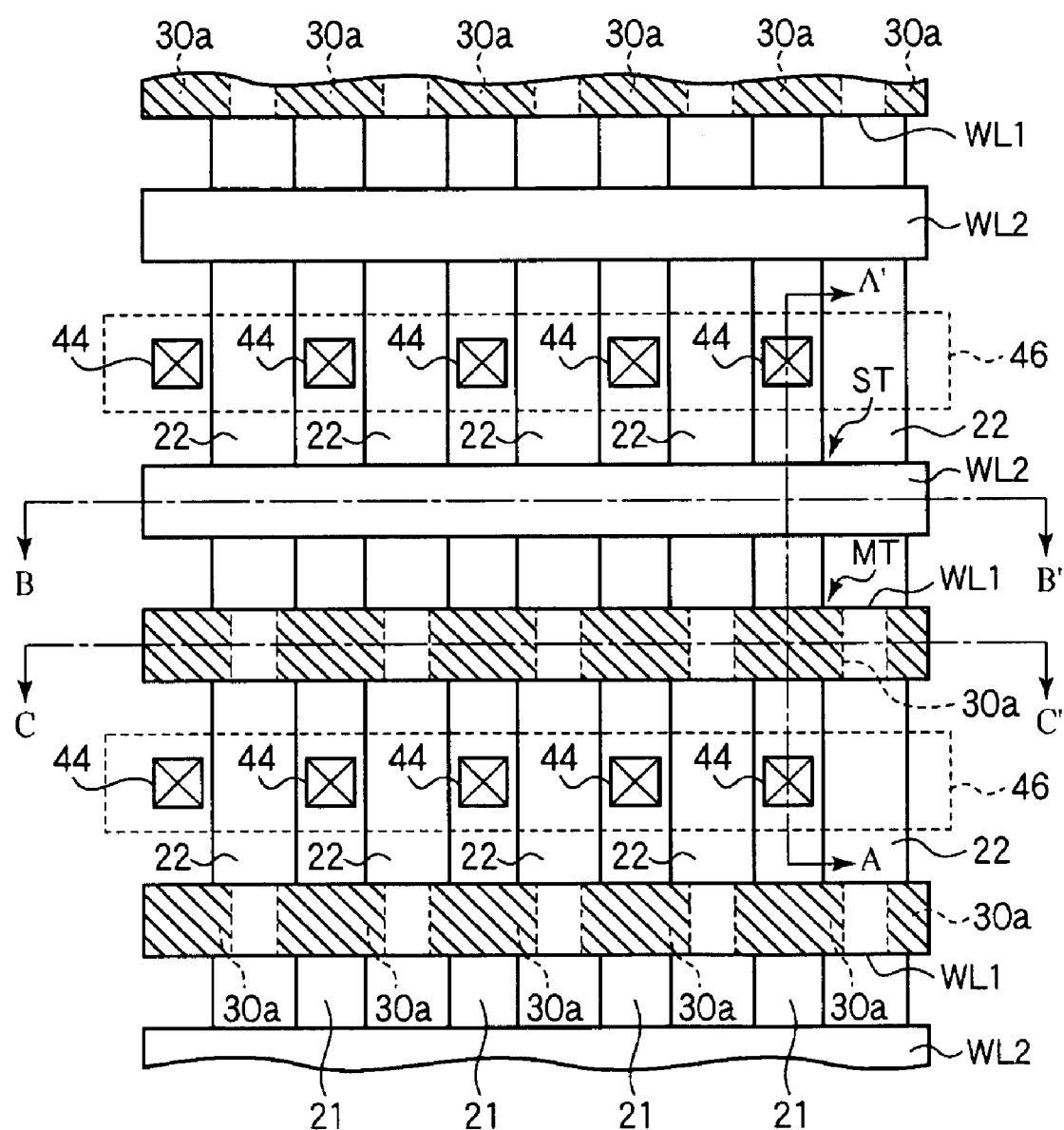
FIG. 2 is a plan view of the nonvolatile semiconductor memory device according to the first embodiment, which illustrates the memory cell array.
Figure 3:
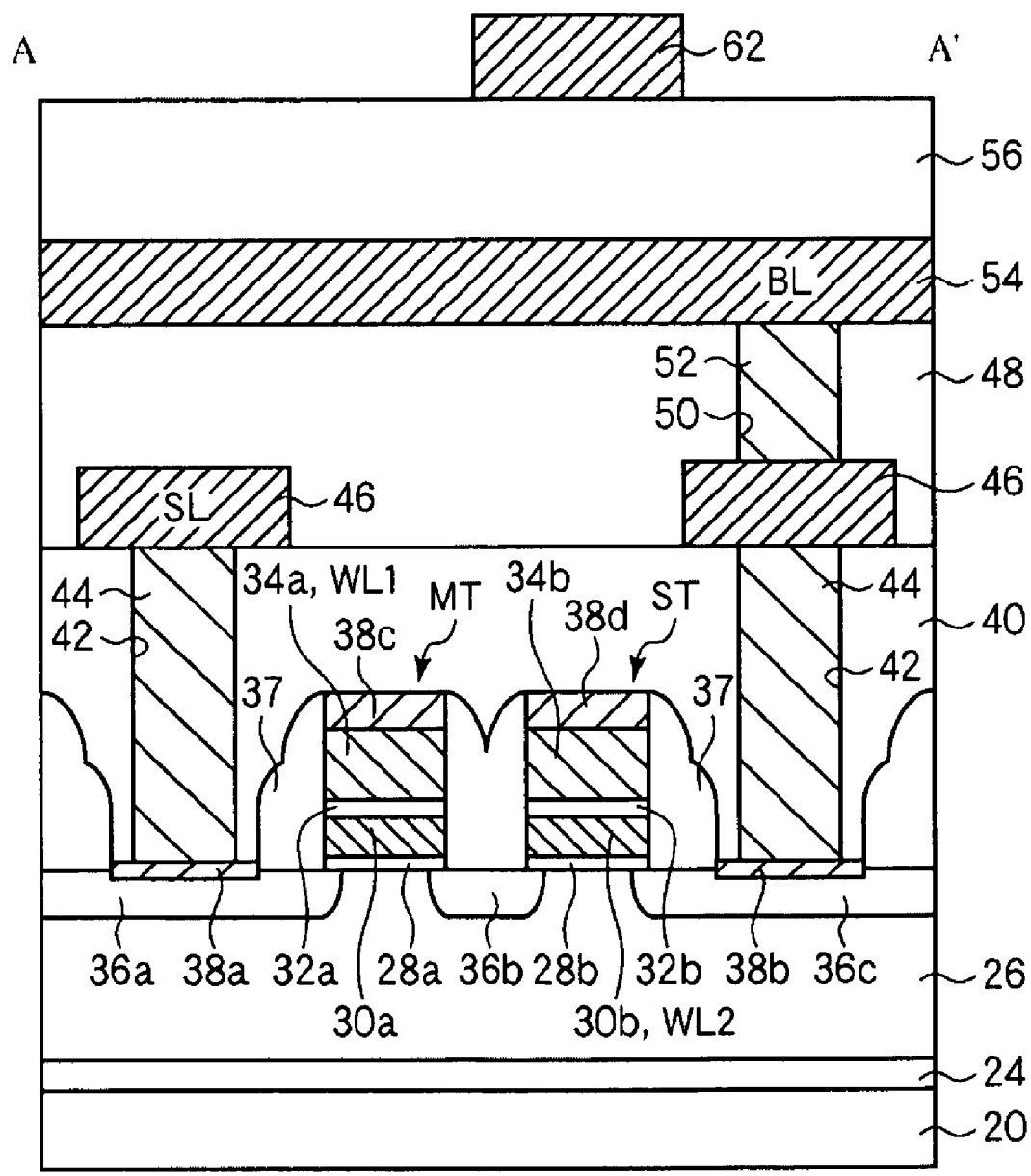
FIG. 3 is the sectional view along the A-A' line in FIG. 2.
Figure 4:
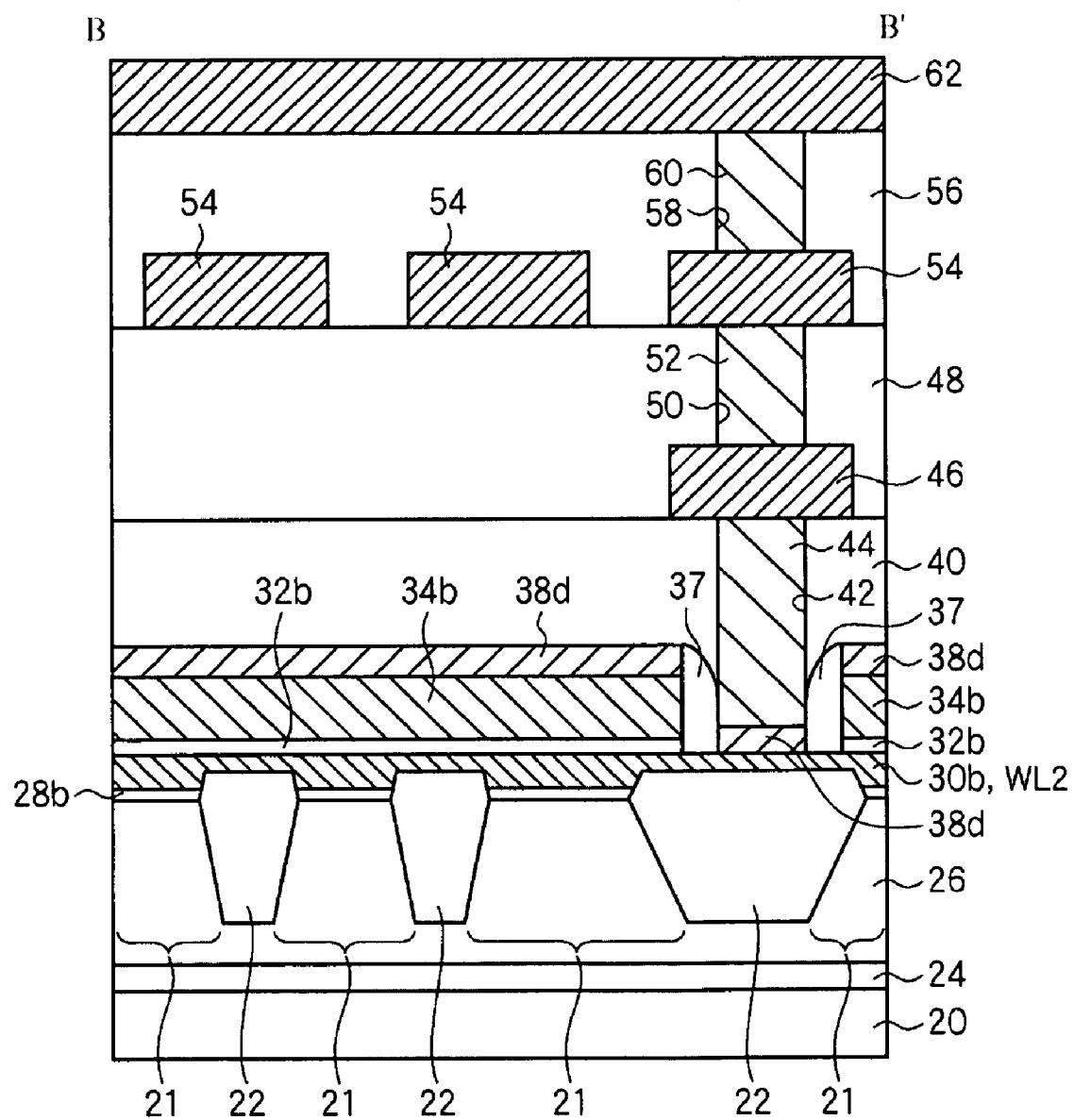
FIG. 4 is the sectional view along the B-B' line in FIG. 2.
Figure 5:
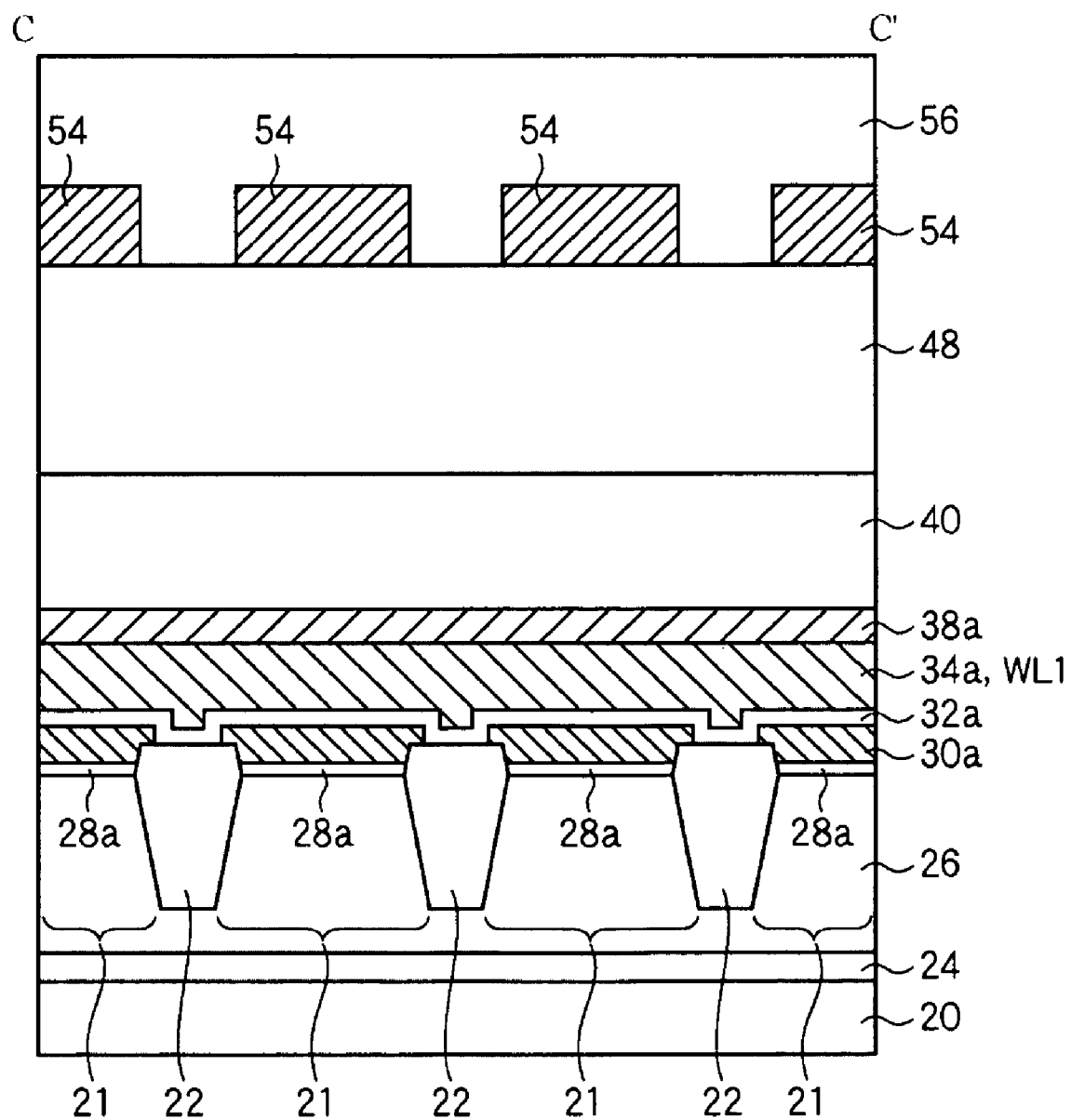
FIG. 5 is the sectional view along the C-C' line in FIG. 2.

Next, the structure of the memory cell array of the nonvolatile semiconductor memory device according to the present embodiment will be explained with reference to FIGS. 2 to 5. FIG. 2 is a plan view of the nonvolatile semiconductor memory device according to the present embodiment, which illustrates the memory cell array. FIG. 3 is the sectional view along the line A-A' in FIG. 2. FIG. 4 is the sectional view along the line B-B' in FIG. 2. FIG. 5 is the sectional view along the line C-C' in FIG. 2.

On a semiconductor substrate 20, device isolation regions 22 for defining device regions 21 are formed. The semiconductor substrate 20 is, e.g., a P-type silicon substrate. The device isolation regions 22 are formed by, e.g., STI (Shallow Trench Isolation).

In the semiconductor substrate 20 with the device isolation regions 22 formed on, an N-type buried diffused layer 24 is formed. The upper part of the N-type buried diffused layer 24 is a P-type well 26.

On the semiconductor substrate 20, a floating gate 30a is formed with a tunnel insulation film 28a formed therebetween. The floating gate 30a is formed in each device region 21, electrically isolated from each other.

On floating gate 30a, a control gate 34a is formed with an insulation film 32a formed therebetween. The control gates 34a of the memory cell transistors MT present in the same row are commonly connected. In other words, on the floating gates 30, the first word line WL1 commonly connecting the control gates 34a is formed with an insulation film 32a formed therebetween.

On the semiconductor substrate 20, the select gate 30b of a selecting transistor ST is formed in parallel with the floating gate 30a. The select gates 30b of the selecting transistors ST present in the same row are commonly connected. In other words, on the semiconductor substrate 20, the second word line WL2 commonly connecting the select gates 30b is formed with a gate insulation film 28b formed therebetween. The film thickness of the gate insulation film 28b of the selecting transistors ST is substantially equal to the film thickness of the tunnel insulation film 28a of the memory cell transistors MT.

On the select gate 30b, a polysilicon layer 34b is formed with an insulation film 32b formed therebetween.

In the semiconductor substrate 20 on both sides of the floating gate 30a and on both sides of the select gate 30b, N-type impurity diffused layers 36a, 36b, 36c are formed.

The impurity diffused layer 36b forming the drain of the memory cell transistor MT and the impurity diffused layer 36b forming the source of the selecting transistor ST are formed of the same impurity diffused layer 36b.

A sidewall insulation film 37 is formed on the side wall of the stacked layer of the floating gate 30a and the control gate 34a.

On the side wall of the stacked layer of the select gate 30b and the polysilicon layer 34b, a sidewall insulation film 37 is formed.

On the source region 36a of the memory cell transistor MT, on the drain region 36c of the selecting transistor ST, an upper part of the control gate 34a and an upper part of the polysilicon layer 34b, silicide layers 38a-38d of, e.g., cobalt silicide are respectively formed. The silicide layer 38a on the source region 36a functions as the source electrode. The silicide layer 38c on the drain region 36c functions as the drain electrode.

Thus, the memory cell transistors MT each including the floating gate 30a, the control gate 34a and the source/drain diffused layers 38a, 38b are formed.

The selecting transistors ST each including the select gate 30b and the source/drain diffused layers 36b, 36c are formed. The selecting transistors ST are NMOS transistors. In the present embodiment, the NMOS transistors, whose operation speed is higher than the PMOS transistors are used as the selecting transistors, whereby the operation speed can be improved.

On the semiconductor substrate 20 with the memory cell transistors MT and the selecting transistors ST formed on, an inter-layer insulation film 40 of a silicon nitride film (not illustrated) and a silicon oxide film (not illustrated) is formed.

In the inter-layer insulation film 40, contact holes 42 are formed respectively down to the source electrode 38a and the drain electrode 38b.

In the contact holes 42, conductor plugs 44 of, e.g., tungsten are buried.

On the inter-layer insulation film 40 with the conductor plugs 44 buried in, an interconnection 46 (the first metal interconnection layer) 46 is formed.

On the inter-layer insulation film 40 with the interconnections 46 formed on, an inter-layer insulation film 48 is formed.

In the inter-layer insulation film 48, a contact hole 50 is formed down to the interconnection 46.

In the contact hole 50, a conductor plug 52 of, e.g., tungsten is buried.

On the inter-layer insulation film 48 with the conductor plug 52 buried in, an interconnection (the second metal interconnection layer) 54 is formed.

On the inter-layer insulation film 48 with the interconnection 54 formed on, an inter-layer insulation film 56 is formed.

In the inter-layer insulation film 56, a contact hole 58 is formed down to the interconnection 54.

In the contact hole 58, a conductor plug 60 of, e.g., tungsten is buried.

On the inter-layer insulation film 56 with the conductor plug 60 buried in, an interconnection 62 (the third metal interconnection layer) 62 is formed.

Thus, the memory cell array 10 (see FIG. 1) of the nonvolatile semiconductor memory device according to the present embodiment is formed.

(Operation of the Nonvolatile Semiconductor Memory Device)

Next, the operation method of the nonvolatile semiconductor memory device according to the present embodiment will be explained with reference to FIGS. 6 to 10. FIG. 6 is a view illustrating the reading method, the writing method and the erasing method of the nonvolatile semiconductor memory device according to the present embodiment. In FIG. 6, the voltages in the parentheses are potentials of the non-selected lines. In FIG. 6, F indicates floating.

(Reading Method)

Figure 7:
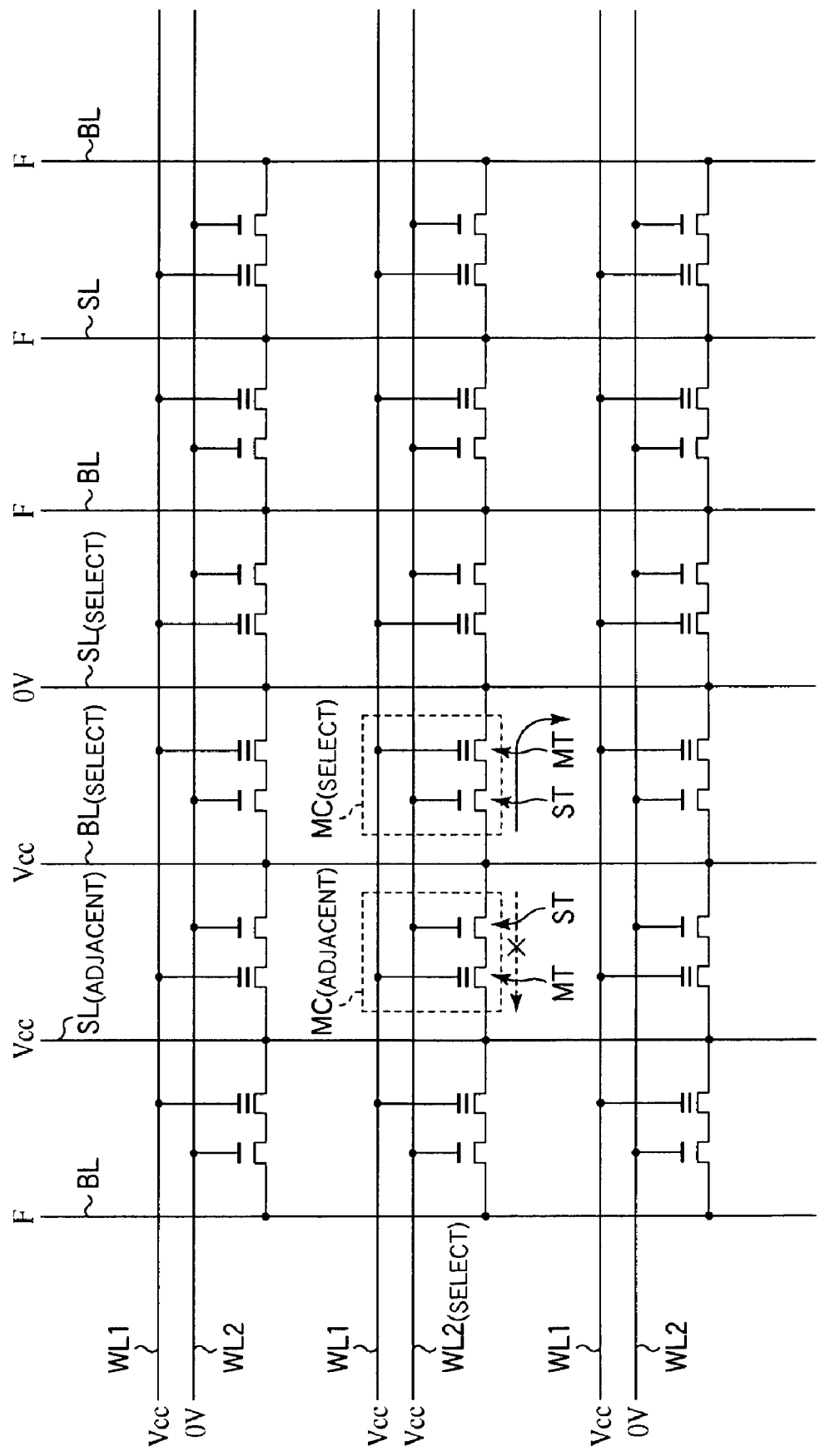
FIG. 7 is a circuit diagram of the nonvolatile semiconductor memory device according to the first embodiment, which illustrates the reading method thereof.
Figure 8:
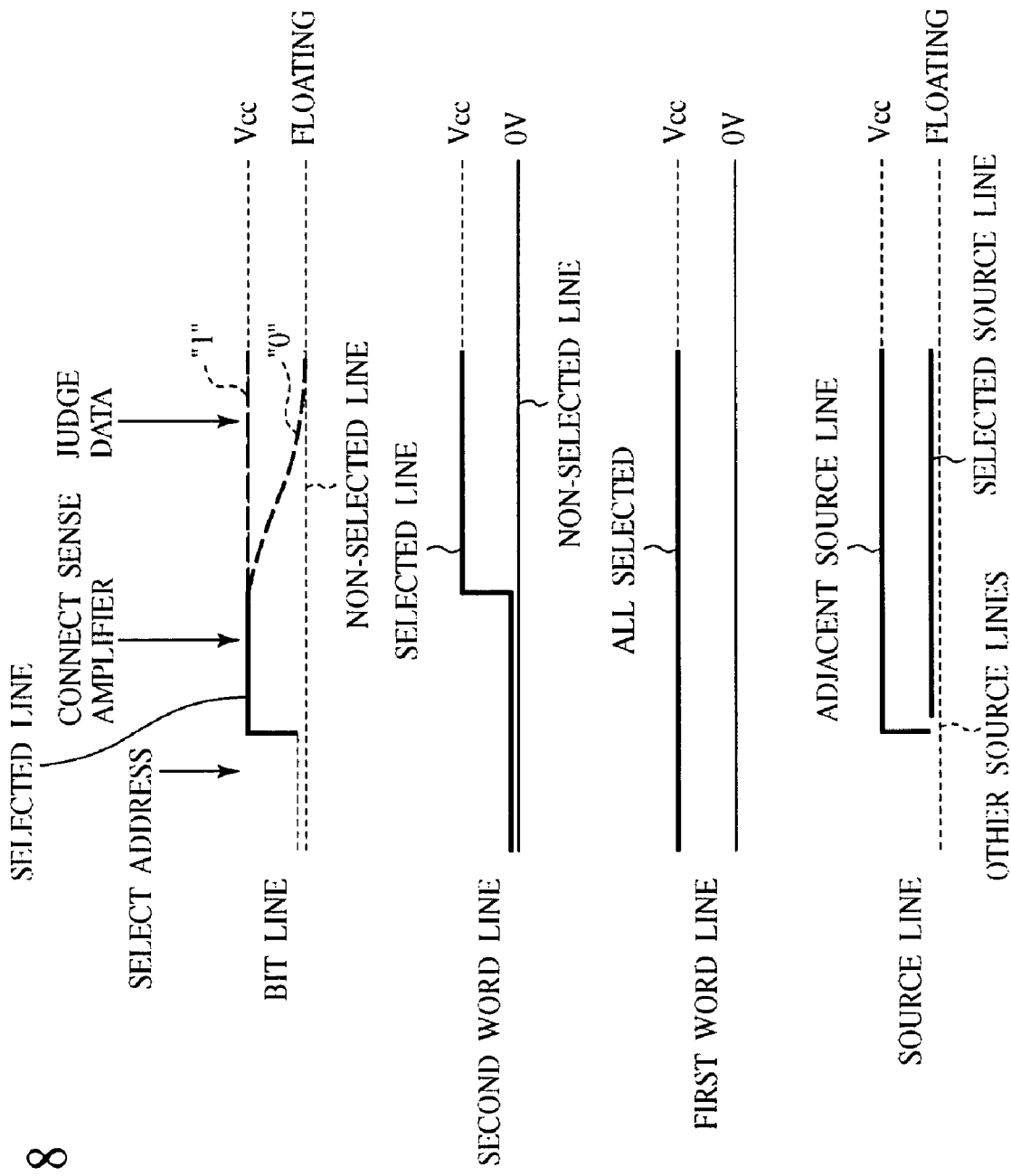
FIG. 8 is a time chart of the reading method of the nonvolatile semiconductor memory device according to the first embodiment.

First, the reading method of the nonvolatile semiconductor memory device according to the present embodiment will be explained with reference to FIGS. 6 to 8. FIG. 7 is the circuit diagram illustrating the reading method of the nonvolatile semiconductor memory device according to the present embodiment. FIG. 8 is the time chart illustrating the reading method of the nonvolatile semiconductor memory device according to the present embodiment.

When information written into the memory cell transistors MT is read, in accordance with the time chart of FIG. 8, the potentials of the respective parts are set as illustrated in FIGS. 6 and 7.

First, the address of a memory cell to be selected (selected cell) $MC_{(SELECT)}$ is determined (see FIG. 8).

Next, the potential of the bit line (selected bit line) $BL_{(SELECT)}$ connected to the selected cell $MC_{(SELECT)}$ is set at $V_{CC}$. The potential of the bit lines BL other than the selected bit line $BL_{(SELECT)}$ is floating. The voltage of the source line (selected source line) $SL_{(SELECT)}$ connected to the selected cell $MC_{(SELECT)}$ is set at 0 V (ground). The selected source line $SL_{(SELECT)}$ is positioned on the first side with respect to the selected bit line $BL_{(SELECT)}$. The potential of the source line (adjacent source line) $SL_{(ADJACENT)}$ connected to the memory cell (adjacent memory cell) $MC_{(ADJACENT)}$ adjacent to the selected cell $MC_{(SELECT)}$ is set at $V_{CC}$. The adjacent source line $SL_{(SELECT)}$ is positioned on the second side with respect to the selected bit line $BL_{(SELECT)}$, which is opposite to the first side. The drain of the selecting transistor ST of the selected cell $MC_{(SELECT)}$ and the drain of the selecting transistor ST of the adjacent cell $MC_{(ADJACENT)}$ are commonly connected by the selected bit line $BL_{(SELECT)}$. The potential of the other source lines SL, i.e., the potential of the source lines SL other than the selected source line $SL_{(SELECT)}$ and the adjacent source line $SL_{(ADJACENT)}$ are floating. The potential of all the first word lines WL1 is constantly $V_{CC}$ on the standby for read. The voltage of all the wells 26 is 0 V.

Next, the selected bit line $BL_{(SELECT)}$ is connected to the sense amplifier 13 (see FIG. 8).

Next, the potential of the second word line WL2 connected to the selected cell $MC_{(SELECT)}$ is set at $V_{CC}$ (see FIG. 8). The potential of the plural second word lines WL2 other than the selected second word line $WL2_{(SELECT)}$ is set at 0 V.

When information is written into the memory cell transistor MT of the selected cell $MC_{(SELECT)}$, i.e., the information of the memory cell transistor MT of the selected cell $MC_{(SELECT)}$ is "1", charges are stored in the floating gate 30a of the memory cell transistor MT. In this case, no current flows between the source diffused layer 36a of the memory cell transistor MT and the drain diffused layer 36c of the selecting transistor ST, and no current flows in the selected one bit line $BL_{(SELECT)}$, whereby the potential of the selected bit line $BL_{(SELECT)}$ remains $V_{CC}$. The potential of the selected bit line $BL_{(SELECT)}$ is detected by the sense amplifier 13. With the potential of the selected bit line $BL_{(SELECT)}$ remaining $V_{CC}$, the information of the memory cell transistor MT of the selected cell $MC_{(SELECT)}$ is judged to be "1" (see FIG. 8).

On the other hand, when the information written into the memory cell transistor MT of the selected $MC_{(SELECT)}$ is erased, i.e., the information of the memory cell of the selected cell $MC_{(SELECT)}$ is "0", no charges are stored in the floating gate 30a of the memory cell transistor MT. In this case, current flows between the source diffused layer 36a of the memory cell transistor MT and the drain diffused layer 36c of the selecting transistor ST, and current flows in the selected one bit line $BL_{(SELECT)}$, whereby the potential of the selected bit line $BL_{(SELECT)}$ gradually lowers finally to 0 V. When the potential of the selected bit line $BL_{(SELECT)}$ becomes lower than $V_{CC}$, the information of the memory cell transistor MT of the selected cell $MC_{(SELECT)}$ is judged to be "0" (see FIG. 8).

Thus, the information written into the memory cell transistor MT is read.

In the present embodiment, the potential of the first word lines WL1 is constantly set at $V_{CC}$ on the standby for read, whereby information written into the memory cell transistors MT can be read by controlling the potential of the source lines SL, the potential of the bit lines BL and the potential of the second word lines WL2. In the present embodiment, the first column decoder 12, which controls the potential of the bit lines BL, comprises a low voltage circuit as described above, which permits the bit lines BL to be controlled at high speed. When information written into the memory cell transistors MT is read, the potential of the source lines SL is controlled by the first column decoder 12, which permits the source lines SL to be controlled at high speed. The second row decoder 18, which controls the potential of the second word lines WL2, comprises a low voltage circuit as described above, which permits the second word lines WL2 to be controlled at high speed. Thus, according to the present embodiment, information written into the memory cell transistor MT of the selected cell $MC_{(SELECT)}$ can be read at high speed.

In the present embodiment, the potential of the adjacent source line $SL_{(SELECT)}$ is $V_{CC}$ for the following reason.

That is, with the potential of the adjacent source line $SL_{(ADJACENT)}$ being floating, there is a risk that in the adjacent cell $MC_{(ADJACENT)}$, which has not been selected, unintentional current might flow between the source diffused layer 36a of the memory cell transistor MT and the drain diffused layer 36c of the selecting transistor ST. In this case, current flows in the selected bit line $BL_{(SELECT)}$ whether or not current flows between the source diffused layer 36a of the memory cell transistor MT and the drain diffused layer 36c of the selecting transistor ST. If current flows in the adjacent cell $MC_{(ADJACENT)}$ between the source diffused layer 36a of the memory cell transistor MT and the drain diffused layer 36c of the selecting transistor ST although no current flows in the selected cell $MC_{(SELECT)}$ between the source diffused layer 36a of the memory cell transistor MT and the drain diffused layer 36c of the selecting transistor ST, information of the memory cell transistor MT of the selected cell $MC_{(SELECT)}$ is judged erroneously.

In the present embodiment, however, when information written into the memory cell transistor MT of the selected cell $MC_{(SELECT)}$ is read, the potential of the adjacent source line $SL_{(ADJACENT)}$ is $V_{CC}$. Thus, in the present embodiment, no unintentional current never flows in the adjacent cell $MC_{(ADJACENT)}$ between the source diffused layer 36a of the memory cell transistor MT and the drain diffused layer 36c of the selecting transistor ST. Thus, according to the present embodiment, the erroneous judgment of information written into the memory cell transistor MT of the selected cell $MC_{(SELECT)}$ can be prevented.

(Writing Method)

Figure 9:
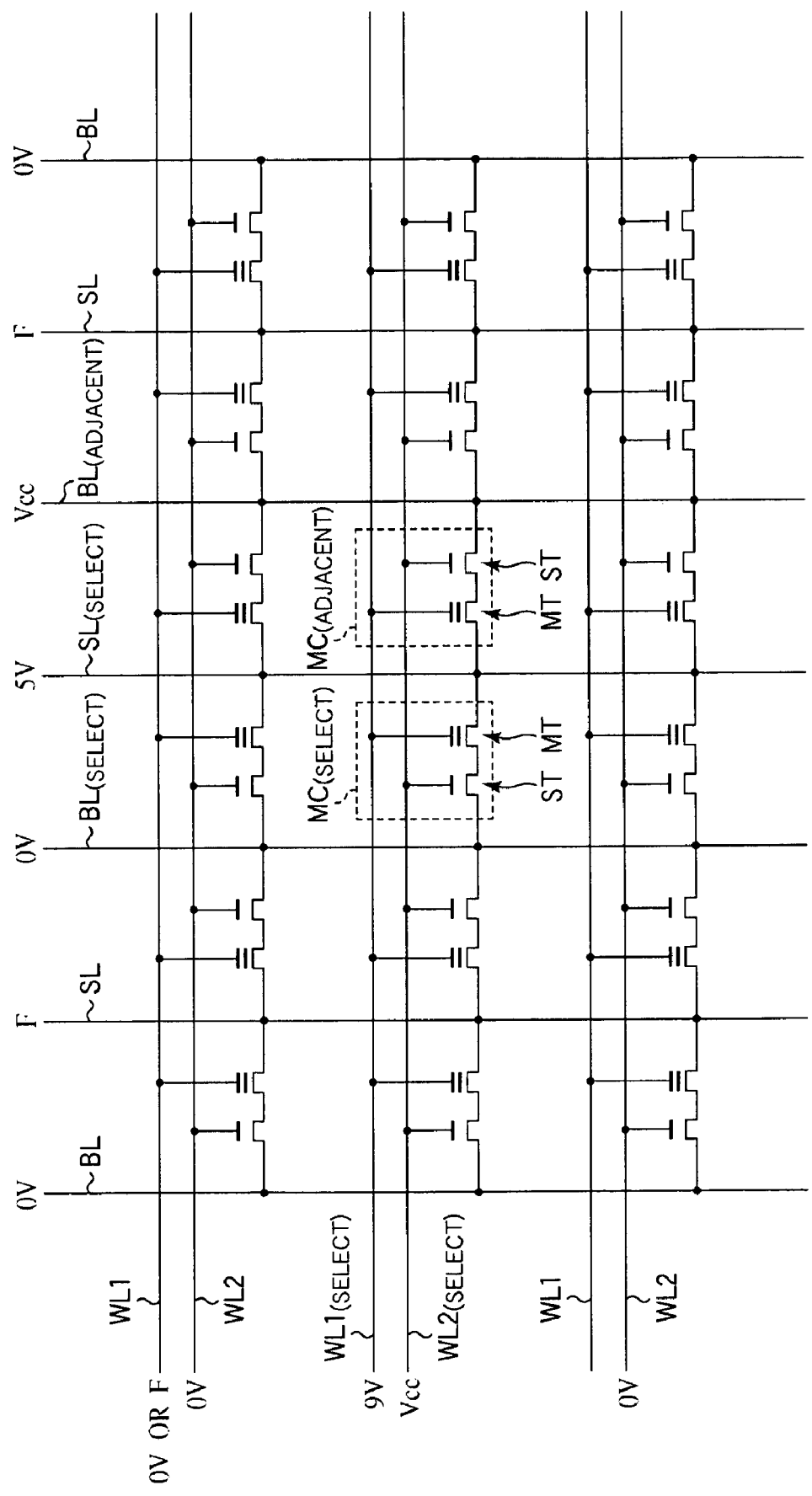
FIG. 9 is a circuit diagram of the nonvolatile semiconductor memory device according to the first embodiment, which illustrates the writing method thereof.
Figure 10:
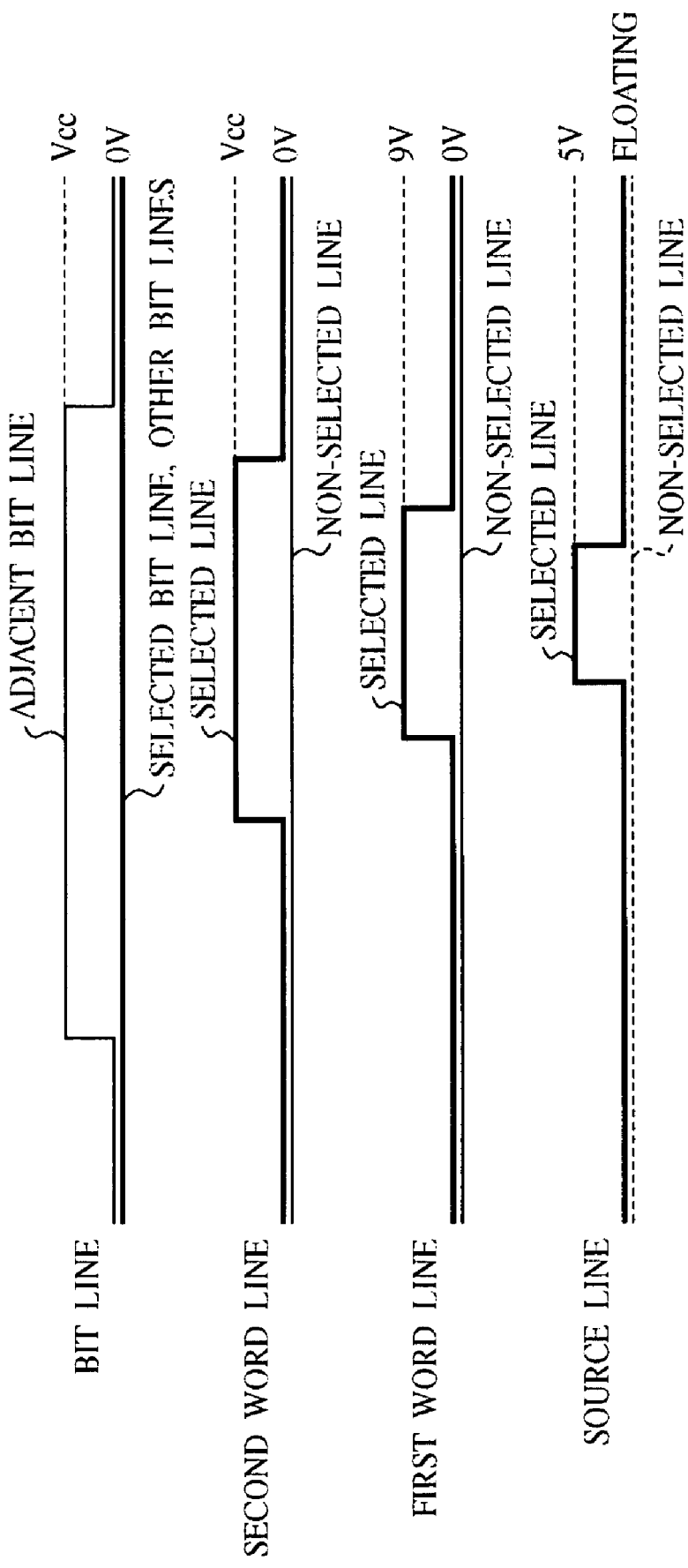
FIG. 10 is a time chart illustrating the writing method of the nonvolatile semiconductor memory device according to the first embodiment.
Figure 11A:
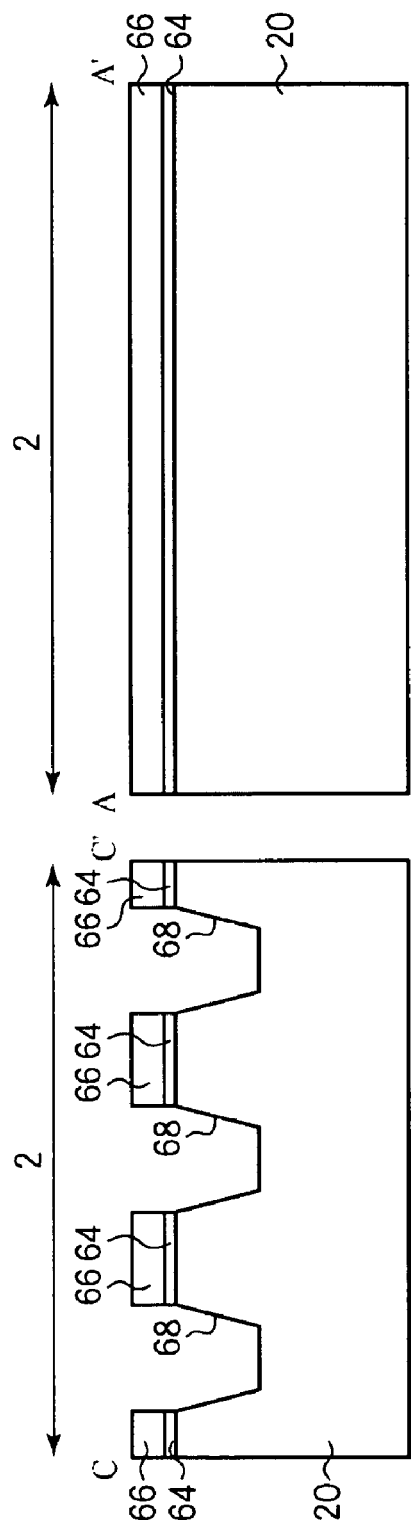
FIGS. 11A and 11B are sectional views of the nonvolatile semiconductor memory device according to the first embodiment in the steps of the method for manufacturing the nonvolatile semiconductor memory device, which illustrate the method (Part 1)
Figure 11B:
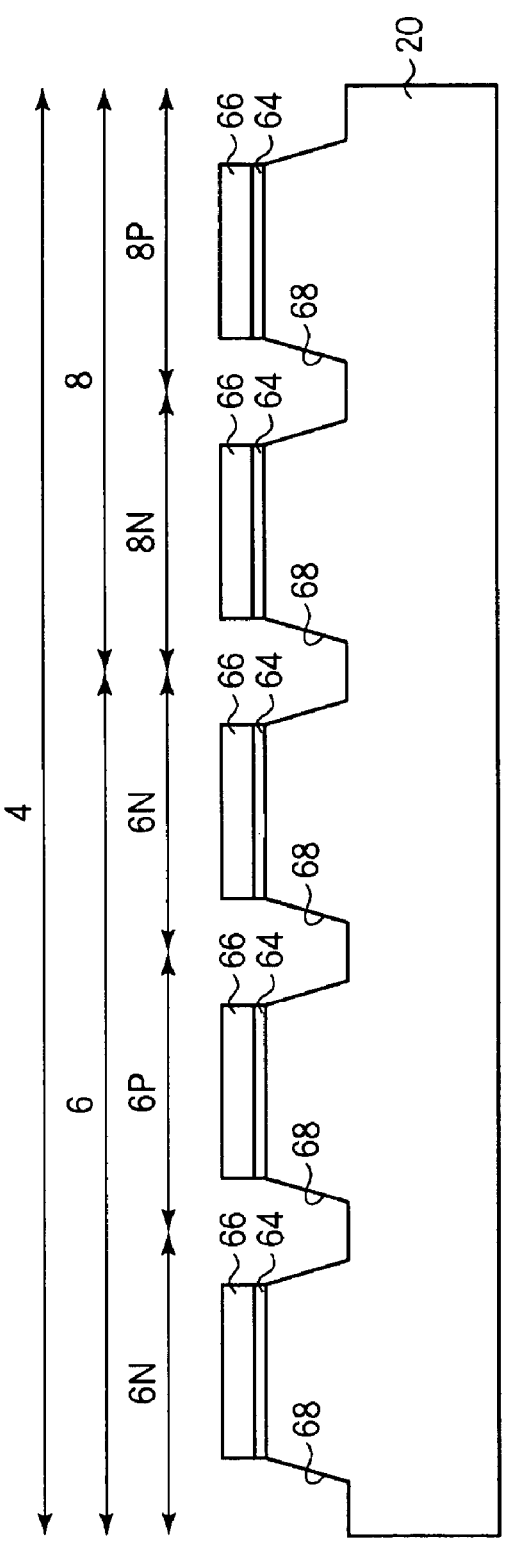

Next, the writing method of the nonvolatile semiconductor memory device according to the present embodiment will be explained with reference to FIGS. 6, 9 and 10. FIG. 9 is a circuit diagram of the nonvolatile semiconductor memory device according to the present embodiment, which illustrates the writing method thereof. FIG. 10 is the time chart illustrating the writing method of the nonvolatile semiconductor memory device according to the present embodiment.

When information is written into the memory cell transistors MT, in accordance with the time chart illustrated in FIG. 10, the potentials of the respective parts are set as illustrated in FIGS. 6 and 9.

First, the potential of the selected bit line $BL_{(SELECT)}$ connected to the drain of the selecting transistor ST of a selected cell $MC_{(SELECT)}$ is set at 0 V. The potential of the bit line $BL_{(ADJACENT)}$ connected to the drain of the selecting transistor ST of the adjacent cell $MC_{(ADJACENT)}$ which is adjacent to the selected $MC_{(SELECT)}$ is set at $V_{CC}$. The adjacent bit line $BL_{(ADJACENT)}$ is positioned on the first side with respect to the selected source line $SL_{(SELECT)}$, and is adjacent to the source line (selected source line) $SL_{(SELECT)}$ connected to the memory cell transistor MT of the selected cell $MC_{(SELECT)}$. The selected source line $SL_{(SELECT)}$ is positioned on the first side with respect to the selected bit line $BL_{(SELECT)}$ and is adjacent to the selected bit line $BL_{(SELECT)}$. The potential of the source lines SL other than the selected bit line $BL_{(SELECT)}$ and the adjacent bit line $BL_{(ADJACENT)}$ is 0 V (ground voltage).

Next, the potential of the second word line $WL2_{(SELECT)}$ connected to the selected cell $MC_{(SELECT)}$ is set at $V_{CC}$. On the other hand, the potential of the second word lines WL2 other than the selected second word line $WL2_{(SELECT)}$, i.e., the potential of the non-selected second word lines WL2 is 0 V (ground).

Then, the potential of the first word line $WL1_{(SELECT)}$ connected to the selected cell $MC_{(SELECT)}$ is, e.g., 9 V. The potential of the selected first word line $WL1_{(SELECT)}$ is higher than the potential of the selected source line $SL_{(SELECT)}$ which will be described later. On the other hand, the potential of the first word lines WL1 other than the selected first word line $WL1_{(SELECT)}$, i.e., the potential of the non-selected first word lines WL1 is 0 V or floating.

Then, the potential of the source line $SL_{(SELECT)}$ connected to a memory cell MC to be selected is, e.g., 5 V. The potential of the source lines SL other than the selected source line $SL_{(SELECT)}$, i.e., the potential of the non-selected source lines SL is floating.

The potential of the wells 26 is constantly 0 V (ground).

With the potentials of the respective parts set as above, electrons flow between the source diffused layer 36a of the memory cell transistor MT and the drain diffused layer 36c of the selected transistor ST, and electrons are introduced into the floating gate 30a of the memory cell transistor MT. Thus, charges are stored in the floating gate 30a of the memory cell transistor MT, and information is written into the memory cell transistor MT.

In the present embodiment, the potential of the adjacent bit line $BL_{(ADJACENT)}$ is $V_{CC}$ for the following reason.

That is, with the potential of the adjacent bit line $BL_{(ADJACENT)}$ being 0 V (ground), when information is written into the memory cell transistor MT of the selected cell $MC_{(SELECT)}$, not only the selecting transistor ST of the selected cell $MC_{(SELECT)}$ is turned on-state but also the selecting transistor ST of the adjacent cell $MC_{(ADJACENT)}$ is turned on. Then, the information is not only written into the memory cell transistor MT of the selected cell $MC_{(SELECT)}$, but also the information is written erroneously into the memory cell transistor MT of the adjacent cell $MC_{(ADJACENT)}$.

However, in the present embodiment, in which the potential of the adjacent bit line $BL_{(ADJACENT)}$ is $V_{CC}$, when information is written into the memory cell transistor MT of the selected cell $MC_{(SELECT)}$, the selecting transistor ST of the adjacent cell $MC_{(ADJACENT)}$ is in off-state. Thus, according to the present embodiment, erroneous writing of information into the memory cell transistor MT of the adjacent cell $MC_{(ADJACENT)}$ can be prevented.

(Erasing Method)

Next, the erasing method of the nonvolatile semiconductor memory device according to the present embodiment will be explained with reference to FIG. 6.

When information written into the memory cell array 10 is erased, the potentials of the respective parts are set as follows. That is, the potential of all the bit lines BL is floating. The potential of all the source lines SL is floating. The potential of all the first word lines WL1 is, e.g., −9 V. The potential of all the second word lines WL2 is floating. The potential of all the wells 26 is, e.g., +9 V.

When the potentials of the respective parts are set as above, charges are drawn out of the floating gates 30a of the memory cell transistors MT. Thus, no charges are stored in the floating gates 30a of the memory cell transistors MT, and information of the memory cell transistors MT is erased.

As described above, according to the present embodiment, the first column decoder 12, which controls the potential of the bit lines BL commonly connecting the drains 36c of the selecting transistors ST, comprises the low voltage circuit, which is operative at high speed, the second row decoder 18, which controls the potential of the second word lines WL2 commonly connecting the select gates 30b of the selecting transistors ST, comprises the low voltage circuit, which is operative at high speed, and when information written into the memory cell transistors MT is read, the source lines SL commonly connecting the sources 36a of the memory cell transistors MT are controlled by the first column decoder 12. According to the present embodiment, when information written into the memory cell transistors MT is read, the bit lines BL, the second word lines WL2 and the source lines SL are controlled at high speed, whereby the nonvolatile semiconductor memory device can read information written into the memory cell transistors at high speed.

The present embodiment, in which the selecting transistors ST comprise NMOS transistors can contribute to increase of the operation speed in comparison with the case that the selecting transistors comprise PMOS transistors.

(Method for Manufacturing the Nonvolatile Semiconductor Memory Device)

Next, the method for manufacturing the nonvolatile semiconductor memory device according to the present embodiment will be explained with reference to FIGS. 11A to 26. FIGS. 11A to 26 are sectional views of the nonvolatile semiconductor memory device in the steps of the method for manufacturing the nonvolatile semiconductor memory device according to the present embodiment, which illustrate the method. FIG. 11A, FIG. 12A, FIG. 13A, FIG. 14A, FIG. 15A, FIG. 16A, FIG. 17A, FIG. 18A, FIG. 19A, FIG. 20A, FIG. 21, FIG. 23 and FIG. 25 illustrate the memory cell array region (core region) 2. The views on the left sides of the drawings of FIG. 11A, FIG. 12A, FIG. 13A, FIG. 14A, FIG. 15A, FIG. 16A, FIG. 17A, FIG. 18A, FIG. 19A, FIG. 20A, FIG. 21, FIG. 23 and FIG. 25 correspond to the C-C' section in FIG. 2. The views on the right sides of the drawings of FIG. 11A, FIG. 12A, FIG. 13A, FIG. 14A, FIG. 15A, FIG. 16A, FIG. 17A, FIG. 18A, FIG. 19A, FIG. 20A, FIG. 21, FIG. 23 and FIG. 25 correspond to the A-A' section in FIG. 2. FIG. 11B, FIG. 12B, FIG. 13B, FIG. 14B, FIG. 15B, FIG. 16B, FIG. 17B, FIG. 18B, FIG. 19B, FIG. 20B, FIG. 22, FIG. 24 and FIG. 26 illustrate the peripheral circuit region 4. The views on the left sides of the drawings of FIG. 11B, FIG. 12B, FIG. 13B, FIG. 14B, FIG. 15B, FIG. 16B, FIG. 17B, FIG. 18B, FIG. 19B, FIG. 20B, FIG. 22, FIG. 24 and FIG. 26 illustrate the region 6 for the high withstand voltage transistors to be formed in. The left sides of the drawings of the region 6 for the high withstand voltage transistors to be formed in illustrate the region 6N for the high withstand voltage N-channel transistors to be formed in, and the right sides of the drawings of the region 6 for the high withstand voltage transistors to be formed in illustrate the region 6P for the high withstand voltage P-channel transistors to be formed in. The right sides of the drawings of FIG. 11B, FIG. 12B, FIG. 13B, FIG. 14B, FIG. 15B, FIG. 16B, FIG. 17B, FIG. 18B, FIG. 19B, FIG. 20B, FIG. 22, FIG. 24 and FIG. 26 illustrates the region 8 for the low voltage transistors to be formed in. The left sides of the region 8 for the low voltage transistors to be formed in illustrate the region 8N for the low voltage N-channel transistors to be formed in, and the right sides of the drawings of the region 8 for the low voltage transistors to be formed in illustrate the region 8P for the low voltage P-channel transistors to be formed in.

First, the semiconductor substrate 20 is prepared. The semiconductor substrate 20 is, e.g., a P-type silicon substrate.

Next, on the entire surface, a 15 nm-thickness thermal oxide film 64 is formed by, e.g., thermal oxidation.

Next, on the entire surface, a 150 nm-thickness silicon nitride film 66 is formed by, e.g., CVD.

Next, on the entire surface, a photoresist film (not illustrated) is formed by, e.g., spin coating.

Next, by photolithography, openings (not illustrated) are formed in the photoresist film. These openings are for patterning the silicon nitride film 66.

Next, with the photoresist film as the mask, the silicon nitride film 66 is patterned. Thus, a hard mask 66 of the silicon nitride film is formed.

Next, by dry etching, with the hard mask 66 as the mask, the semiconductor substrate 20 is etched. Thus, trenches 68 are formed in the semiconductor substrate 20 (see FIGS. 11A and 11B). The depth of the trenches 68 formed in the semiconductor substrate 20 is, e.g., 400 nm from the surface of the semiconductor substrate 20.

Then, by thermal oxidation, the exposed part of the semiconductor substrate 20 is oxidized. Thus, silicon oxide film (not illustrated) is formed on the exposed part of the semiconductor substrate 20.

Next, as illustrated in FIGS. 12A and 12B, a 700 nm-thickness silicon oxide film 22 is formed on the entire surface by high density plasma-enhanced CVD.

Figure 13A:
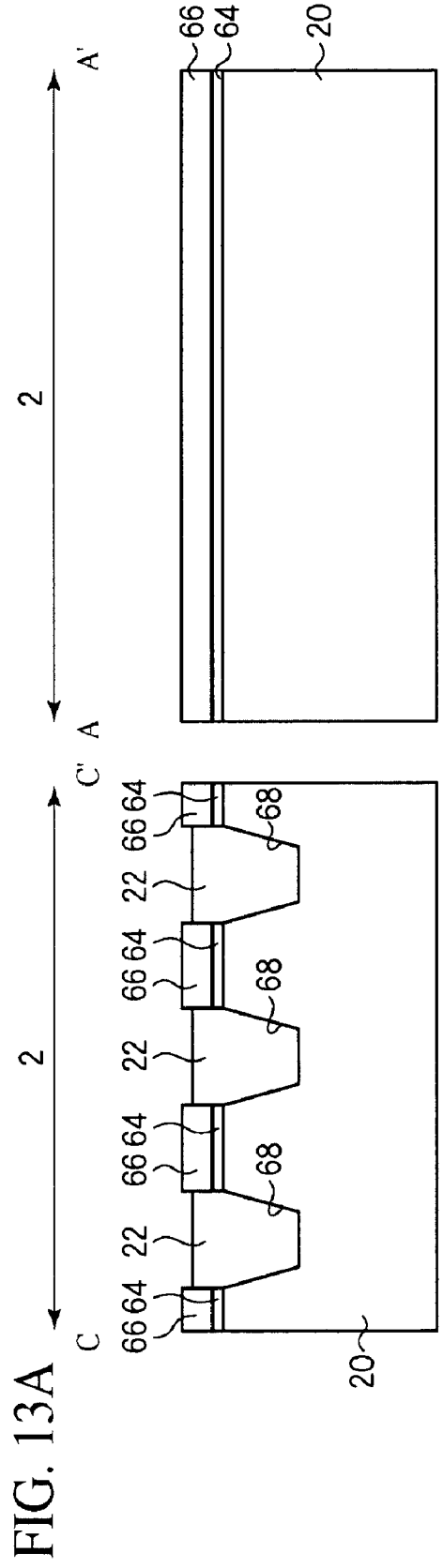
FIGS. 13A and 13B are sectional views of the nonvolatile semiconductor memory device according to the first embodiment in the steps of the method for manufacturing the nonvolatile semiconductor memory device, which illustrate the method (Part 3)
Figure 13B:
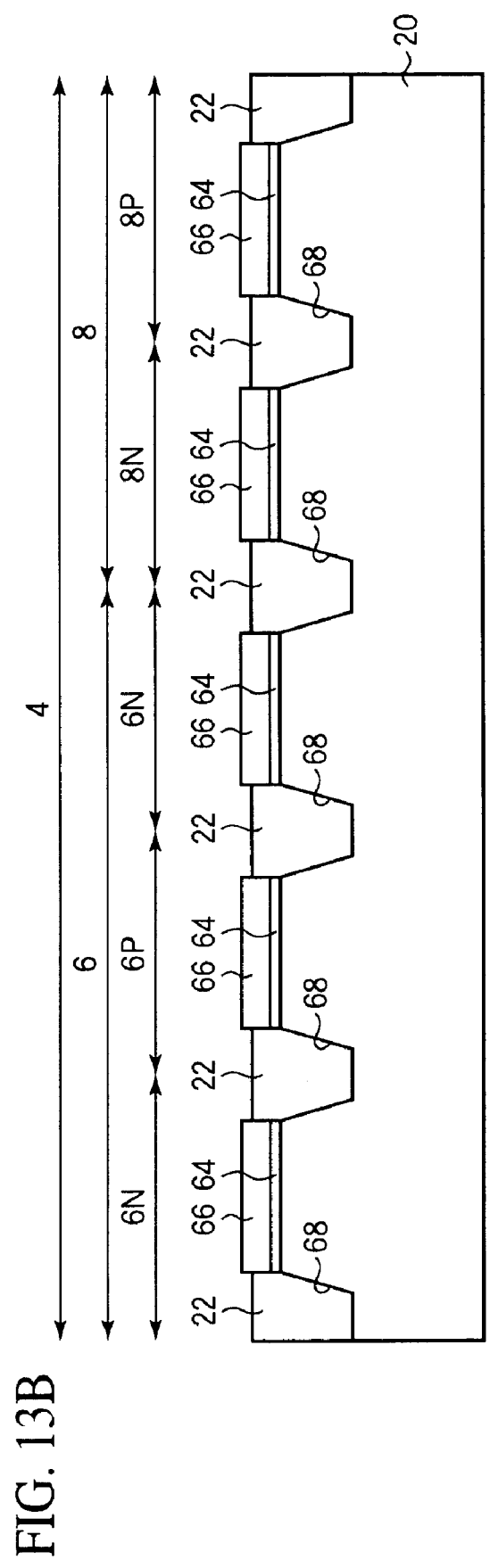

Next, as illustrated in FIGS. 13A and 13B, the silicon oxide film 22 is polished by CMP (Chemical Mechanical Polishing) until the surface of the silicon nitride film 66 is exposed. Thus, the device isolation regions 22 of silicon oxide film are formed.

Next, thermal processing is made to cure the device isolation regions 22. The conditions for the thermal processing are, e.g., 900° C. in a nitrogen atmosphere and 30 minutes.

Next, the silicon nitride film 66 is removed by wet etching.

Figure 14A:
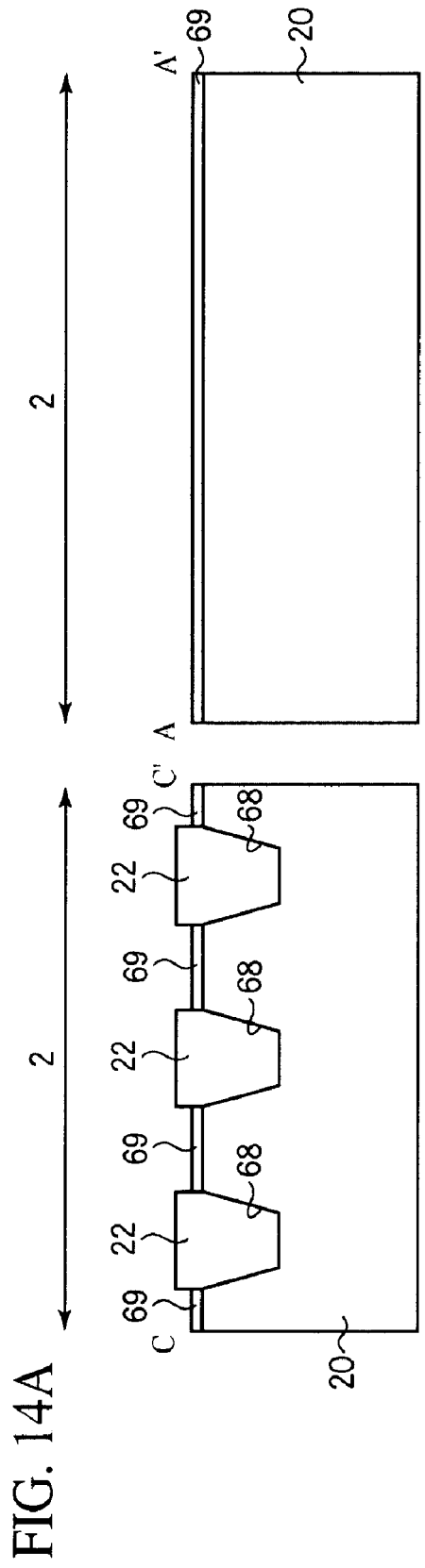
FIGS. 14A and 14B are sectional views of the nonvolatile semiconductor memory device according to the first embodiment in the steps of the method for manufacturing the nonvolatile semiconductor memory device, which illustrate the method (Part 4)
Figure 14B:
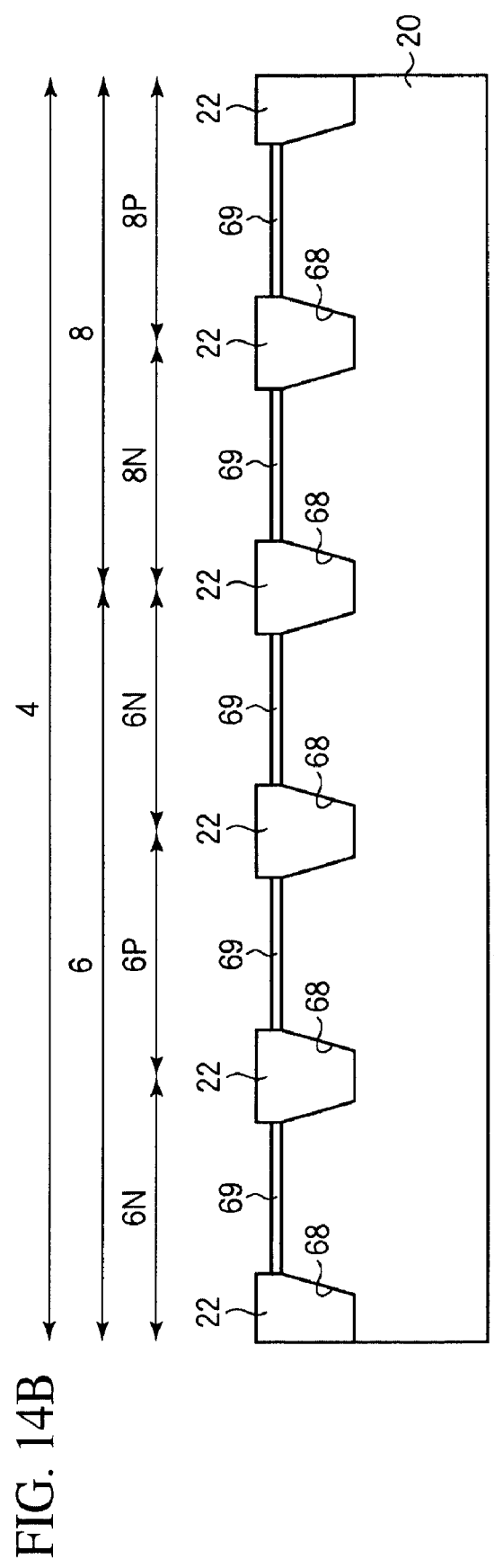

Next, as illustrated in FIGS. 14A and 14B, a sacrifice oxide film 68 is grown on the surface of the semiconductor substrate 20 by thermal oxidation.

Figure 15A:
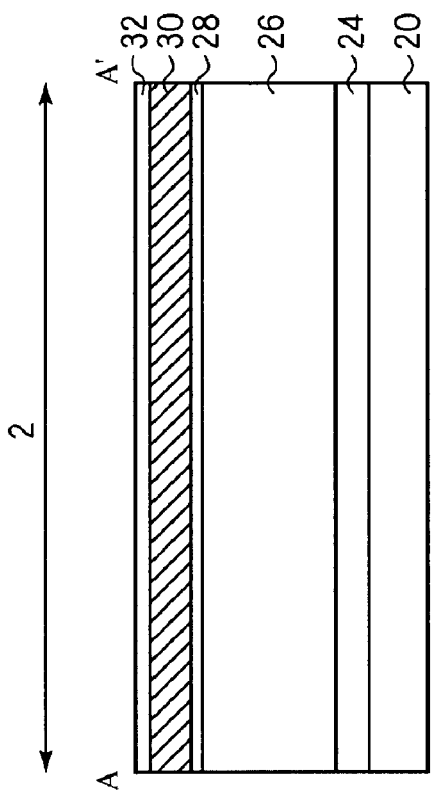
FIGS. 15A and 15B are sectional views of the nonvolatile semiconductor memory device according to the first embodiment in the steps of the method for manufacturing the nonvolatile semiconductor memory device, which illustrate the method (Part 5)
Figure 15B:
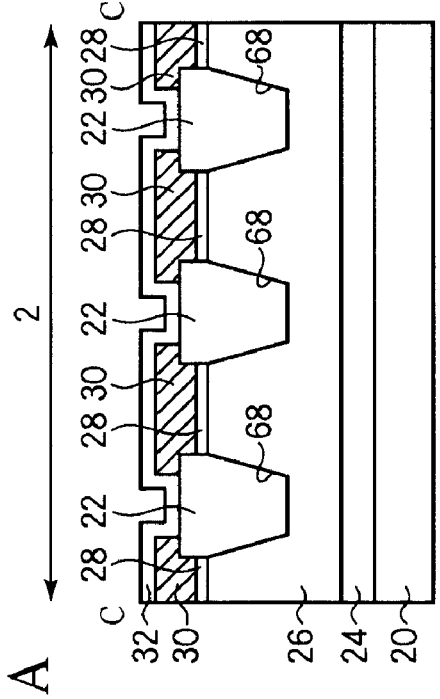

Next, as illustrated in FIGS. 15A and 15B, an N-type dopant impurity is implanted deep in the memory cell array region 2 to thereby form an N-type buried diffused layer 24. The upper part of the buried diffused layer 24 is to be a P-type well 26. At this time, also in the region 6N for the high withstand voltage N-channel transistors to be formed in, the N-type dopant impurity is implanted deep to thereby form an N-type buried diffused layer 24.

Next, in the region 6N for the high withstand voltage N-channel transistors to be formed in, an N-type buried diffused layer 70 is formed in a frame-shape. The frame-shaped buried diffused layer 70 is formed from the surface of the semiconductor substrate 20 to the peripheral edge of the buried diffused layer 24. A region surrounded by the buried diffused layer 24 and the buried diffused layer 70 forms a P-type well 72P.

Next, in the region 6P for the high withstand voltage P-channel transistors to be formed in, an N-type dopant impurity is implanted to thereby form an N-type well 72N.

Next, in the region 6N for the high withstand voltage N-channel transistors to be formed in and in the region 6P for the high withstand voltage P-channel transistors to be formed in, channel doping is made (not illustrate).

Next, the sacrifice oxide film 68 present on the surface of the semiconductor substrate 20 is etched off.

Next, on the entire surface, a 10 nm-thickness tunnel insulation film 28 is formed by thermal oxidation.

Next, on the entire surface, a 90 nm-thickness polysilicon film 30 is formed by, e.g., CVD. As such polysilicon film 30, impurity doped polysilicon film is formed.

Then, the polysilicon film 30 present in the peripheral circuit region 4 is etched off.

Next, on the entire surface, an insulation film (ONO film) 32 of a silicon oxide film, a silicon nitride film and a silicon oxide film sequentially laid on each other is formed. Such insulation film 32 is for insulating the floating gate 30a and the control gate 34a from each other.

Next, as illustrated in FIGS. 16A and 16B, a P-type dopant impurity is implanted in the region 8N for low voltage N-channel transistors to be formed in to thereby form a P-type well 74P.

Next, in the region 8P for the low voltage P-channel transistors to be formed in, an N-type dopant impurity is implanted to thereby form an N-type well 74N.

Next, in the region 8N for the low voltage N-channel transistors to be formed in and in the region 8P for the low voltage P-channel transistors to be formed in, channel doping is made (not illustrated).

Next, the insulation film (ONO film) 32 present in the peripheral circuit region 4 is etched off.

Next, on the entire surface, a gate insulation film 76 of, e.g., a 15 nm-thickness is formed by thermal oxidation.

Next, by wet etching, the gate insulation film 76 present in the region 8 for the low voltage transistors to be formed in is etched off.

Next, on the entire surface, a gate insulation film 78 of, e.g., a 3 nm-thickness is by thermal oxidation. Thus, in the region 8 for the low voltage transistors to be formed in, the gate insulation film of, e.g., a 3 nm-thickness is formed. On the other hand, in the region 6 for the high withstand voltage transistors to be formed in, the gate insulation film 76 has, e.g., an about 16 nm-thickness.

Next, on the entire surface, a polysilicon film 34 of, e.g., a 180 nm-thickness is formed by, e.g., CVD.

Next, on the entire surface, an anti-reflection film 80 is formed.

Next, as illustrated in FIGS. 17A and 17B, by photolithography, the anti-reflection film 80, the polysilicon film 34, the insulation film 32 and the polysilicon film 30 are dry etched. Thus, the stacked layer of the floating gate 30a of polysilicon and the control gate 34a of polysilicon is formed in the memory cell array region 2. The stacked layer of the select gate 30b of polysilicon and the polysilicon film 34b is formed in the memory cell array region 2.

Then in region where the interconnection (the first metal interconnection) 46 and the select gate 30b are connected, the polysilicon film 34b is etched off (not illustrated).

Figure 18A:
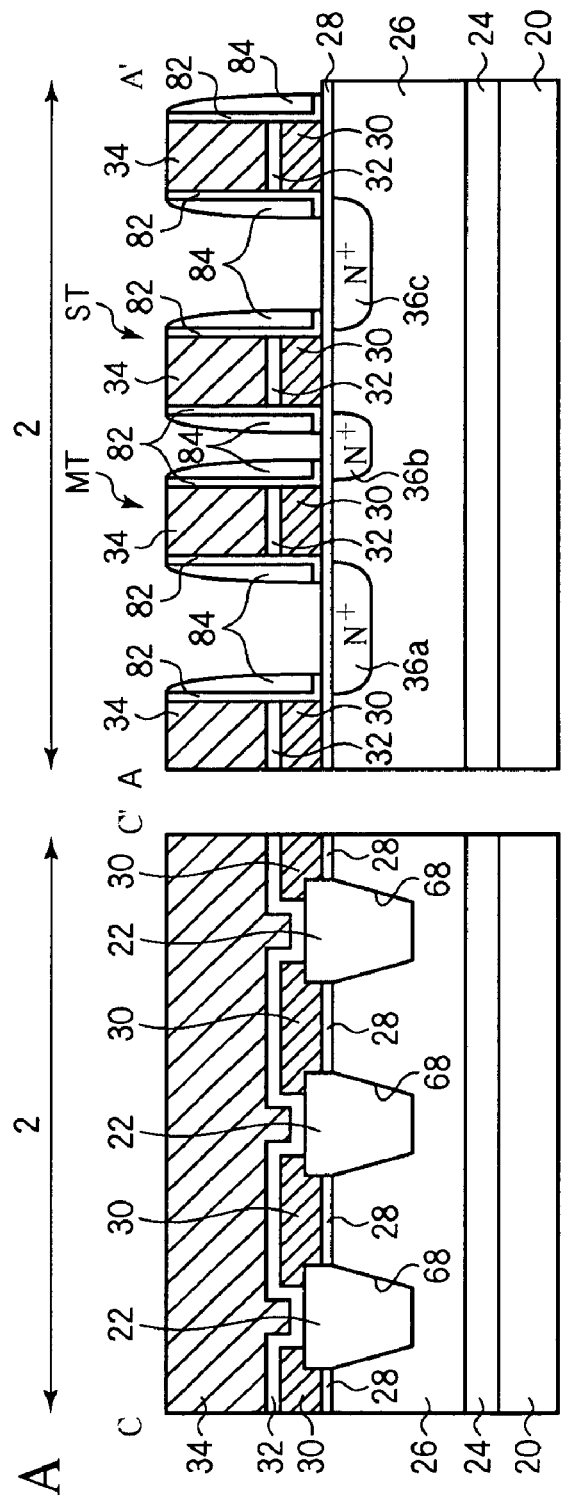
FIGS. 18A and 18B are sectional views of the nonvolatile semiconductor memory device according to the first embodiment in the steps of the method for manufacturing the nonvolatile semiconductor memory device, which illustrate the method (Part 8)
Figure 18B:
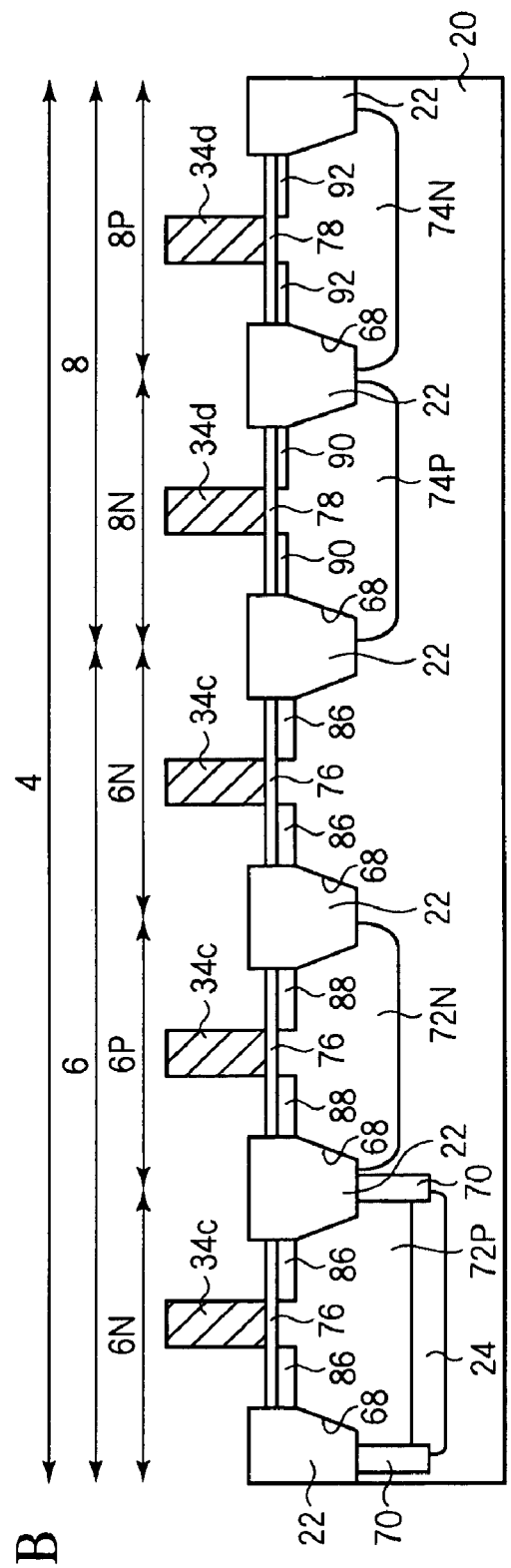
Figure 19A:
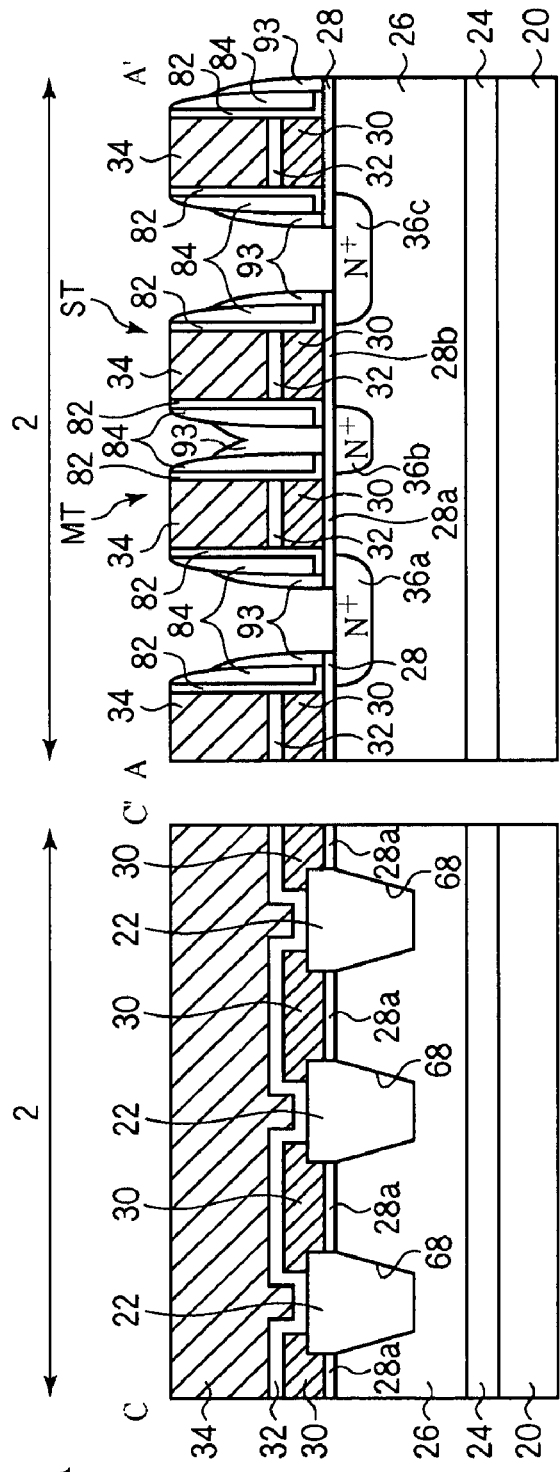
FIGS. 19A and 19B are sectional views of the nonvolatile semiconductor memory device according to the first embodiment in the steps of the method for manufacturing the nonvolatile semiconductor memory device, which illustrate the method (Part 9)
Figure 19B:
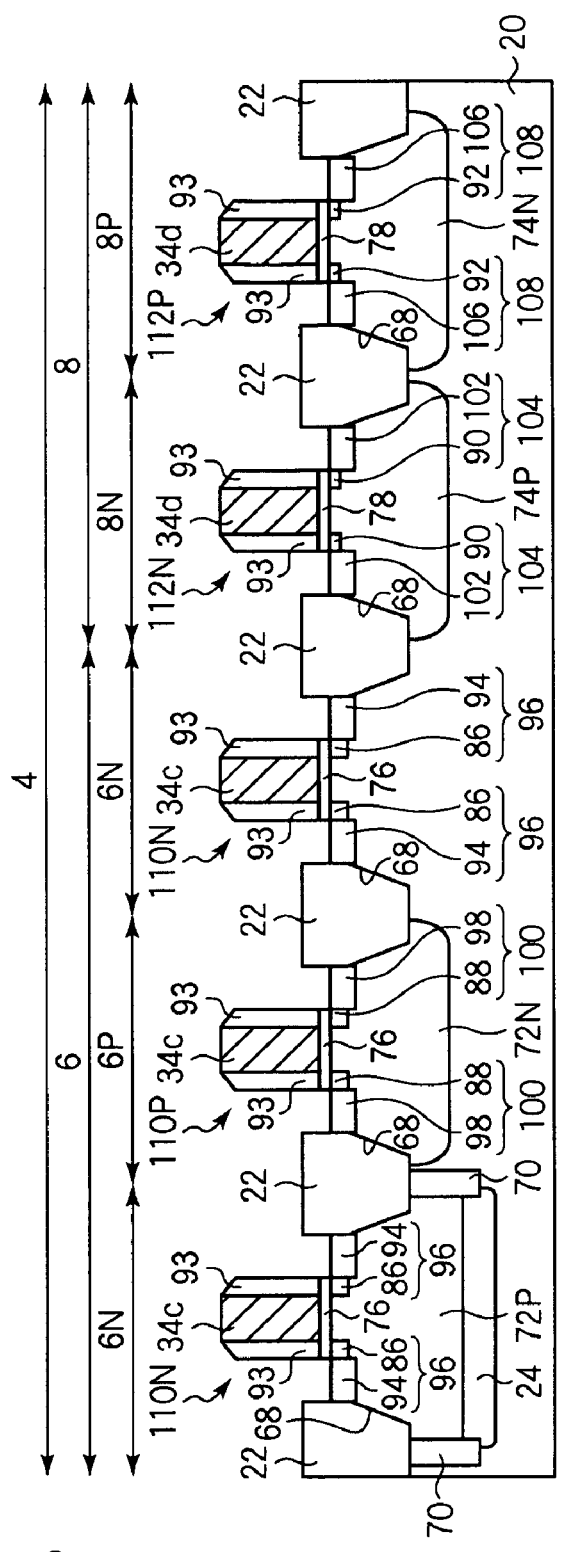

Next, as illustrated in FIGS. 18A and 18B, by thermal oxidation, the silicon oxide film (not illustrated) is formed on the side wall of the floating gate 30a, the side wall of the control gate 34a, the side wall of the select gate 30b and the side wall of the polysilicon film 34b.

Next, on the entire surface, a photoresist film (not illustrated) is formed by spin coating.

Next, by photolithography, an opening (not illustrated) for exposing the memory cell array region 2 is formed in the photoresist film.

Next, with the photoresist film as the mask, an N-type dopant impurity is implanted in the semiconductor substrate 20. Thus, impurity diffused layers 36a-36c are formed in the semiconductor substrate 20 on both sides of the floating gate 30a and in the semiconductor substrate 20 on both sides of the select gate 30b. Then, the photoresist film is released.

Thus, the memory cell transistor MT including the floating gate 30a, the control gate 34a and the source/drain diffused layers 36a, 36b is formed. The selecting transistor ST including the control gate 30b and the source/drain diffused layers 36b, 36c is formed.

Then, by thermal oxidation, a silicon oxide film 82 is formed on the side wall of the floating gate 30a, the side wall of the control gate 34b, the side wall of the select gate 30b and the side wall of the polysilicon film 34b.

Then, by, e.g., CVD, a 50 nm-thickness silicon nitride film 84 is formed.

Then, by dry etching, the silicon nitride film 84 anisotropically etched to form a sidewall insulation film 84 of silicon nitride film. At this time, the anti-reflection film 80 is etched off.

Next, by photolithography, the polysilicon film 34 in the region 6 for the high withstand voltage transistors to be formed in and the region 8 for the low voltage transistors to be formed in. Thus, the gate electrode 34c of the high withstand voltage transistor of polysilicon film 34 is formed. The gate electrode 34d of the low voltage transistor of polysilicon 34 is formed.

Next, a photoresist film (not illustrated) is formed on the entire surface by spin coating.

Next, by photolithography, an opening (not illustrated) for exposing the region 6N for the high withstand voltage N-channel transistors to be formed in is formed in the photoresist film.

Next, with the photoresist film as the mask, an N-type dopant impurity is implanted in the semiconductor substrate 20. Thus, an N-type lightly doped diffused layer 86 is formed in the semiconductor substrate 20 on both sides of the gate electrode 34c of the high withstand voltage N-channel transistor. Then, the photoresist film is released.

Then, a photoresist film (not illustrated) is formed on the entire surface by spin coating.

Next, by photolithography, an opening (not illustrated) for exposing the region 6P for the high withstand voltage P-channel transistors to be formed in is formed.

Then, with the photoresist film as the mask, a P-type dopant impurity is implanted in the semiconductor substrate 20. Thus, a P-type lightly doped diffused layer 88 is formed in the semiconductor substrate 20 on both sides of the gate electrode 34c of the high withstand voltage P-channel transistor. Then, the photoresist film is released.

Next, a photoresist film (not illustrated) is formed on the entire surface by spin coating.

Next, by photolithography, an opening (not illustrated) for exposing the region 8N for the low voltage N-channel transistors to be formed in is formed in the photoresist film.

Next, with the photoresist film as the mask, an N-type dopant impurity is implanted in the semiconductor substrate 20. Thus, an N-type lightly doped diffused layer 90 is formed in the semiconductor substrate 20 on both sides of the gate electrode 34d of the low voltage N-channel transistor. Then, the photoresist film is released.

Next, a photoresist film (not illustrated) is formed on the entire surface by spin coating.

Next, an opening (not illustrated) for exposing the region 8P for the low voltage P-channel transistors to be formed in is formed in the photoresist film.

Next, with the photoresist film as the mask, a P-type dopant impurity is implanted in the semiconductor substrate 20. Thus, a P-type lightly doped diffused layer 92 is formed in the semiconductor substrate 20 on both sides of the gate electrode 34d of the low voltage P-channel transistor. Then, the photoresist film is released.

Next, a 100 nm-thickness silicon oxide film 93 is formed by, e.g., CVD.

Then, the silicon oxide film 93 is anisotropically etched by dry etching. Thus, a sidewall insulation film 93 of silicon oxide film is formed on the side wall of the stacked layer of the floating gate 30a and the control gate 34a (see FIGS. 19A and 19B). The sidewall insulation film 93 of silicon oxide film is formed on the side wall of the stacked layer of the select gate 30b and the polysilicon film 34b. The sidewall insulation film 93 of silicon oxide film is formed on the side wall of the gate electrode 34c. The sidewall insulation film 93 of silicon oxide film is formed on the side wall of the gate electrode 34d.

Next, a photoresist film (not illustrated) is formed on the entire surface by spin coating.

Next, by photolithography, an opening (not illustrated) for exposing the region 6N for the high withstand voltage N-channel transistors to be formed in is formed in the photoresist film.

Next, with the photoresist film as the mask, an N-type dopant impurity is implanted in the semiconductor substrate 20. Thus, an N-type heavily doped diffused layer 94 is formed in the semiconductor substrate 20 on both sides of the gate electrode 34c of the high withstand voltage N-channel transistor. The N-type lightly doped diffused layer 86 and the N-type heavily doped diffused layer 94 form the N-type source/drain diffused layer 96 of the LDD structure. Thus, a high withstand voltage N-channel transistor 110N including the gate electrode 34c and the source/drain diffused layer 96 is formed. The high withstand voltage N-channel transistor 110N is used in the high voltage circuit (high withstand voltage circuit). Then, the photoresist film is released.

Next, a photoresist film (not illustrated) is formed on the entire surface by spin coating.

Next, by photolithography, an opening (not illustrated) for exposing the region 6P for the high withstand voltage P-channel transistors to be formed in is formed in the photoresist film.

Next, with the photoresist film as the mask, a P-type dopant impurity is implanted in the semiconductor substrate 20. Thus, a P-type heavily doped diffused layer 98 is formed in the semiconductor substrate 20 on both sides of the gate electrode 34c of the high withstand voltage P-channel transistor. The P-type lightly doped diffused layer 88 and the P-type heavily doped diffused layer 98 form a P-type source/drain diffused layer 100 of the LDD structure. Thus, a high withstand voltage P-channel transistor 110P including the gate electrode 34c and the source/drain diffused layer 100 is formed. The high withstand voltage P-channel transistor 110P is used in the high voltage circuit (high withstand voltage circuit). Then, the photoresist film is released.

Next, a photoresist film (not illustrated) is formed on the entire surface by spin coating.

Next, by photolithography, an opening (not illustrated) for exposing the region 8N for the low voltage N-channel transistors to be formed in is formed in the photoresist film.

Next, with the photoresist film as the mask, an N-type dopant impurity is implanted in the semiconductor substrate 20. Thus, an N-type heavily doped diffused layer 102 is formed in the semiconductor substrate 20 on both sides of the gate electrode 34d of the low voltage N-channel transistor. The N-type lightly doped diffused layer 90 and the N-type heavily doped diffused layer 102 form an N-type source/drain diffused layer 104 of the LDD structure. Thus, a low voltage N-channel transistor 112N including the gate electrode 34d and the source/drain diffused layer 104 is formed. The low voltage N-channel transistor 112N is used in the low voltage circuit. Then, the photoresist film is released.

Next, a photoresist film (not illustrated) is formed on the entire surface by spin coating.

Next, by photolithography, an opening (not illustrated) for exposing the region 8P for the low voltage P-channel transistors to be formed in is formed in the photoresist film.

Next, with the photoresist film as the mask, a P-type dopant impurity is implanted in the semiconductor substrate 20. Thus, a P-type heavily doped diffused layer 106 is formed in the semiconductor substrate 20 on both sides of the gate electrode 34d of the low voltage P-channel transistor. The P-type lightly doped diffused layer 92 and the P-type heavily doped diffused layer 106 form the P-type source/drain diffused layer 108 of the LDD structure. Thus, a low voltage P-channel transistor 112P including the gate electrode 34d and the source/drain diffused layer 108 is formed. The low voltage P-channel transistor 112P is used in the low voltage circuit. Then, the photoresist film is released.

Next, by, e.g., sputtering, a 10 nm-thickness cobalt film is formed on the entire surface.

Next, by thermal processing, the silicon atoms in the surface of the semiconductor substrate 20 and the cobalt atoms in the cobalt film are reacted with each other. The silicon atoms in the surface of the control gate 34c and the cobalt atoms in the cobalt film are reacted with each other. The silicon atoms in the surface of the polysilicon film 34d and the cobalt atoms in the cobalt film are reacted with each other. The silicon atoms in the surfaces of the gate electrodes 34c, 34d and the cobalt atoms in the cobalt film are reacted with each other. Thus, a cobalt silicide film 38a, 38c is formed on the source/drain diffused layers 36a, 36c (see FIGS. 20A and 20B). A cobalt silicide film 38c is formed on the control gate 34a. On the polysilicon film 34b, a cobalt silicide film 38d is formed. A cobalt silicide film 38e is formed on the source/drain diffused layers 96, 100, 104, 108. A cobalt silicide film 38f is formed on the gate electrodes 34c, 34d.

Next, the non-reacted cobalt film is etched off.

The cobalt silicide film 38b formed on the drain diffused layer 36c of the selecting transistor ST functions as the drain electrode.

The cobalt silicide film 38a formed on the source diffused layer 36a of the memory cell transistor MT functions as the source electrode.

The cobalt silicide film 38e formed on the source/drain diffused layers 96, 100 of the high withstand voltage transistors 110N, 110P function as the source/drain electrodes.

The cobalt silicide film 38e formed on the source/drain diffused layers 104, 108 of the low voltage transistors 112N, 112P functions as the source/drain electrodes.

Figure 21:
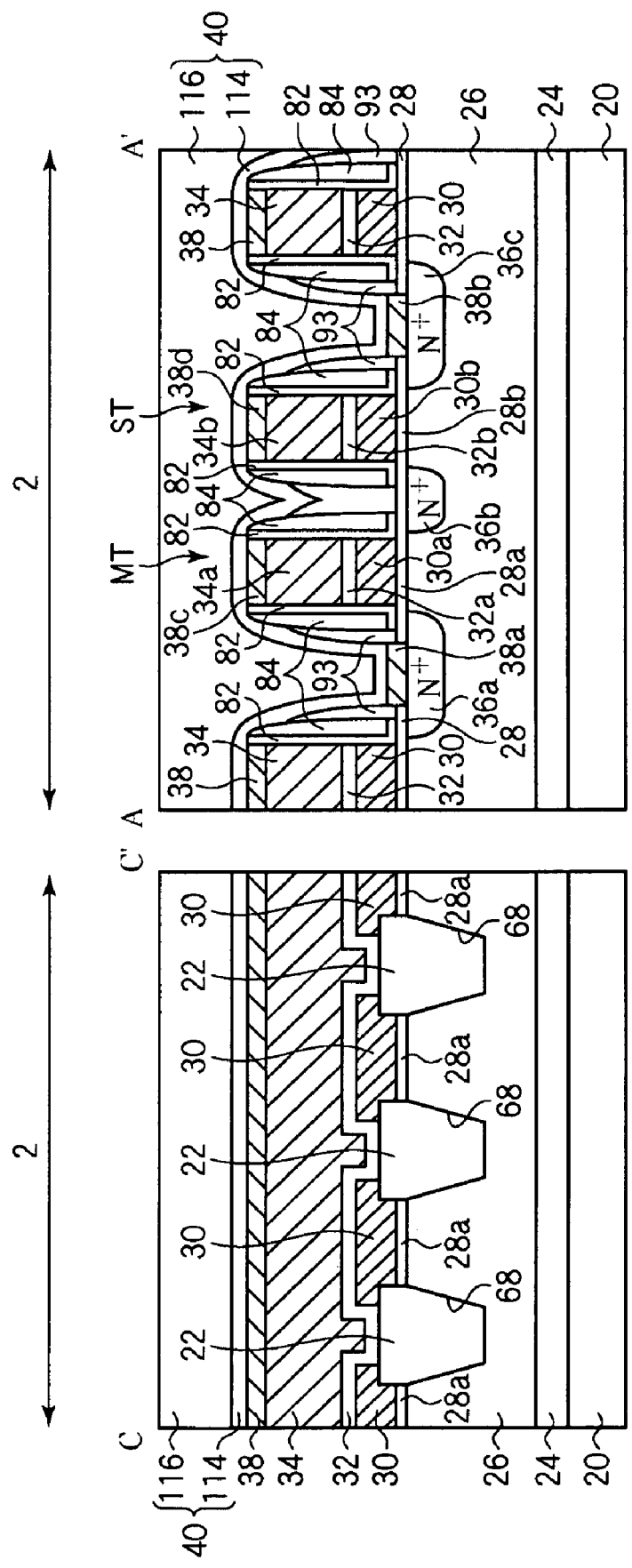
FIG. 21 is a sectional view of the nonvolatile semiconductor memory device according to the first embodiment in the steps of the method for manufacturing the nonvolatile semiconductor memory device, which illustrates the method (Part 11)
Figure 22:
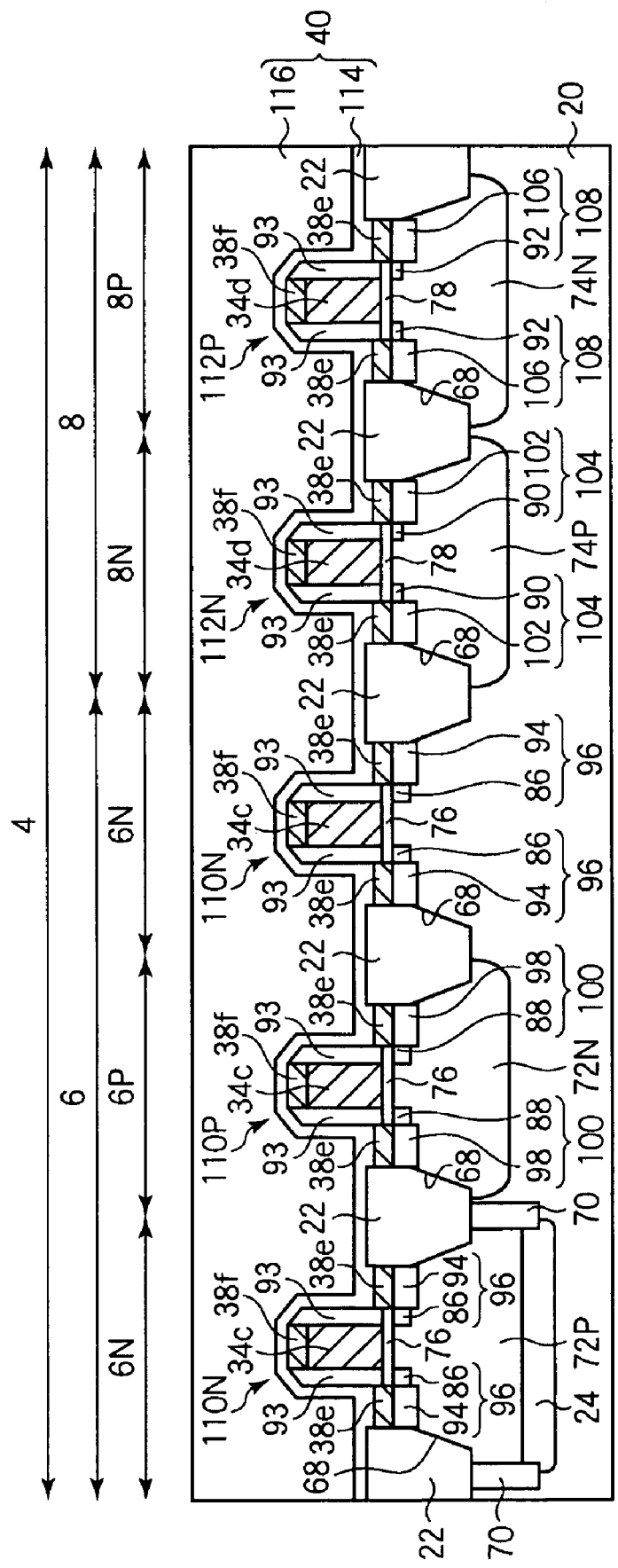
FIG. 22 is a sectional view of the nonvolatile semiconductor memory device according to the first embodiment in the steps of the method for manufacturing the nonvolatile semiconductor memory device, which illustrates the method (Part 12)

Next, as illustrated in FIGS. 21 and 22, a 100 nm-thickness silicon nitride film 114 is formed on the entire surface by, e.g., CVD. the silicon nitride film 114 functions as the etching stopper.

Next, a 1.6 μm-thickness silicon oxide film 116 is formed on the entire surface by CVD. Thus, an inter-layer insulation film 40 of the silicon nitride film 114 and the silicon oxide film 116 is formed.

Next, the surface of the inter-layer insulation film 40 is planarized by CMP.

Figure 23:
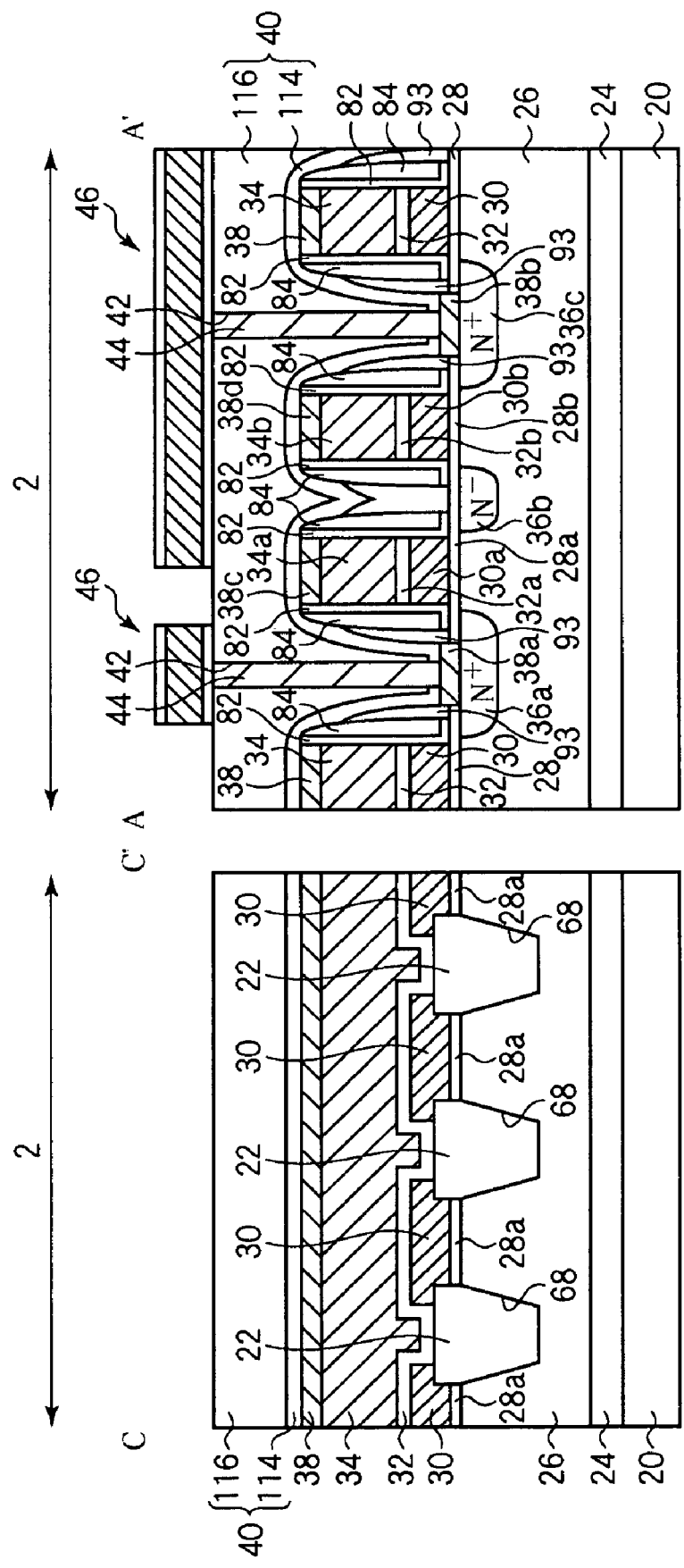
FIG. 23 is a sectional view of the nonvolatile semiconductor memory device according to the first embodiment in the steps of the method for manufacturing the nonvolatile semiconductor memory device, which illustrates the method (Part 13)
Figure 24:
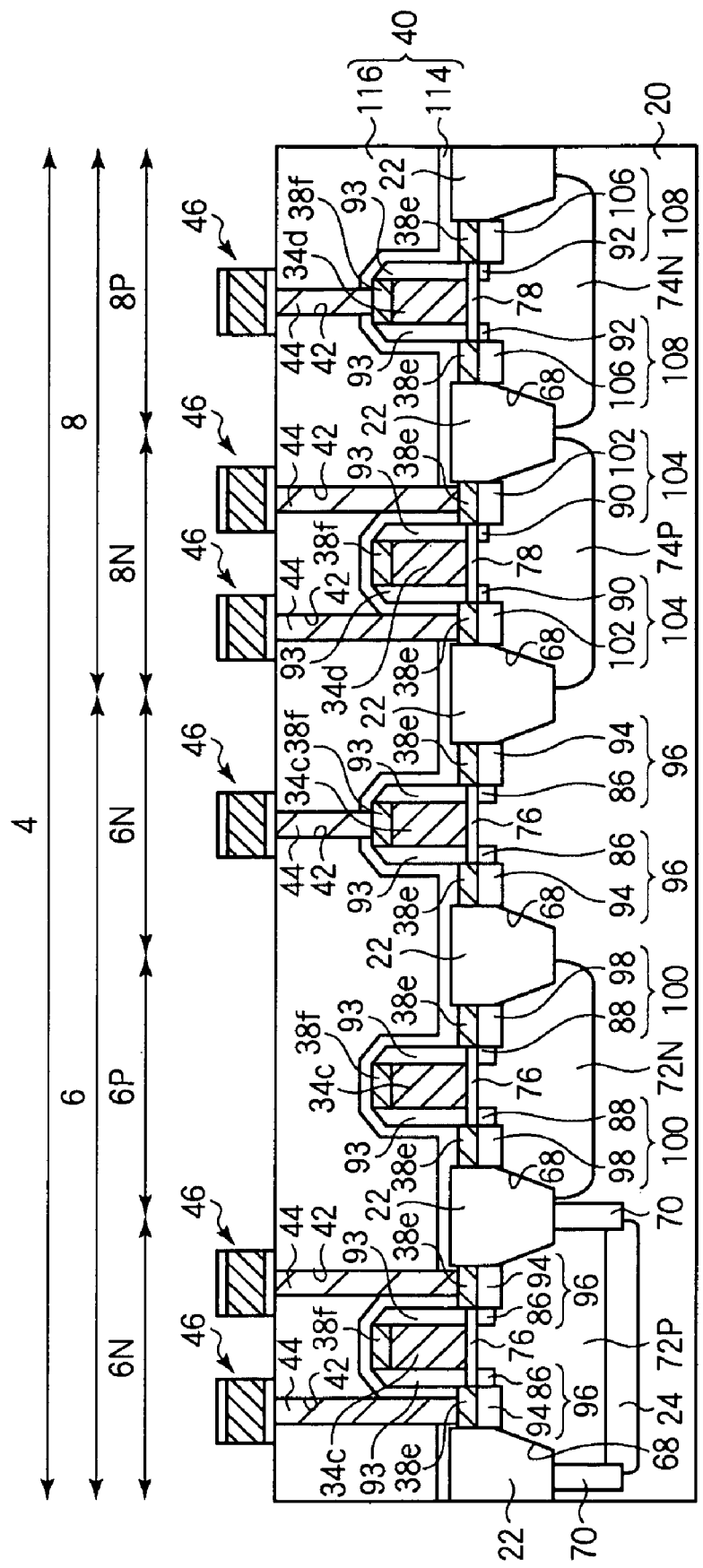
FIG. 24 is a sectional view of the nonvolatile semiconductor memory device according to the first embodiment in the steps of the method for manufacturing the nonvolatile semiconductor memory device, which illustrates the method (Part 14)

Then, by photolithography, contact holes 42 arriving at the source/drain electrodes 38a, 38b, a contact hole 42 arriving at the source/drain diffused layer 38e, contact hole 42 arriving at the cobalt silicide film 38f are formed by photolithography (see FIGS. 23 and 24).

Next, a barrier layer (not illustrated) of a Ti film and a TiN film is formed on the entire surface by sputtering.

Next, a 300 nm-thickness tungsten film 44 is formed on the entire surface by, e.g., CVD.

Next, the tungsten film 44 and the barrier film are polished by CMP until the surface of the inter-layer insulation film 40 is exposed. Thus, in the contact holes 42, conductor plugs 44 of, e.g., tungsten are formed.

Next, by, e.g., sputtering, on the inter-layer insulation film 40 with the conductor plugs 44 buried in, a layer film 46 of a Ti film, a TiN film, an Al film, a Ti film and a TiN film sequentially laid is formed.

Next, the layer film 46 is patterned by photolithography. Thus, an interconnection (the first interconnection layer) 46 of the layer film is formed.

Figure 25:
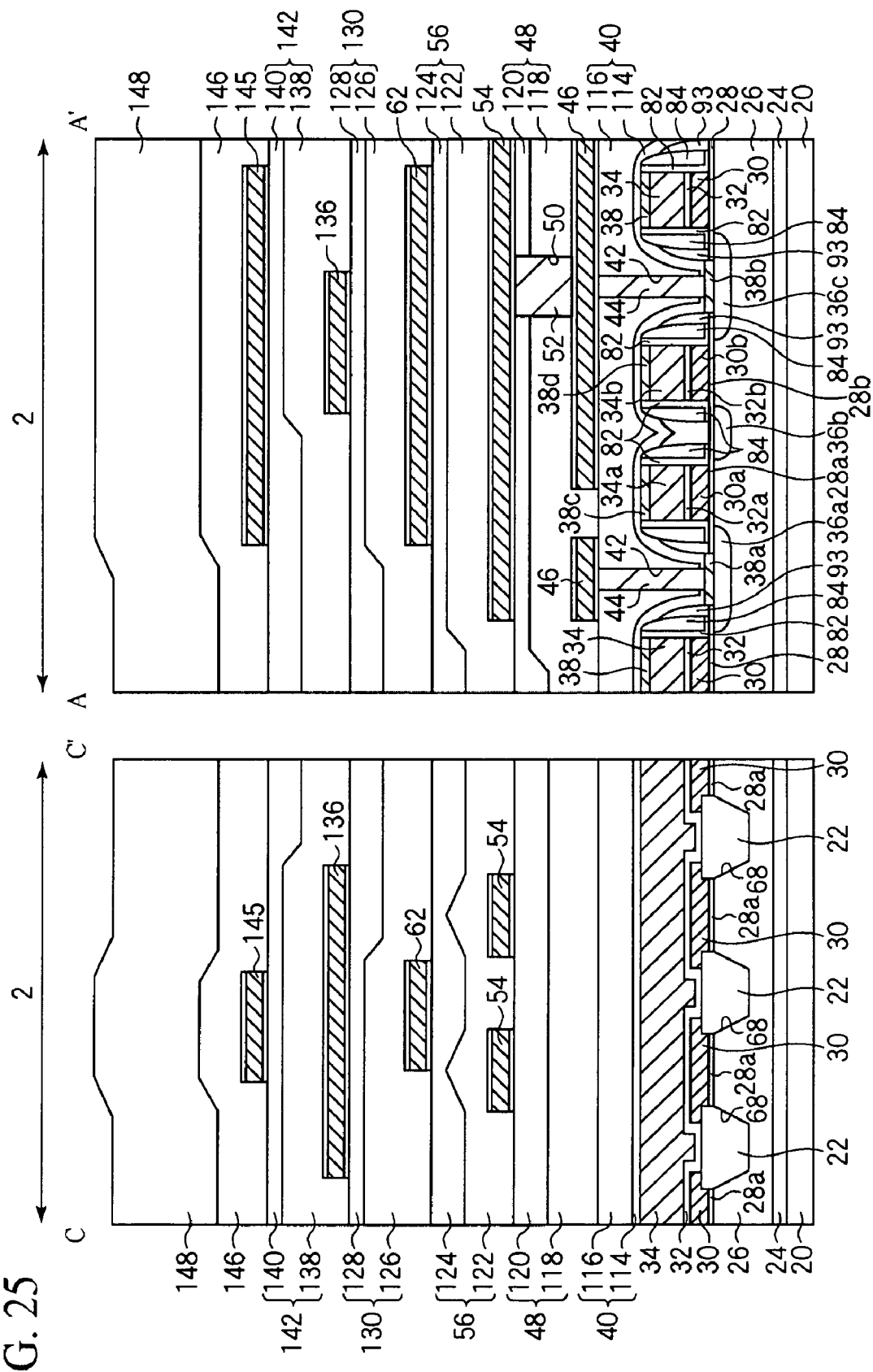
FIG. 25 is a sectional view of the nonvolatile semiconductor memory device according to the first embodiment in the steps of the method for manufacturing the nonvolatile semiconductor memory device, which illustrates the method (Part 15)
Figure 26:
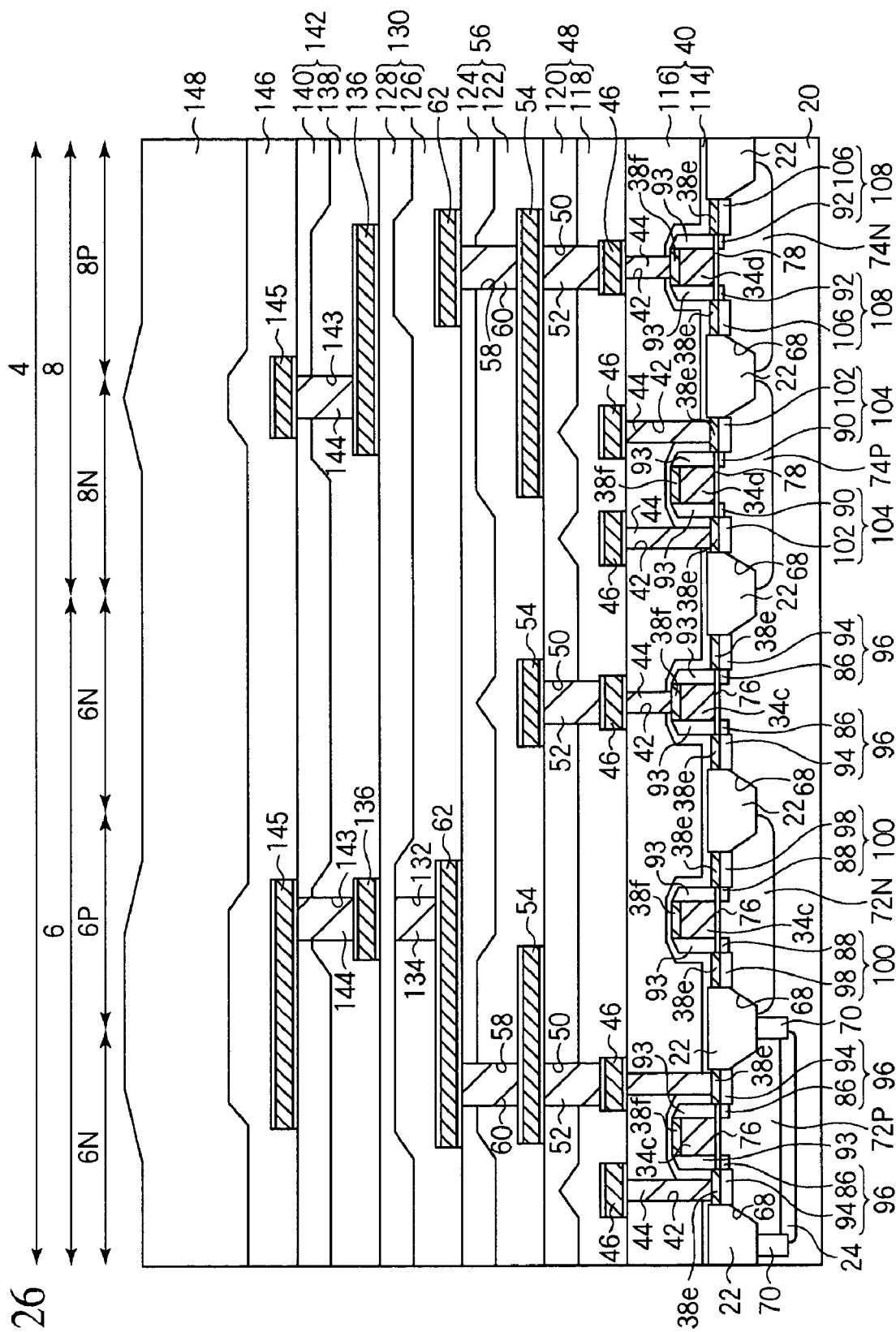
FIG. 26 is a sectional view of the nonvolatile semiconductor memory device according to the first embodiment in the steps of the method for manufacturing the nonvolatile semiconductor memory device, which illustrates the method (Part 16)

Next, as illustrated in FIGS. 25 and 26, a 700 nm-thickness silicon oxide film 118 is formed by, e.g., high density plasma-enhanced CVD.

Next, a silicon oxide film 120 is formed by TEOSCVD. The silicon oxide film 118 and the silicon oxide film 120 form an inter-layer insulation film 48.

Next, by photolithography, a contact hole 50 arriving at the interconnection 46 is formed in the inter-layer insulation film 48.

Next, a barrier layer (not illustrated) of a Ti film and a TiN film is formed on the entire surface by sputtering.

Next, a 300 nm-thickness tungsten film 52 is formed on the entire surface by, e.g., CVD.

Next, the tungsten film 52 and the barrier film are polished by CMP until the surface of the inter-layer insulation film 48 is exposed. Thus, in the contact hole 50, a conductor plug 52 of, e.g., tungsten is buried.

Then, on the inter-layer insulation film 48 with the conductor plug 52 buried in, a layer film 54 of a Ti film, a TiN film, an Al film, a Ti film and a TiN film sequentially laid is formed by, e.g., sputtering.

Next, by photolithography, the layer film 54 is patterned. Thus, interconnections (the second metal interconnection layer) 54 of the layer film are formed.

Next, a silicon oxide film 122 is formed by, e.g., high density plasma-enhanced CVD.

Next, a silicon oxide film 124 is formed by TEOSCVD. The silicon oxide film 122 and the silicon oxide film 124 form an inter-layer insulation film 56.

Next, by photolithography, contact holes 58 arriving at the interconnections 54 are formed in the inter-layer insulation film 56.

Next, a barrier layer (not illustrated) of a Ti film and a TiN film is formed on the entire surface by sputtering.

Then, a 300 nm-thickness tungsten film 60 is formed on the entire surface by, e.g., CVD.

Next, the tungsten film 60 and the barrier film are polished by CMP until the surface of the inter-layer insulation film 56 is exposed. In the contact holes 56, conductor plugs 60 (see FIG. 26) of, e.g., tungsten are buried.

Next, by, e.g., sputtering, on the inter-layer insulation film 56 with the conductor plugs 60 buried in, a layer film 62 is formed.

Next, by photolithography, the layer film 62 is patterned. Thus, interconnections (the third metal interconnection layer) 62 of the layer film are formed.

Next, a silicon oxide film 126 is formed by, e.g., high density plasma-enhanced CVD.

Then, a silicon oxide film 128 is formed by TEOSCVD. The silicon oxide film 126 and the silicon oxide film 128 form an inter-layer insulation film 130.

Next, by photolithography, a contact hole 132 is formed in the inter-layer insulation film 130 down to the interconnection 62.

Next, a barrier layer (not illustrated) of a Ti film and a TiN film is formed on the entire surface by sputtering.

Next, a 300 nm-thickness tungsten film 134 is formed on the entire surface by, e.g., CVD.

Next, the tungsten film 134 and the barrier film are polished by CMP until the surface of the inter-layer insulation film 130 is exposed. Thus, in the contact hole 132, a conductor plug (not illustrated) 134 of tungsten is buried.

Next, by, e.g., sputtering, on the inter-layer insulation film 130 with the conductor plug 134 buried in, a layer film 136 is formed.

Then, by photolithography, the layer film 136 is patterned. Thus, interconnections (the fourth metal interconnection layer) 136 of the layer film is formed.

Next, by, e.g., high density plasma-enhanced CVD, a silicon oxide film 138 is formed.

Then, a silicon oxide film 140 is formed by TEOSCVD. The silicon oxide film 138 and the silicon oxide film 140 form an inter-layer insulation film 142.

Next, by photolithography, contact holes 143 arriving at the interconnection 136 are formed in the inter-layer insulation film 142.

Then, a barrier layer (not illustrated) of a Ti film and a TiN film is formed on the entire surface by sputtering.

Then, a 300 nm-thickness tungsten film 146 is formed on the entire surface by, e.g., CVD.

Next, the tungsten film 146 and the barrier film are polished by CMP until the surface of the inter-layer insulation film 142 is exposed. Thus, in the contact holes 143, conductor plugs 144 of, e.g., tungsten are buried.

Then, a layer film 145 is formed by, e.g., sputtering on the inter-layer insulation film 142 with the conductor plugs 144 buried in.

Then, the layer film 145 is patterned by photolithography. Thus, interconnections (the fifth metal interconnection layer) 145 of the layer film are formed.

Next, a silicon oxide film 146 is formed by, e.g., high density plasma-enhanced CVD.

Next, a 1 µm-thickness silicon nitride film 148 is formed by plasma-enhanced CVD.

Thus, the nonvolatile semiconductor memory device according to the present embodiment is manufactured.

[b] Second Embodiment

Figure 28:
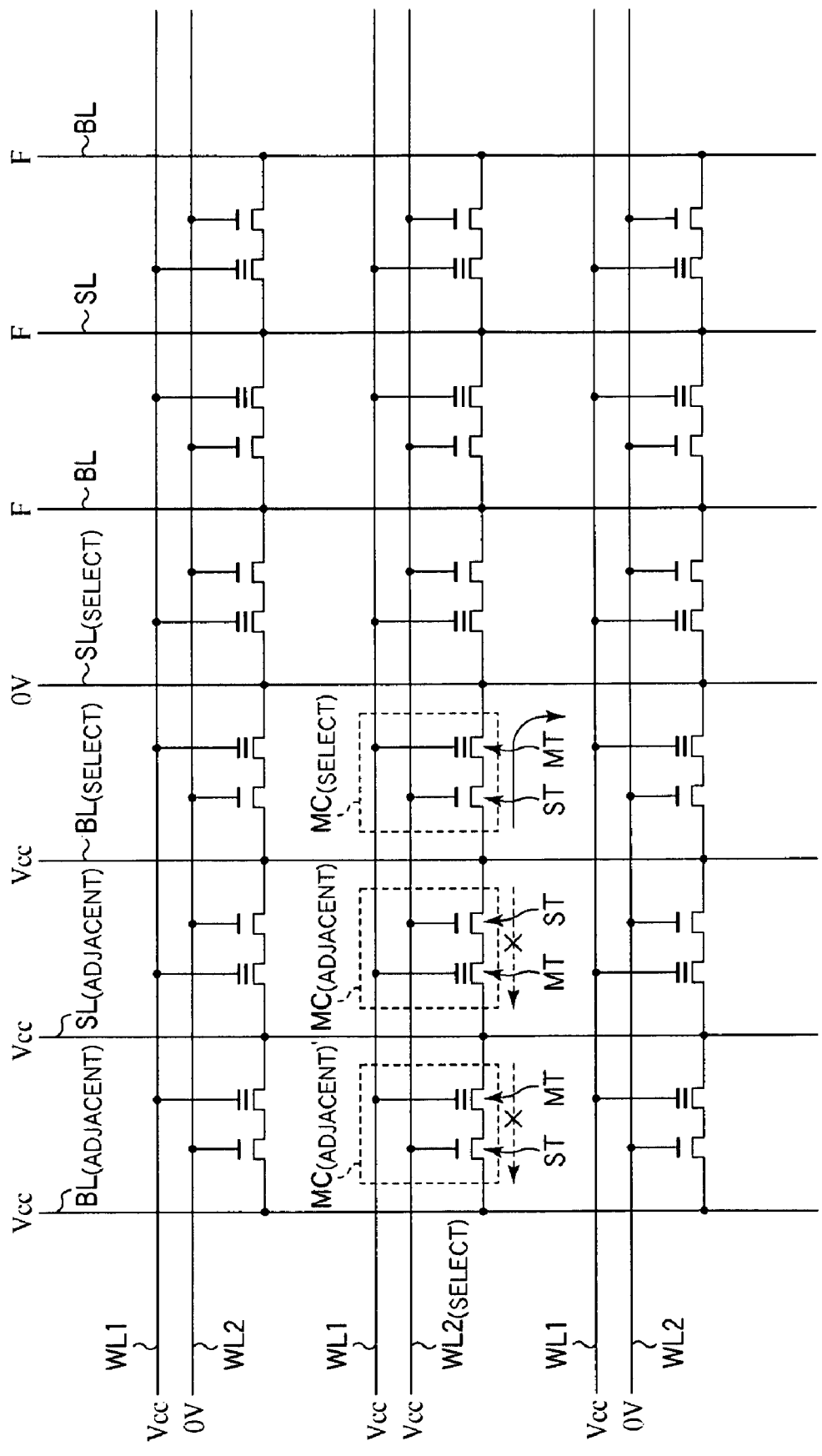
FIG. 28 is a circuit diagram of the nonvolatile semiconductor memory device according to the second embodiment, which illustrate the reading method thereof.
Figure 29:
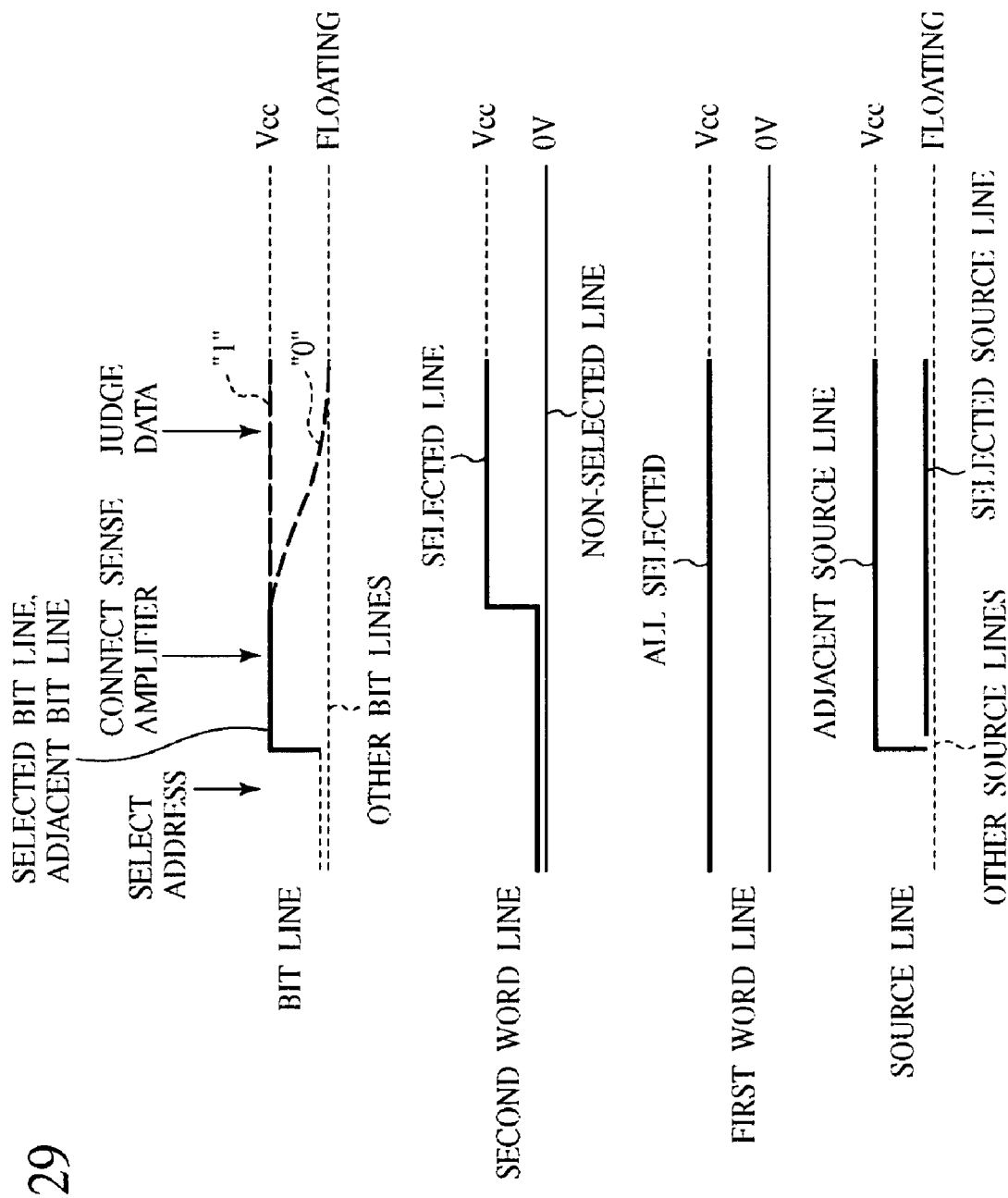
FIG. 29 is a time chart of the reading method of the nonvolatile semiconductor memory device according to the second embodiment.

A reading method of the nonvolatile semiconductor memory device according to a second embodiment will be explained with reference to FIGS. 27 to 29. FIG. 27 is a view illustrating the reading method, a writing method and an erasing method of the nonvolatile semiconductor memory device according to the present embodiment. In FIG. 27, the voltages in the parentheses are potentials of the non-selected lines. In FIG. 27, F indicates floating. FIG. 28 is a circuit diagram of the nonvolatile semiconductor memory device according to the present embodiment, which illustrates the reading method thereof. FIG. 29 is the time chart illustrating the reading method of the nonvolatile semiconductor memory device according to the present embodiment. The same members of the present embodiment as those of the nonvolatile semiconductor memory device, etc. according to the first embodiment illustrated in FIGS. 1 to 26 are represented by the same reference numbers not to repeat or to simplify their explanation.

The constitution of the nonvolatile semiconductor memory device according to the present embodiment is the same as the constitution of the nonvolatile semiconductor memory device according to the first embodiment described above with reference to FIG. 1.

The reading method of the nonvolatile semiconductor memory device according to the present embodiment is characterized mainly in that the potential of the adjacent bit line $BL_{(ADJACENT)}$ is set at $V_{CC}$.

When information written into memory cell transistors MT is read, in accordance with the time chart of FIG. 29, the voltages of the respective parts are set as illustrated in FIGS. 27 and 28.

First, the address of the memory cell to be selected (selected cell) $MC_{(SELECT)}$ is determined.

Then, the potential of the selected bit line $BL_{(SELECT)}$ connected to the drain of the selecting transistor ST of the selected cell $MC_{(SELECT)}$ is set at $V_{CC}$. The potential of the adjacent bit line $BL_{(ADJACENT)}$ is set at $V_{CC}$. The voltage of the bit lines BL other than the selected bit line $BL_{(SELECT)}$ and the adjacent bit line $BL_{(ADJACENT)}$ is floating. The selected source line $SL_{(SELECT)}$ is positioned on the first side with respect to the selected bit line $BL_{(SELECT)}$. The adjacent source line $SL_{(ADJACENT)}$ is positioned on the second side with respect to the selected bit line $BL_{(SELECT)}$, which is opposite to the first side. The adjacent bit line $BL_{(ADJACENT)}$ is positioned on the second side with respect to the adjacent source line $SL_{(ADJACENT)}$. The drain of the selecting transistor ST of the selected cell $MC_{(SELECT)}$ and the drain of the selecting transistor ST of the adjacent cell $MC_{(ADJACENT)}$ are commonly connected by the selected bit line $BL_{(SELECT)}$. The source of the memory cell transistor MT of the adjacent cell $MC_{(ADJACENT)}$ and the source of the memory cell transistor MT of another adjacent cell $MC_{(ADJACENT)}$' adjacent to the adjacent cell $MC_{(ADJACENT)}$ are commonly connected by the adjacent source line $SL_{(ADJACENT)}$. The adjacent bit line $BL_{(ADJACENT)}$ is connected to the drain of the selecting transistor ST of said another adjacent cell $MC_{(ADJACENT)}$'. The potential of the adjacent source line $SL_{(ADJACENT)}$ connected to the adjacent cell $MC_{(ADJACENT)}$ is $V_{CC}$. The potential of the source line (selected source line) $SL_{(SELECT)}$ connected to the selected cell $MC_{(SELECT)}$ is 0 V (ground voltage). The potential of the other source lines SL, i.e., the source lines SL other than the selected source line $SL_{(SELECT)}$ and the adjacent source line $SL_{(SELECT)}$ is floating. The potential of all the first word lines WL1 is constantly $V_{CC}$ on the standby for read. The potential of all the wells 26 is 0 V.

Next, the selected bit line $BL_{(SELECT)}$ is connected to a sense amplifier 13 (see FIG. 29).

Then, the potential of the second word line $WL2_{(SELECT)}$ connected to the selected cell $MC_{(SELECT)}$ is set at $V_{CC}$ (see FIG. 29). On the other hand, the potential of the plural second word lines WL2 other than the selected second word line $WL2_{(SELECT)}$ is set at 0 V.

When information is written into the memory cell transistor MT of the selected cell $MC_{(SELECT)}$, i.e., when the information of the memory cell transistor MT of the selected cell $MC_{(SELECT)}$ is "1", charges are stored in the floating gate 30a of the memory cell transistor MT. In such case, no current flows between the source diffused layer 36a of the memory cell transistor MT and the drain diffused layer 36c of the selecting transistor ST, and no current flows in the selected one line (selected bit line) $BL_{(SELECT)}$. Accordingly, the potential of the selected bit line $BL_{(SELECT)}$ remains $V_{CC}$. The potential of the selected bit line $BL_{(SELECT)}$ is detected by the sense amplifier 13. When the potential of the selected bit line $BL_{(SELECT)}$ remains $V_{CC}$, the information of the memory cell transistor MT of the selected cell $MC_{(SELECT)}$ is judged to be "1".

On the other hand, when information written into the memory cell transistor MT of the selected cell $MC_{(SELECT)}$ has been erased, i.e., the information of the memory cell of the selected cell $MC_{(SELECT)}$ is "0", no charges are stored in the floating gate 30a of the memory cell transistor MT. In such case, current flows between the source diffused layer 36a of the memory cell transistor MT and the drain diffused layer 36c of the selecting transistor SL, and current flows in the selected one bit line $BL_{(SELECT)}$. Accordingly, the potential of the selected bit line $BL_{(SELECT)}$ gradually lowers and finally to 0 V. When the potential of the selected bit line $BL_{(SELECT)}$ becomes lower than $V_{CC}$, the information of the memory cell transistor MT of the selected cell $MC_{(SELECT)}$ is judged to be "0" (see FIG. 29).

Thus, the information written into the memory cell transistor MT is read.

In the present embodiment, the potential of the adjacent bit line $BL_{(ADJACENT)}$ is set at $V_{CC}$ for the following reason.

That is, when the potential of the adjacent bit line $BL_{(ADJACENT)}$ is floating, even with the potential of the adjacent source line $SL_{(SELECT)}$ set at $V_{CC}$, there is a risk that unintentional current will flow between the drain diffused layer 36a of the memory cell transistor MT and the drain diffused layer 36c of the selecting transistor ST in each of the adjacent cell $MC_{(SELECT)}$ and said another adjacent cell $MC_{(ADJACENT)}'$. In this case, in the selected cell $MC_{(SELECT)}$, whether or not current flows between the source diffused layer 36a of the memory cell transistor MT and the drain diffuse layer 36c of the selecting transistor ST, current flows in the selected bit line $BL_{(SELECT)}$. When current flows between the source diffused layer 36a of the memory cell transistor MT and the drain diffused layer 36c of the selecting transistor ST in each of the adjacent cell $MC_{(ADJACENT)}$ and said another adjacent cell $MC_{(ADJACENT)}'$ although no current flow in the selected cell $MC_{(SELECT)}$ between the source diffused layer 36a of the memory cell transistor MT and the drain diffused layer 36c of the selecting transistor ST, the information in the memory cell transistor MT of the selected cell $MC_{(SELECT)}$ is erroneously judged.

In the present embodiment, however, when information written into the memory cell transistor MT of the selected cell $MC_{(SELECT)}$ is read, the potential of the adjacent source line $SL_{(ADJACENT)}$ and also the potential of the adjacent bit line $BL_{(ADJACENT)}$ is set at $V_{CC}$. Thus, according to the present embodiment, unintentional flow of current between the source diffused layer 36a of the memory cell transistor MT and the drain diffused layer 36c of the selecting transistor ST in each of the adjacent cell $MC_{(ADJACENT)}$ and another adjacent cell $MC_{(ADJACENT)}'$ can be more surely prevented. According to the present embodiment, it can be surely prevented that information in the memory cell transistor MT of the selected cell $MC_{(SELECT)}$ is erroneously judged.

The writing method and erasing method of the nonvolatile semiconductor memory device according to the present embodiment are the same as the writing method and the erasing method of the nonvolatile semiconductor according to the first embodiment.

[c] Third Embodiment

Figure 31:
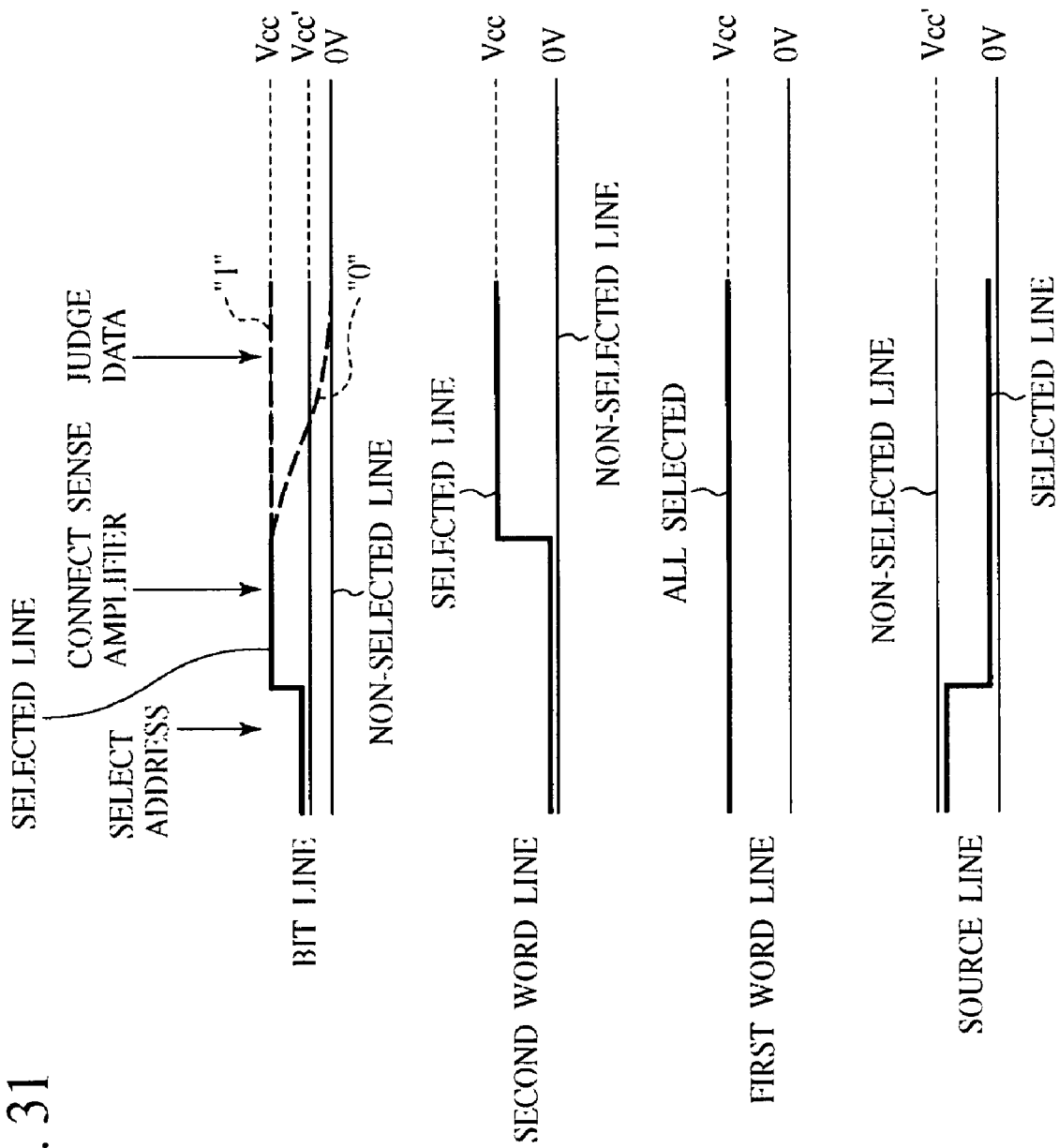
FIG. 31 is a time chart of the reading method of the nonvolatile semiconductor memory device according to the third embodiment.
Figure 32:
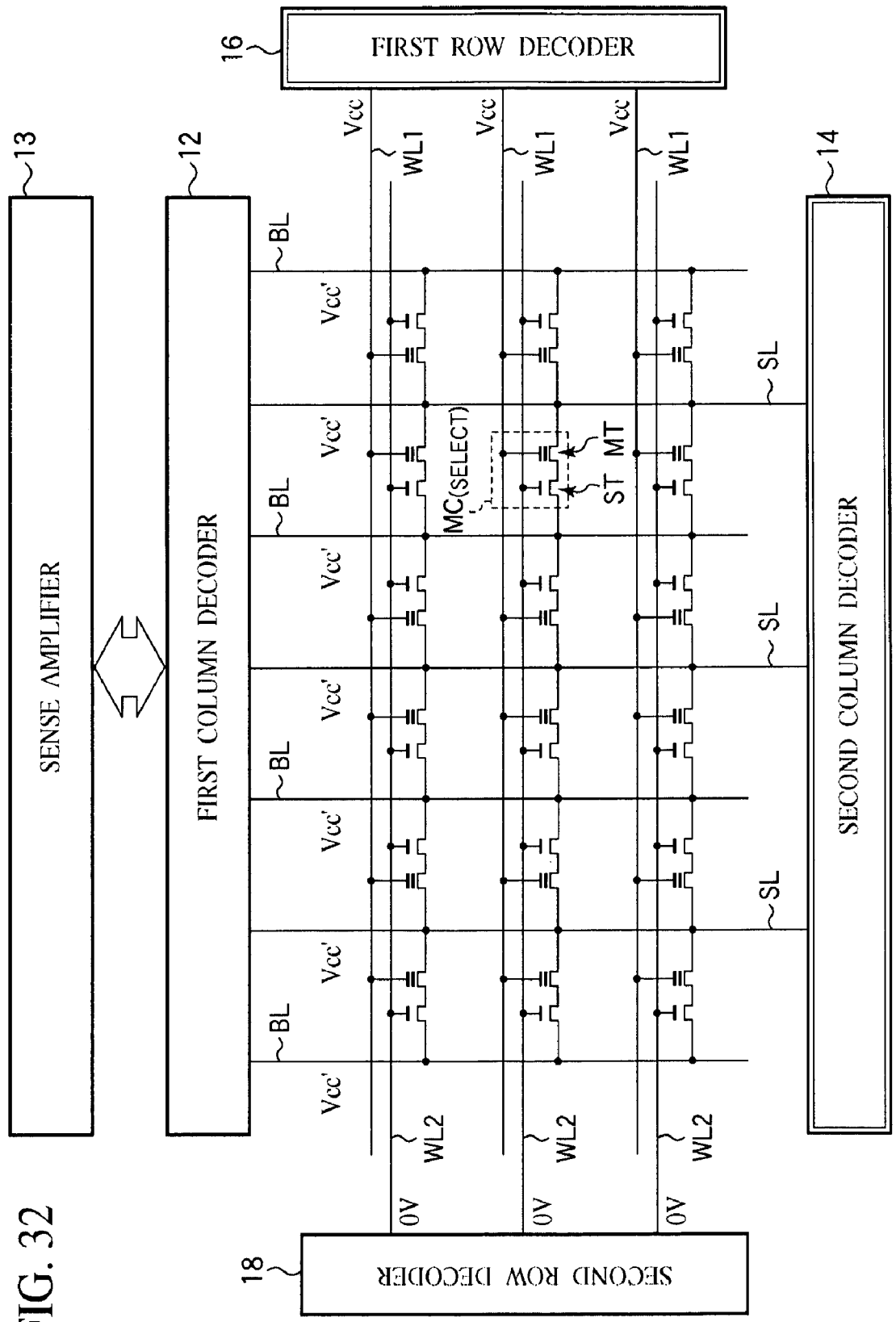
FIG. 32 is a circuit diagram (Part 1) of the nonvolatile semiconductor memory device according to the third embodiment, which illustrates the reading method thereof.
Figure 33:
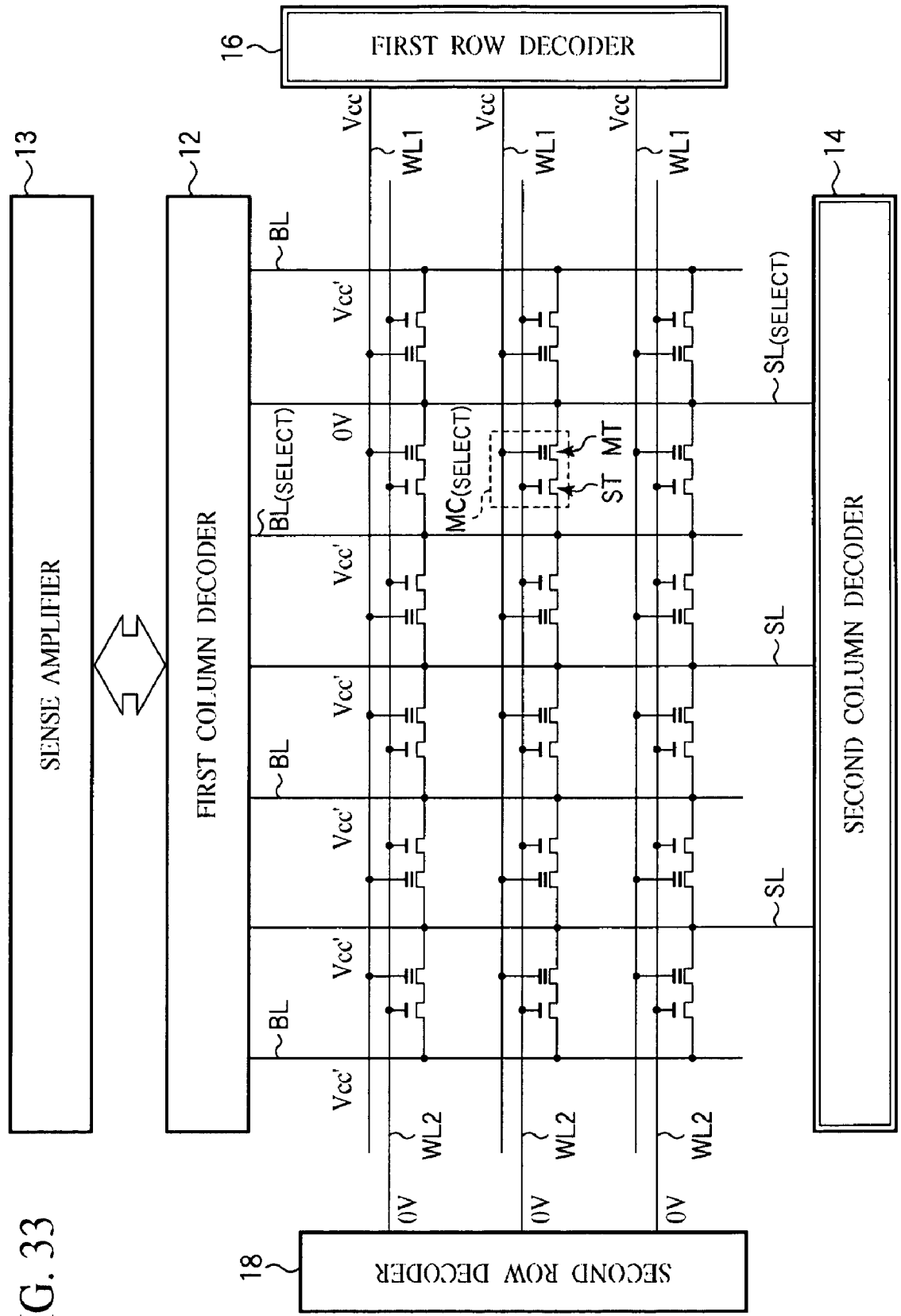
FIG. 33 is a circuit diagram (Part 2) of the nonvolatile semiconductor memory device according to the third embodiment, which illustrates the reading method thereof.
Figure 34:
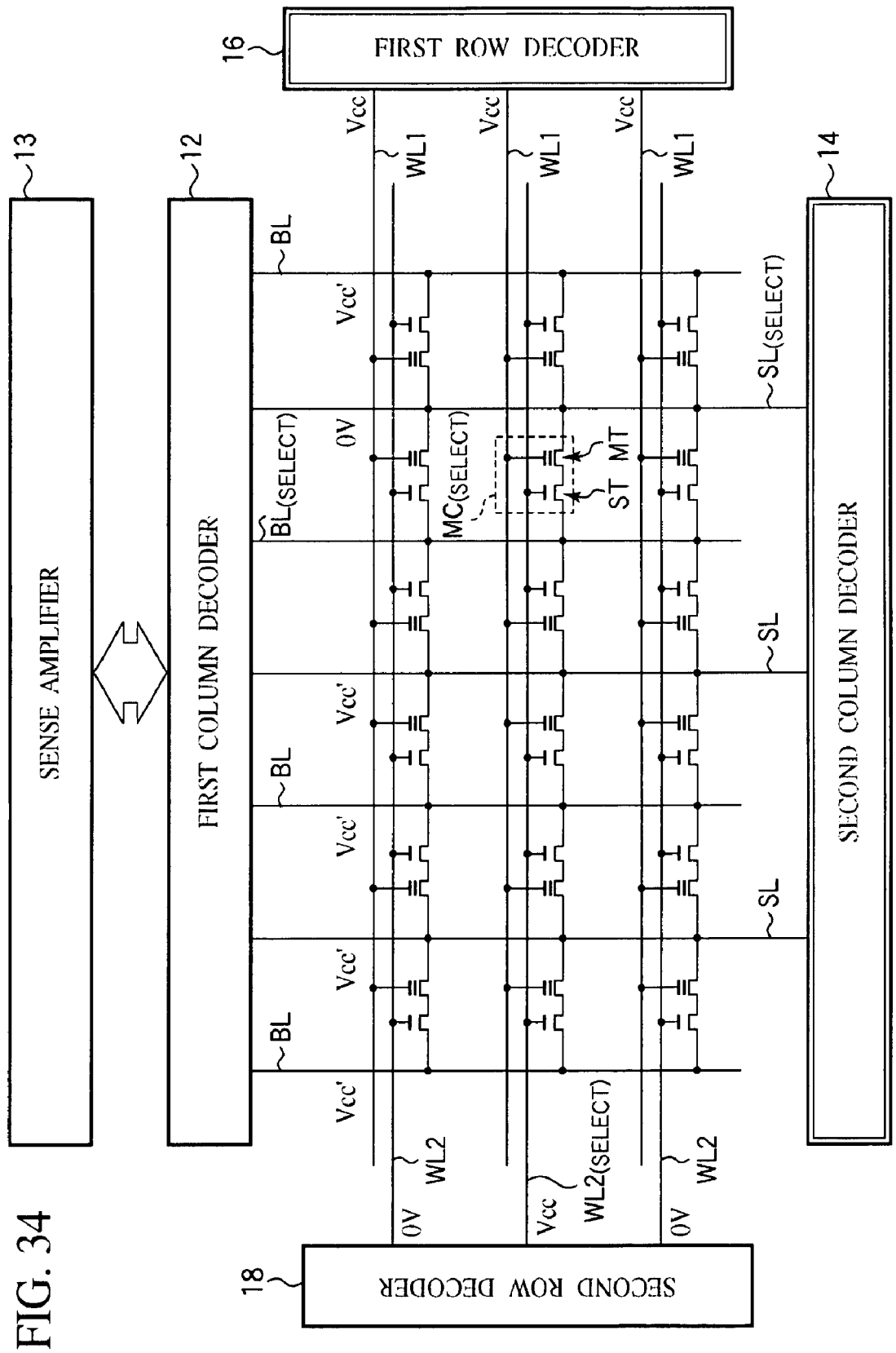
FIG. 34 is a circuit diagram (Part 3) of the nonvolatile semiconductor memory device according to the third embodiment, which illustrates the reading method thereof.

A reading method of the nonvolatile semiconductor memory device according to a third embodiment will be explained with reference to FIGS. 30 to 34. FIG. 30 is a view illustrating the reading method, a writing method and an erasing method of the nonvolatile semiconductor memory device according to the present embodiment. In FIG. 30, the voltages in the parentheses are potentials of the non-selected lines. In FIG. 30, F indicates floating. FIG. 31 is the time chart of the reading method of the nonvolatile semiconductor memory device according to the present embodiment. FIGS. 32 to 34 are circuit diagrams of the nonvolatile semiconductor memory device according to the present embodiment, which illustrate the reading method thereof. The same members of the present embodiment are represented by the same reference numbers as those of the nonvolatile semiconductor memory device, etc. according to the first or the second embodiment are represented by the same reference numbers not to repeat or to simplify their explanation.

The reading method of the nonvolatile semiconductor memory device according to the present embodiment is characterized mainly in that the potential of all the bit lines BL and the potential of all the source lines SL are set at $V_{CC}'$, and then the potential of the selected bit line $BL_{(SELECT)}$ is set at $V_{CC}$, and the potential of the selected source line SL is set at 0 V, whereby information written into the memory cell transistor MT is read.

The constitution of the nonvolatile semiconductor memory device according to the present embodiment is the same as the constitution of the nonvolatile semiconductor memory device according to the first embodiment described above with reference to FIG. 1.

When information written into the memory cell transistor MT is read, in accordance with the time chart of FIG. 31, the voltages of the respective parts are set as illustrated in FIG. 30 and FIGS. 32 to 34.

First, the address of a memory cell to be selected (selected cell) $MC_{(SELECT)}$ is determined.

Then, the potential of all the bit lines BL is set at $V_{CC}'$, and the potential of all the source lines SL is set at $V_{CC}'$ (see FIG. 32). The $V_{CC}'$ is a voltage equal to a source voltage (power supply voltage) $V_{CC}$ or a voltage lower than the source voltage $V_{CC}$. Thus, all the bit lines BL and all the source lines SL are charged up to $V_{CC}'$. The potential of all the first word lines WL1 is constantly $V_{CC}$ on the standby for read. The potential of all the wells 26 is 0 V.

Then, the potential of the selected bit line $BL_{(SELECT)}$ connected to the drain of the selecting transistor ST of the selected cell $MC_{(SELECT)}$ is set at $V_{CC}$. The potential of the selected source line $SL_{(SELECT)}$ connected to the source of the memory cell transistor MT of the selected cell $MC_{(SELECT)}$ is set at 0 V (see FIG. 33).

Next, the selected bit line $BL_{(SELECT)}$ is connected to the sense amplifier 13 (see FIG. 31).

Then, the potential of the second word line $WL2_{(SELECT)}$ connected to the selected cell $MC_{(SELECT)}$ is set at $V_{CC}$ (see FIG. 34). The potential of all the second word lines WL2 other than the selected second word line $WL2_{(SELECT)}$ is 0 V.

When information is written into the memory cell transistor MT of the selected cell $MC_{(SELECT)}$, i.e., the information of the memory cell transistor MT of the selected cell $MC_{(SELECT)}$ is "1", charges are stored in the floating gate 30a of the memory cell transistor MT. In such case, no current flows between the source diffused layer 36a of the memory cell transistor MT and the drain diffused layer 36c of the selected transistor ST, and no current flows to selected one bit line (selected bit line) $BL_{(SELECT)}$. Thus, the potential of the selected bit line $BL_{(SELECT)}$ becomes $V_{CC}$. Even if leak current should takes place in memory cells MC other than the selected cell $MC_{(SELECT)}$, the potential of the selected bit line $BL_{(SELECT)}$ never become lower than $V_{CC}'$. The potential of the selected bit line $BL_{(SELECT)}$ is detected by the sense amplifier 13. When the potential of the selected bit line $BL_{(SELECT)}$ is $V_{CC}'$ or above, the information of the memory cell transistor MT of the selected cell $MC_{(SELECT)}$ is judged to be "1" (see FIG. 31).

On the other hand, when information written into the memory cell transistor MT of the selected cell $MC_{(SELECT)}$ has been erased, i.e., the information of the memory cell transistor MT of the selected cell $MC_{(SELECT)}$ is "0", no charges are stored in the floating gate 30a of the memory cell transistor MT. In such case, current flows between the source diffused layer 36a of the memory cell transistor MT and the drain diffused layer 36c of the selecting transistor ST, and current flows in the selected one bit line (selected bit line) $BL_{(SELECT)}$. Accordingly, the potential of the selected bit line $BL_{(SELECT)}$ lowers gradually and finally to 0 V. When the potential of the selected bit line $BL_{(SELECT)}$ becomes lower than $V_{CC}'$, the information in the memory cell transistor MT of the selected cell $MC_{(SELECT)}$ is judged to be "0" (see FIG. 31).

Thus, information written into the memory cell transistor MT is read.

In the present embodiment, the potential of the non-selected bit lines BL is $V_{CC}'$, and the potential of the non-selected source lines is $V_{CC}'$ for the following reason.

That is, with the potential of the non-selected bit lines BL and the potential of the non-selected source lines SL being floating, there is a risk that unintentional current will flow between the source diffused layer 36a of the memory cell transistor MT and the drain diffused layer 36c of the selecting transistor ST in the memory cells MC other than the selected cell $MC_{(SELECT)}$. In such case, whether or not current flows between the source diffused layer 36a of the memory cell transistor MT and the drain diffused layer 36c of the selecting transistor ST in the selected cell $MC_{(SELECT)}$, current flows in the selected bit line $BL_{(SELECT)}$. When even with no current flowing between the source diffused layer 36a of the memory cell transistor MT and the drain diffused layer 36c of the selecting transistor ST in the selected cell $MC_{(SELECT)}$, current flows between the source diffused layer 36a of the memory cell transistor MT and the drain diffused layer 36c of the selecting transistor ST in the memory cells MC other than the selected cell $MC_{(SELECT)}$, information in the memory cell transistor MT of the selected cell $MC_{(SELECT)}$ is erroneously judged.

In the present embodiment, however, when information written into the memory cell transistor MT of the selected cell $MC_{(SELECT)}$ is read, the potential of the non-selected bit lines BL and the non-selected source lines SL is $V_{CC}'$. Thus, according to the present embodiment, even when unintentional current flows between the source diffused layer 36a of the memory cell transistor MT and the drain diffused layer 36c of the selecting transistor ST in the each of the memory cells MC other than the selected cell $MC_{(SELECT)}$, the potential of the selected bit line $BL_{(SELECT)}$ becomes $V_{CC}'$ or above when the information in the memory cell transistor MT of the selected cell $MC_{(SELECT)}$ is "1". Thus, according to the present embodiment, it can be surely prevented that information in the memory cell transistor MT of the selected cell $MC_{(SELECT)}$ is erroneously judged.

The writing method and the erasing method of the nonvolatile semiconductor memory device according to the present embodiment are the same as the writing method and the erasing method of the nonvolatile semiconductor memory device according to the first embodiment.

[d] Fourth Embodiment

Figure 35:
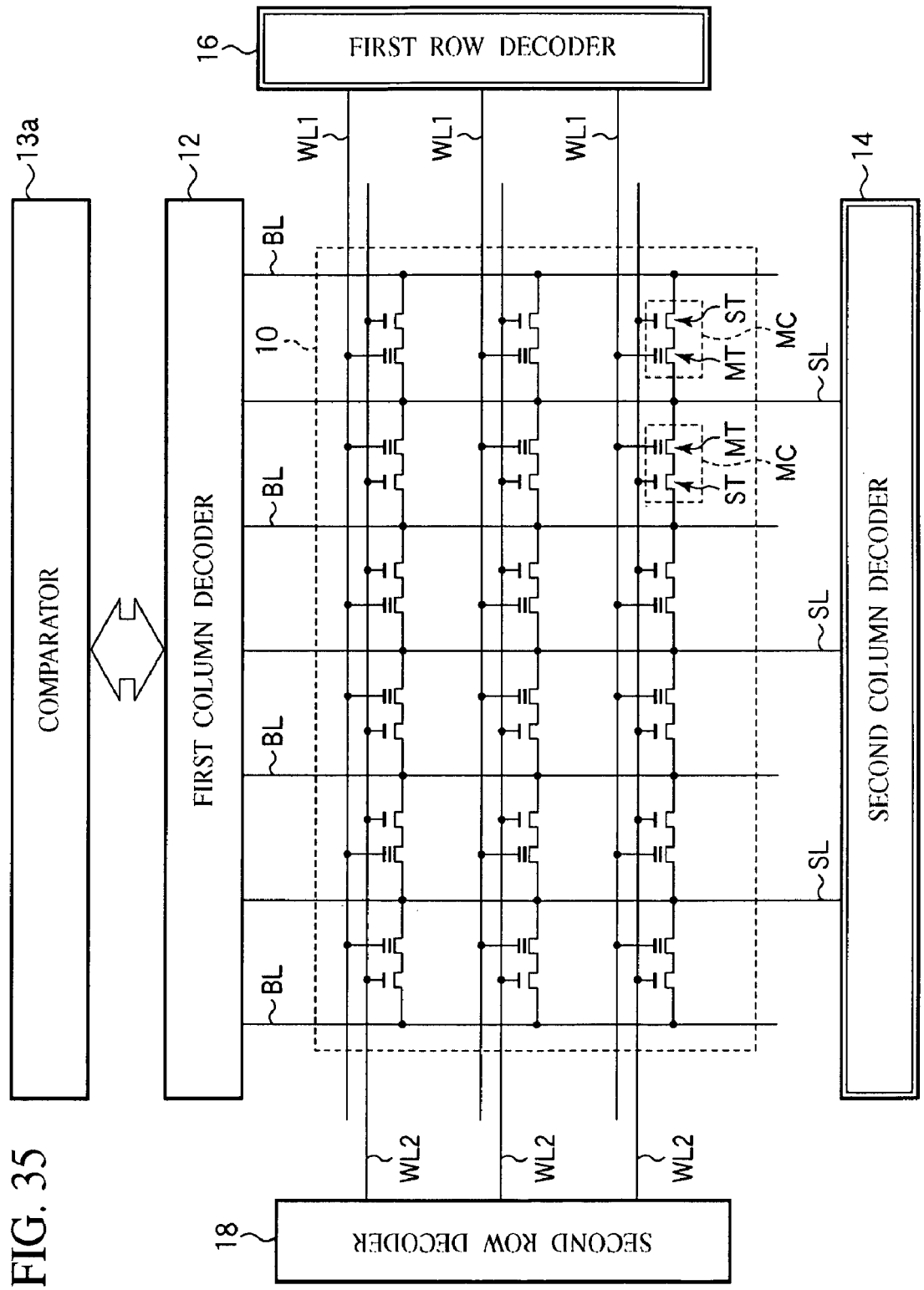
FIG. 35 is a circuit diagram of the nonvolatile semiconductor memory device according to a fourth embodiment.
Figure 37:
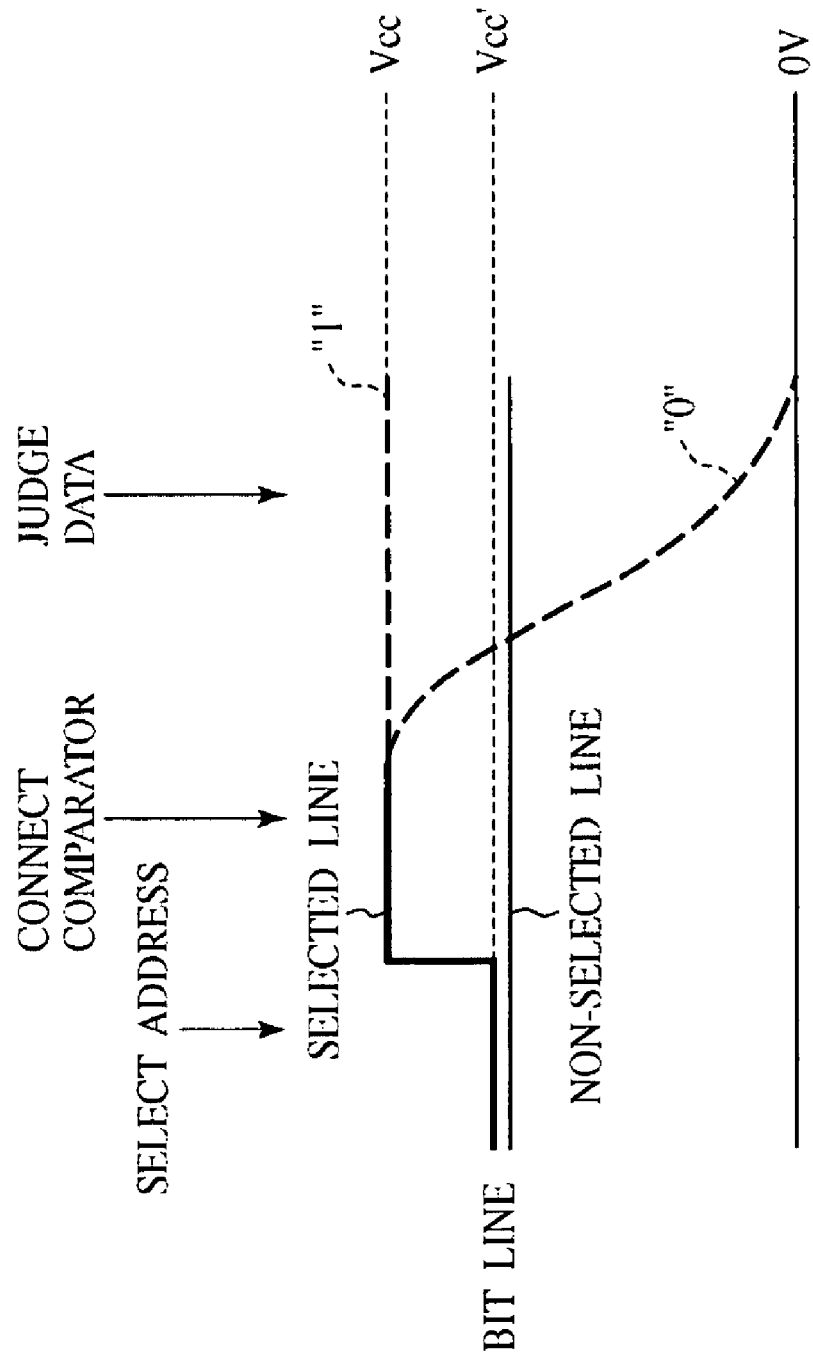
FIG. 37 is a time chart of the reading method of the nonvolatile semiconductor memory device according to the fourth embodiment.
Figure 38:
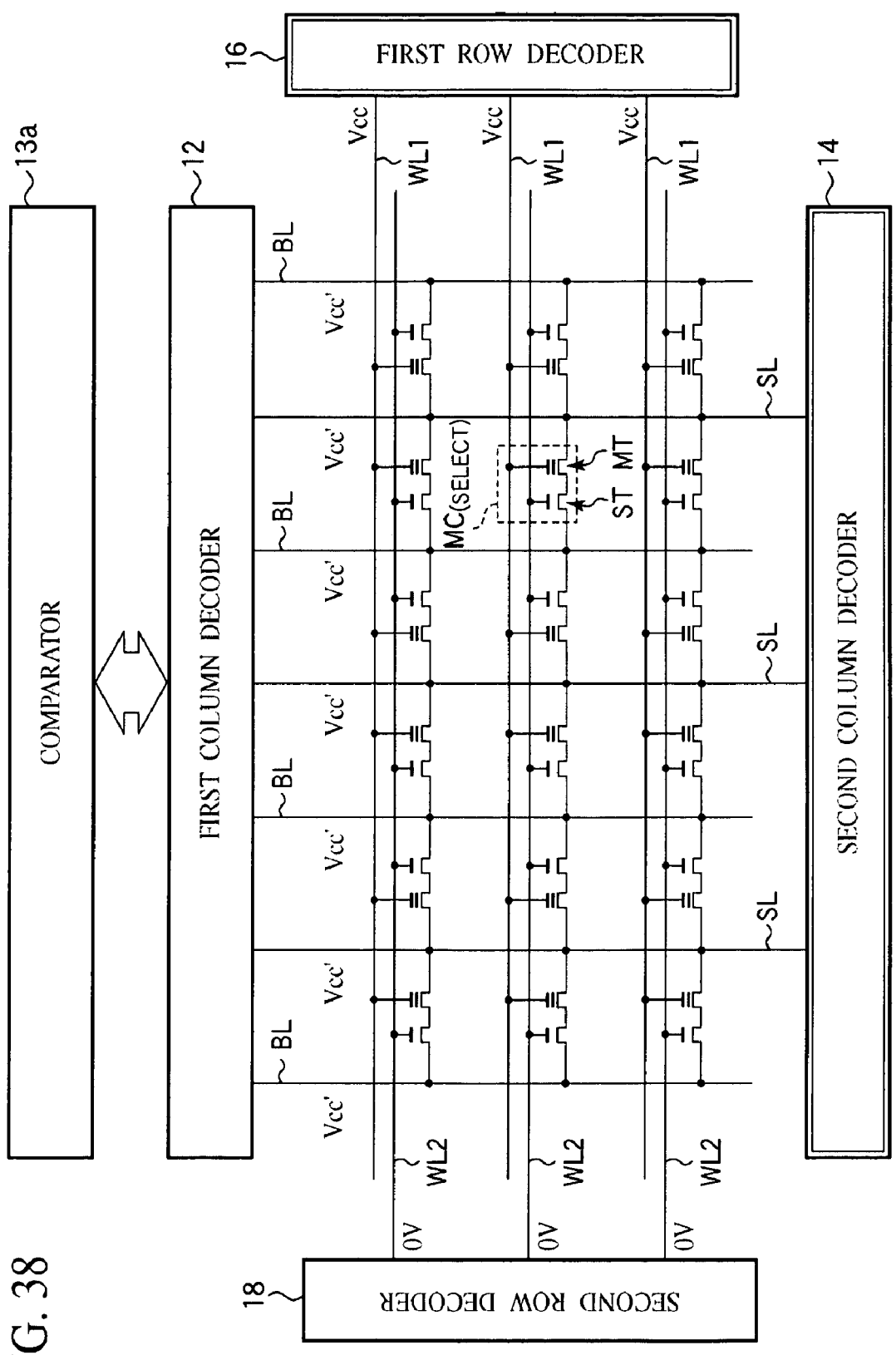
FIG. 38 is a circuit diagram (Part 1) of the nonvolatile semiconductor memory device according to the fourth embodiment, which illustrates the reading method thereof.
Figure 39:
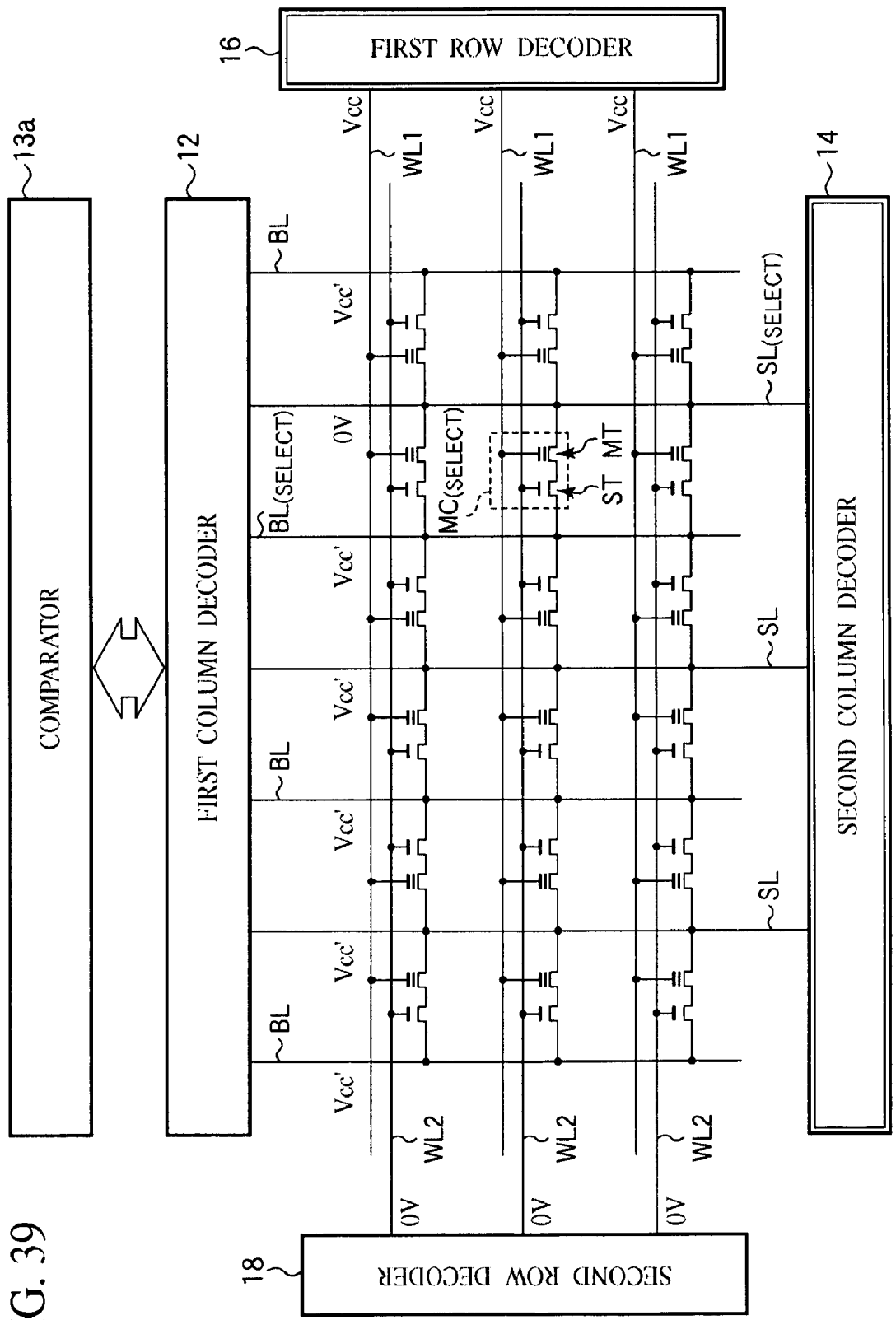
FIG. 39 is a circuit diagram (Part 2) of the nonvolatile semiconductor memory device according to the fourth embodiment, which illustrates the reading method thereof.
Figure 40:
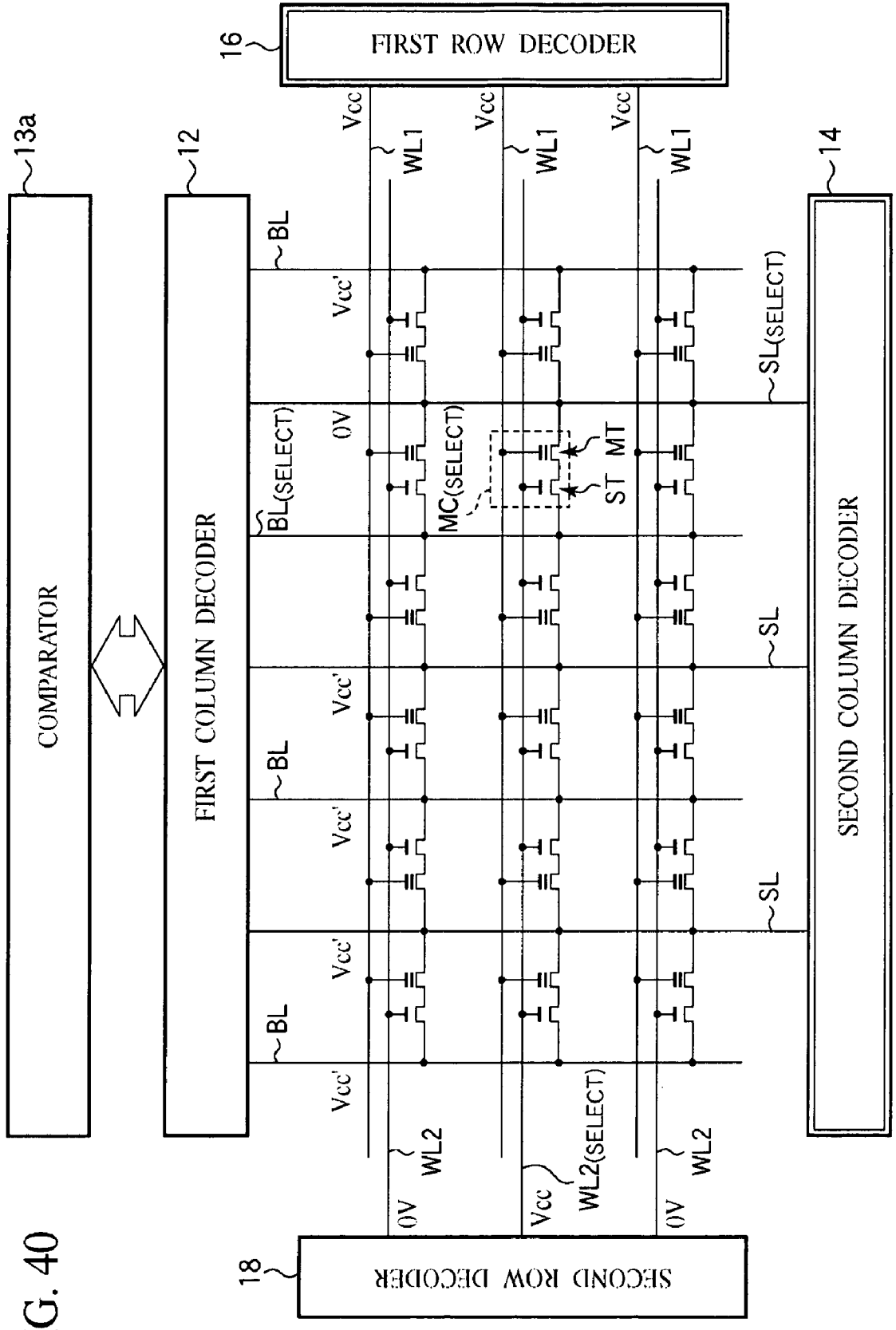
FIG. 40 is a circuit diagram (Part 3) of the nonvolatile semiconductor memory device according to the fourth embodiment, which illustrates the reading method thereof.

A reading method of the nonvolatile semiconductor memory device according to a fourth embodiment will be explained with reference to FIGS. 35 to 40. FIG. 35 is the circuit diagram of the nonvolatile semiconductor memory device according to the present embodiment. FIG. 36 is the view illustrating the reading method, a writing method and an erasing method of the nonvolatile semiconductor memory device according to the present embodiment. In FIG. 36, the voltages in the parentheses are the potentials of the non-selected lines. In FIG. 36, F indicates floating. FIG. 37 is the time chart of the reading method of the nonvolatile semiconductor memory device according to the present embodiment. FIGS. 38 to 40 are the circuit diagram of the nonvolatile semiconductor memory device according to the present embodiment, which illustrate the writing method thereof. The same members of the present embodiment as those of the nonvolatile semiconductor memory device according to the first to the third embodiments illustrated in FIGS. 1 to 34 are represented by the same reference numbers not to repeat or to simplify their explanation.

(Nonvolatile Semiconductor Memory Device)

The nonvolatile semiconductor memory device according to the present embodiment will be explained with reference to FIG. 35.

The nonvolatile semiconductor memory device according to the present embodiment is characterized mainly in that a comparator 13a is connected to the first column decoder 12.

As illustrated in FIG. 35, the first column decoder 12 is connected to the comparator 13a. The comparator 13a compares the potential of the selected bit line $BL_{(SELECT)}$ with the potential $V_{CC}'$ of the non-selected source lines SL.

When the potential of the selected bit line $BL_{(SELECT)}$ is higher than the potential $V_{CC}'$ of the non-selected source lines SL, the output of the comparator 13a becomes, e.g., "H" level (high level).

On the other hand, when the voltage of the selected bit line $BL_{(SELECT)}$ is lower than the voltage $V_{CC}'$ of the non-selected source lines SL, the output of the comparator 13a becomes, e.g., "L" (low level).

The output of the comparator 13a is read by an outside circuit (not illustrated) connected to the comparator 13.

As described above, the nonvolatile semiconductor memory device according to the present embodiment is constituted.

(Reading Method)

Next, the reading method of the nonvolatile semiconductor memory device according to the present embodiment will be explained with reference to FIGS. 36 to 40.

When information written into the memory cell transistor MT of the selected cell $MC_{(SELECT)}$ is read, in accordance with the time chart of FIG. 37, the potentials of the respective parts are set as illustrated in FIG. 36 and FIGS. 38 to 40.

First, the address of the memory cell to be selected (selected cell) $MC_{(SELECT)}$ is verified.

Then, the potential of all the bit lines BL is set at $V_{CC}'$, and the voltage of all the source lines SL is set at $V_{CC}'$ (see FIG. 38). $V_{CC}'$ is a voltage equal to a source voltage (power supply voltage) $V_{CC}$ or lower than the source voltage $V_{CC}$. Thus, all the bit lines BL and all the source lines SL are charged up to $V_{CC}'$. The potential of all the first word lines WL1 is constantly $V_{CC}$ on standby for read. The potential of all the wells 26 is 0 V.

Then, the potential of the selected bit line $BL_{(SELECT)}$ connected to the drain of the selecting transistor ST of the selected cell $MC_{(SELECT)}$ is set at $V_{CC}$. The potential of the selected source line $SL_{(SELECT)}$ connected to the memory cell transistor MT of the selected cell $MC_{(SELECT)}$ is set at 0 V (see FIG. 39).

Next, the selected bit line $BL_{(SELECT)}$, the non-selected source lines SL are connected to the comparator 13a (see FIG. 37). Specifically, the non-selected source lines SL are connected to one input terminal (reference input terminal) of the comparator 13a, and the selected bit line $BL_{(SELECT)}$ is connected to another input terminal of the comparator 13a.

Then, the potential of the second word line $WL2_{(SELECT)}$ connected to the selected cell $MC_{(SELECT)}$ is set at $V_{CC}$ (see FIG. 40). The potential of all the second word lines WL2 other than the selected second word line WL2$_{(SELECT)}$ is set at 0 V.

When information is written into the memory cell transistor MT of the selected cell MC$_{(SELECT)}$, i.e., when information "1" is written into the memory cell transistor MT of the selected cell MC$_{(SELECT)}$, charges are stored in the floating gate 30a of the memory cell transistor MT. In such case, no current flows between the source diffused layer 36a of the memory cell transistor MT and the drain diffused layer 36c of the selecting transistor ST, and no current flows in the selected one bit line (selected bit line) BL$_{(SELECT)}$. Accordingly, the potential of the selected bit line BL$_{(SELECT)}$ is V$_{CC}$. Even if leak current should flow in the memory cells MC other than the selected cell MC$_{(SELECT)}$, the potential of the selected bit line BL$_{(SELECT)}$ never becomes lower than V$_{CC}$'. When the voltage of the selected bit line BL$_{(SELECT)}$ is higher than V$_{CC}$' of the non-selected source line SL, the output of the comparator 13a becomes, e.g., "H" level. When the output of the comparator 13a is, e.g., "H" level, the information of the memory cell transistor MT of the selected cell MC$_{(SELECT)}$ is judged to be "1" (see FIG. 37).

On the other hand, when information written into the memory cell transistor MT of the selected cell MC$_{(SELECT)}$ has been erased, i.e., the information in the memory cell transistor MT of the selected memory cell MC$_{(SELECT)}$ is "0", no charges are stored in the floating gate 30a of the memory cell transistor MT. In such case, current flows between the source diffused layer 36a of the memory cell transistor MT and the drain diffused layer 36c of the selecting transistor ST, and current flows in the selected bit line BL$_{(SELECT)}$. Thus, the potential of the selected bit line BL$_{(SELECT)}$ lowers gradually and finally to 0 V. When the potential of the selected bit line BL$_{(SELECT)}$ is lower than V$_{CC}$' of the non-selected source lines SL, the output of the comparator 13a becomes, e.g., "L" level. When the output of the comparator 13a is, e.g., "L" level, the information in the memory cell transistor MT of the selected cell MC$_{(SELECT)}$ is judged to be "0" (see FIG. 37).

Thus, the information written into the memory cell transistor MT of the selected cell MC$_{(SELECT)}$ is read.

The writing method and the erasing the nonvolatile semiconductor memory device according to the present embodiment are the same as the writing method and the erasing method of the nonvolatile semiconductor memory device according to the first embodiment.

[e] Fifth Embodiment

Figure 41:
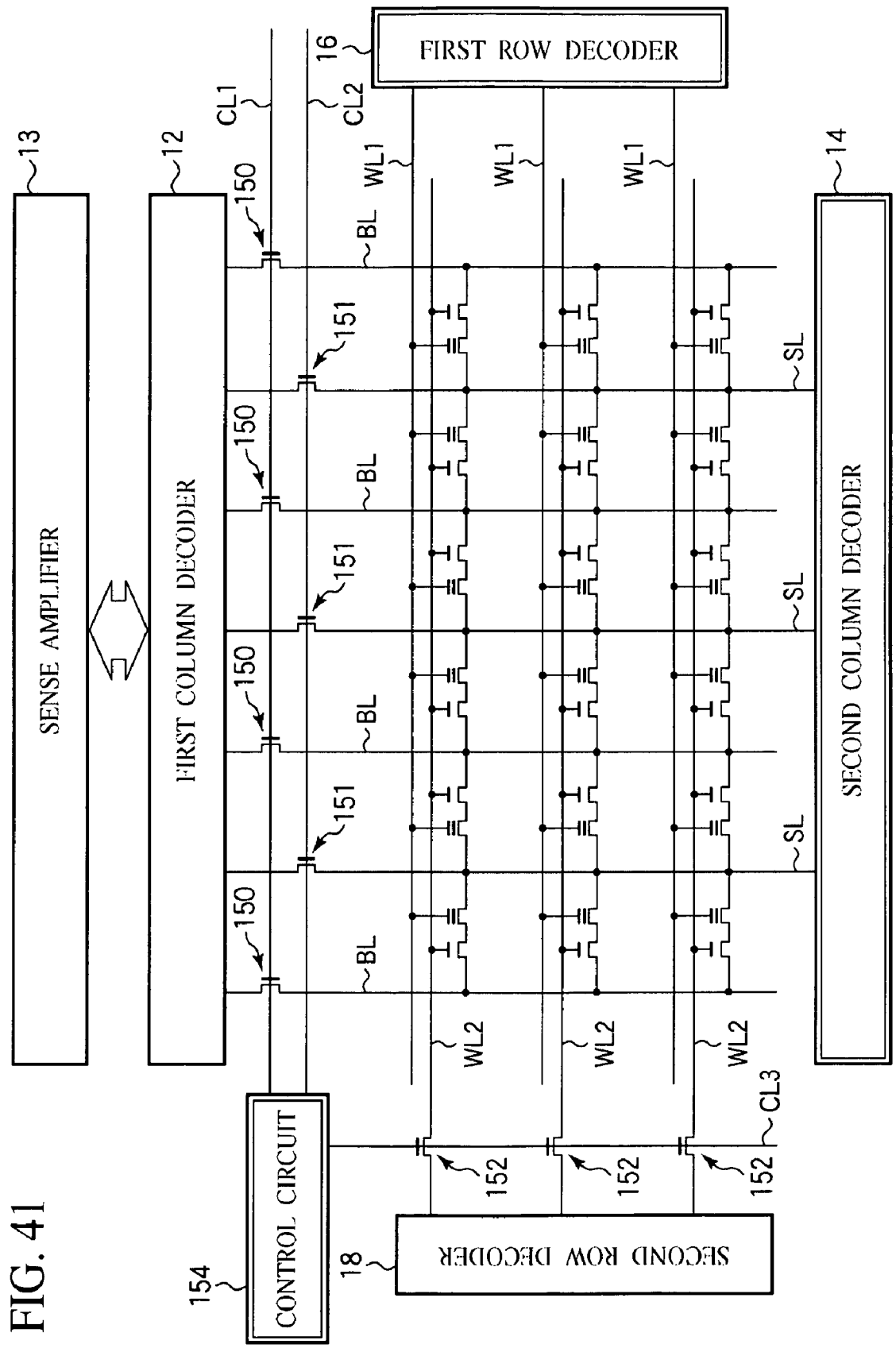
FIG. 41 is a circuit diagram of the nonvolatile semiconductor memory device according to a fifth embodiment.

The nonvolatile semiconductor memory device according to a fifth embodiment, and a reading method, a writing method and an erasing method of the nonvolatile semiconductor memory device will be explained with reference to FIGS. 41 and 42. FIG. 41 is the circuit diagram of the nonvolatile semiconductor memory device according to the present embodiment. The same members of the present embodiment as those of the nonvolatile semiconductor memory device, etc. according to the first to the fourth embodiments are represented by the same reference numbers not to repeat or to simplify their explanation.

(Nonvolatile Semiconductor Memory Device)

First, the nonvolatile semiconductor memory device according to the present embodiment will be explained with reference to FIG. 41.

The nonvolatile semiconductor memory device according to the present embodiment is characterized mainly in that the bit lines BL are connected to the first column decoder 12 via the first protection transistors 150, and the source lines SL are connected to the first column decoder 12 via the second protection transistors 151, the second word lines WL2 are connected to the second row decoder 18 via the third protection transistors 152.

As illustrated in FIG. 41, the respective bit lines BL are connected to the row decoder 12 via the associated first protection transistors 150. In other words, one of the source/drain of each of the first protection transistors 150 is connected to the associated bit line BL, and the other of the source/drain of each of the first protection transistors 150 is connected to the column decoder 12.

The respective first protection transistors 150 are connected to a control circuit 154 via the first control line CL1. The respective first protection transistors 150 are controlled by the control circuit 154.

The film thickness of the gate insulation film (not illustrated) of the first protection transistors 150 is equal to the film thickness of the gate insulation film 28b of the selecting transistors SL. The film thickness of the gate insulation film of the first protection transistors 150 is set to be relatively thick, as is the film thickness of the gate insulation film 28b of the selecting transistors ST so as to make sufficient the withstand voltage of the first protection transistors 150.

The respective source lines SL are connected to the row decoder 12 via the second protection transistors 151. In other words, one of the source/drain of each of the second protection transistors 151 is connected to the source line SL, and the other of the source/drain of each of the second protection transistors 151 is connected to the column decoder 12.

The gate of the respective second protection transistors 151 are connected to the control circuit 154 via the second control line CL2. The respective second protection transistors 151 are controlled by the control circuit 154.

The film thickness of the gate insulation film (not illustrated) of the second protection transistors 151 is set equal to the film thickness of the gate insulation film 28b of the selecting transistors ST. The film thickness of the gate insulation film of the second protection transistors 151 is set to be relatively thick, as is the film thickness of the gate insulation film 28b of the selecting transistors ST so as to make sufficient the withstand voltage of the second protection transistors 151.

The respective second word lines WL2 are connected to the second row decoder 18 via the third protection transistors 152. In other words, one of the source/drain of each of the third protection transistors 152 is connected to the second word lines WL2, and the source/drain of each of the third protection transistors 152 is connected to the second row decoder 18.

The gates of the respective third protection transistors 152 are connected to the control circuit 154 via the third control line CL3. The respective third protection transistors 152 are controlled by the control circuit 154.

The film thickness of the gate insulation film (not illustrated) of the third protection transistors 152 is set equal to the film thickness of the gate insulation film 28b of the selecting transistors ST. The film thickness of the gate insulation film of the third protection transistors 152 is set to be relatively thick, as is the film thickness of the gate insulation film 28b of the selecting transistors ST so as to make sufficient the withstand voltage of the third protection transistors 152.

Thus, the nonvolatile semiconductor memory device according to the present embodiment is constituted.

(Operations of the Nonvolatile Semiconductor Memory Device)

Next, the operations of the nonvolatile semiconductor memory device according to the present embodiment will be explained with reference to FIGS. 41 and 42. FIG. 42 is the view illustrating the reading method, the writing method and the erasing method of the nonvolatile semiconductor memory device according to the present embodiment. In FIG. 42, the voltages in the parentheses are potentials of the non-selected lines. In FIG. 42, F indicates floating.

(Reading Method)

First, the reading method of the nonvolatile semiconductor memory device according to the present embodiment will be explained with reference to FIG. 42.

In the present embodiment, when information written into a memory cell transistors MT is read, the potential of the first control line CL1 is set at 5 V, the potential of the second control line CL2 is set at 5 V, and the potential of the third control line CL3 is set at 5 V. That is, in the present embodiment, when information written into the memory cell transistors MT is read, the first protection transistors 150, the second protection transistors 151 and the third protection transistors 152 are turned on-state. The potential of the bit lines BL, the potential of the source lines SL, the potential of the first word lines WL1, the potential of the second word lines WL2 and the potential of the wells 26 are the same as the potentials of the respective parts in the reading method of the nonvolatile semiconductor memory device according to any one of the first to the fourth embodiments.

With the first protection transistors 150, the second protection transistors 151 and the third protection transistors 152 turned on-state, the bit lines BL are electrically connected to the first column decoder 12, the source lines SL are electrically connected to the first column decoder 12, and the second word lines WL2 are electrically connected to the second row decoder 18. Thus, the nonvolatile semiconductor memory device according to the present embodiment can read information written into the memory cell transistors MT in the same way as the reading method of the nonvolatile semiconductor memory device according to any one of the first to the fourth embodiments.

(Writing Method)

Next, the writing method of the nonvolatile semiconductor memory device according to the present embodiment will be explained with reference to FIGS. 41 and 42.

In the present embodiment, when information is written into a memory cell transistors MT, the potential of the first control line CL1 is set at 5 V, and the potential of the second control line CL2 is set at 0 V, and the potential of the third control line CL3 is set at 5 V. That is, in the present embodiment, when information is written into the memory cell transistors MT, the first protection transistors 150 and the third protection transistors 152 are turned on-state. On the other hand, the second protection transistors 151 are turned off-state. The potential of the bit lines BL, the potential of the source lines SL, the potential of the first word lines WL1, the potential of the second word lines WL2 and the potential of the wells 26 are the same as the potentials in the reading method of the nonvolatile semiconductor memory device according to any one of the first to the fourth embodiments.

When information is written into a memory cell transistor MT, a high voltage is applied to the selected source line $SL_{(SELECT)}$ by the second column decoder 14. Because of the first column decoder 12 which comprises a low voltage circuit (low withstand voltage circuit), when the high voltage is applied to the selected source line $SL_{(SELECT)}$ by the column decoder 14 with the selected source line $SL_{(SELECT)}$ being connected to the first column decoder 12, there is a risk that the first column decoder 12 will be broken. In the present embodiment, the second protection transistors 151 are turned off-state when information is written into the memory cell transistors MT, whereby the first column decoder 12 comprising a low voltage circuit is electrically isolated from the source lines SL. Thus, according to the present embodiment, the first column decoder 12 comprising a low voltage circuit is prevented from being broken when information is written into the memory cell transistors MT.

(Erasing Method)

Next, the erasing method of the nonvolatile semiconductor memory device according to the present embodiment will be explained with reference to FIG. 32.

When information written into the memory cell array 10 is erased, the voltage of the first control line CL1 is set at 0 V, the potential of the second control line CL2 is set at 0 V, and the potential of the third control line CL3 is set at 0 V. That is, in the present embodiment, when information written into the memory cell transistors MT is erased, the first protection transistors 150, the second protection transistors 151 and the third protection transistors 152 are turned off-state. The potential of the bit lines BL, the potential of the source lines SL, the potential of the first word lines WL1, the potential of the second word lines WL2 and the potential of the wells 26 are the same as the potentials of the respective parts in the erasing method of the nonvolatile semiconductor memory device according to any one of the first to the fourth embodiments.

When information written into the memory cell array 10 is erased, a high voltage is applied to the first word lines WL1 and the wells 26. Because of the first column decoder 12 and the second row decoder 18, which comprise low voltage circuits, there is a risk that the first column decoder 12 and the second row decoder 18 might be broken when information in the memory cell array 10 is erased with the first column decoder 12 and the second row decoder 18 being electrically connected to the memory cell array 10. In the present embodiment, when information written into the memory cell array 10 is erased, the first protection transistors 150, the second protection transistors 151 and the third protection transistors 152 are turned off-state, whereby the bit lines BL are electrically isolated form the first column decoder 12, the source lines SL are electrically isolated from the first column decoder 12, and the second word lines WL2 are electrically isolated from the second row decoder 18. That is, in the present embodiment, when information written into the memory cell array 10 is erased, the first column decoder 12 and the second row decoder 16, which comprise low voltage circuits, are electrically isolated from the memory cell array 10. Thus, according to the present embodiment, the first column decoder 12 and the second row decoder 18, whose withstand voltage are low, are prevented from being broken when information written into the memory cell array 10 is erased.

[f] Sixth Embodiment

Figure 44:
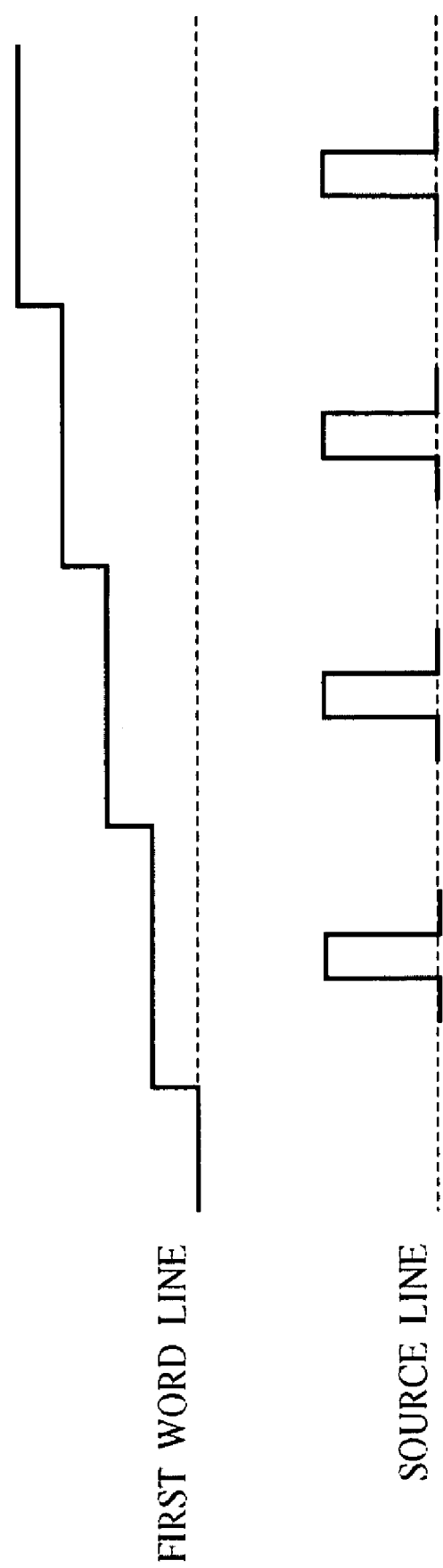
FIG. 44 is a time chart of the writing method of the nonvolatile semiconductor memory device according to the sixth embodiment.
Figure 45:
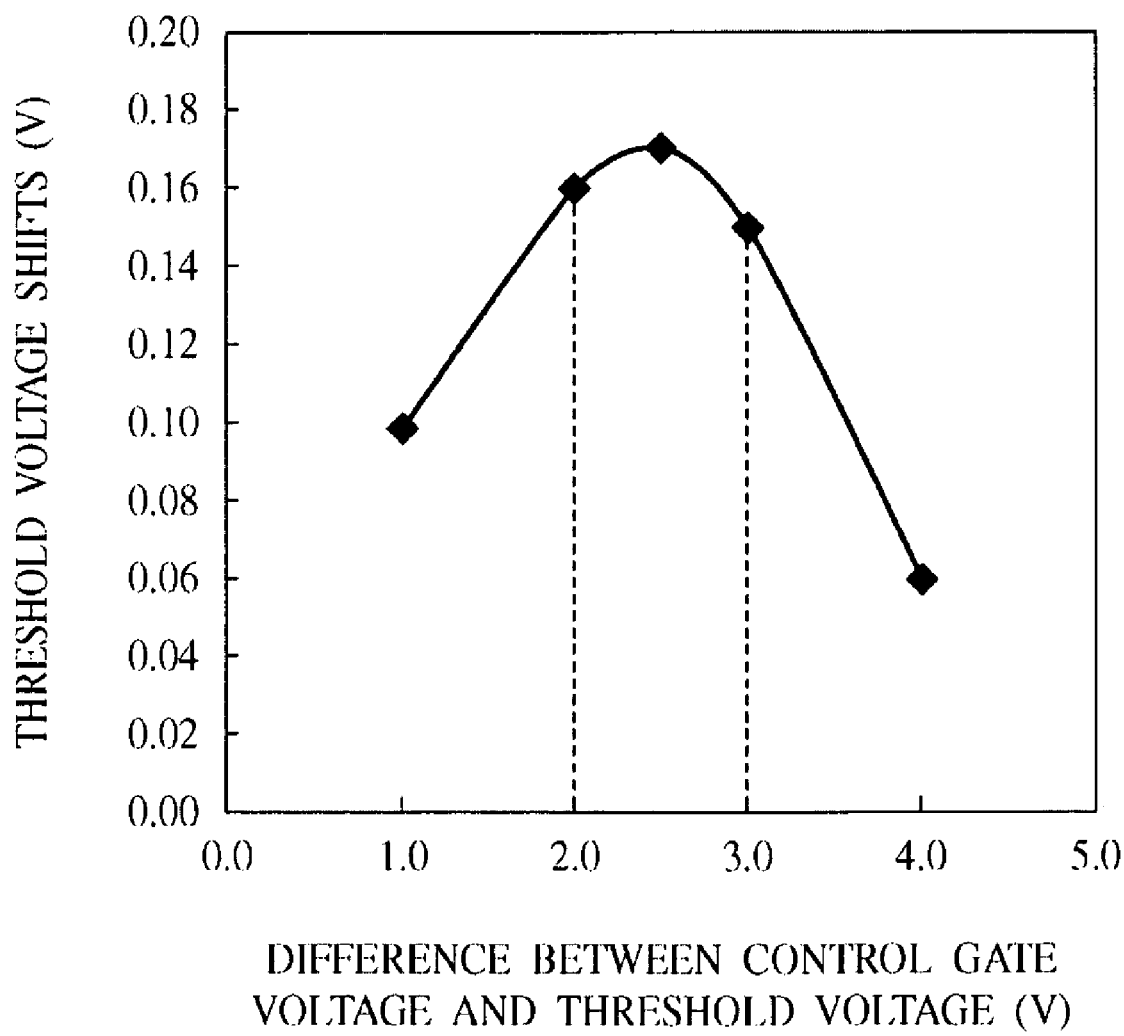
FIG. 45 is a graph of relationships between the difference of the control gate voltage and a threshold voltage, and shifts of the threshold voltage.

A writing method of the nonvolatile semiconductor memory device according to a sixth embodiment will be explained with reference to FIGS. 43 to 45. FIG. 43 is a view illustrating a reading method, the writing method and an erasing method of the nonvolatile semiconductor memory device according to the present embodiment. In FIG. 43, the voltages in the parentheses are potentials of the non-selected lines. In FIG. 43, F indicates floating. FIG. 44 is the time chart of the writing method of the nonvolatile semiconductor memory device according to the present embodiment. FIG. 45 is a graph of the relationships between the difference between the control gate voltage and the threshold voltage, and the shifts of the threshold voltage. The members of the present embodiment as those of the nonvolatile semiconductor memory device, etc. according to the first to the fifth embodiments are represented by the same reference numbers not to repeat or to simplify their explanation.

The constitution of the nonvolatile semiconductor memory device according to the present embodiment is the same as the constitution of the nonvolatile semiconductor memory device according to any one of the first to the fifth embodiments.

The writing method of the nonvolatile semiconductor memory device according to the present embodiment is characterized mainly in that the potential of the first word line $WL1_{(SELECT)}$ connected to a selected cell $MC_{(SELECT)}$ is gradually increased to apply the pulsated voltage to the selected source line $SL_{(SELECT)}$ to thereby write information into the memory cell transistor MT of the selected cell $MC_{(SELECT)}$.

When information is written into the memory cell transistor MT, as illustrated in FIG. 43, the potential of the selected bit line $BL_{(SELECT)}$ is set at 0 V. The potential of the adjacent bit line $BL_{(ADJACENT)}$ is set at $V_{CC}$. The potential of the other bit lines BL, i.e., the voltage of the bit lines BL other than the selected bit line $BL_{(SELECT)}$ and the adjacent bit line $BL_{(ADJACENT)}$ is 0 V (ground voltage).

The potential of the second word line $WL2_{(SELECT)}$ connected to the selected cell $MC_{(SELECT)}$ is set at $V_{CC}$. On the other hand, the potential of the second word lines WL2 other than the selected second word line $WL2_{(SELECT)}$ is set at 0 V (ground voltage).

To the first word line $WL1_{(SELECT)}$ connected to the selected cell $MC_{(SELECT)}$, as illustrated in FIG. 44 the gradually rising voltage $V_{step}$ is applied. On the other hand, the potential of the first word lines WL1 other than the selected first word line $WL1_{(SELECT)}$ is set at 0 V (ground voltage) or floating.

To the selected source line $SL_{(SELECT)}$ connected to the selected cell $MC_{(SELECT)}$, as illustrated in FIG. 44, the pulsated voltage is applied. The pulsated voltage to be applied to the selected source line $SL_{(SELECT)}$ is, e.g., 5 V. On the other hand, the potential of the source lines SL other than the selected source line $SL_{(SELECT)}$ is set at 0 V (ground voltage) or floating.

The potential of the wells 26 is constantly 0 V (ground voltage).

In the present embodiment, the voltage $V_{step}$ to be applied to the selected first word line $WL1_{(SELECT)}$ is applied in pulses while being gradually raised for the following reason. That is, when a high voltage is applied to the control gate 34b of the memory cell transistor MT, the electric resistance between the source and the drain of the memory cell transistor MT becomes small. Then, the electric resistance between the source and the drain of the memory cell transistor MT becomes smaller in comparison with the electric resistance between the source and the drain of the selecting transistor ST. Then, a large transverse electric field is applied to the source/drain of the selecting transistors ST, and on the other hand, a sufficient transverse electric filed is not applied to the source/drain of the memory cell transistor MT. When a sufficient transverse electric field is not applied to the source/drain of the memory cell transistor MT, charges are not accelerated between the source and the drain of the memory cell transistor MT, and the write speed becomes slow. In the present embodiment, at the initial state of the writing, a relatively low voltage is applied to the selected first word line $WL1_{(SELECT)}$, and the electric resistance between the source and the drain of the memory cell transistor MT never becomes excessively high. Then, a pulsated voltage is applied to the selected source line $SL_{(SELECT)}$, charges are injected into the floating gate 30a of the memory cell transistor MT. Then, while the voltage of the selected first word line $WL1_{(SELECT)}$ is gradually raised, the pulsated voltage is applied to the selected source line $SL_{(SELECT)}$, and then charges are gradually injected into the floating gate 30a of the memory cell transistor MT. The voltage $V_{step}$ to be applied to the selected first word line $WL1_{(SELECT)}$ gradually rises, and the charges to be stored in the floating gate 30a also gradually increase. Accordingly, the electric resistance of the source/drain of the memory cell transistor MT never becomes excessively large. Accordingly to the present embodiment, the write speed of writing information into the memory cell transistor MT can be high.

FIG. 45 is a graph of the relationships of the difference between the control gate voltage and the threshold voltage, and shifts of the threshold voltage. As seen in FIG. 45, the voltage of a selected first word line $WL1_{(SELECT)}$ is so raised that the difference between the control gate voltage and the threshold voltage of the memory cell transistor MT becomes 2-3 V, whereby the shifts of the threshold voltage of the memory cell transistor MT which changes every time the voltage of the selected first word line $WL1_{(SELECT)}$ rises can be set relatively large. The shift of the threshold voltage of the memory cell transistor MT which shifts every time the voltage of the selected first word line $WL1_{(SELECT)}$ rises becomes large, information can be written at high speed in the memory cell transistor MT. Thus, it is preferable to gradually raise the voltage of the selected first word line $WL1_{(SELECT)}$ so that the difference of the control gate voltage and the threshold voltage of the memory cell transistor MT becomes 2-3 V.

Figure 46:
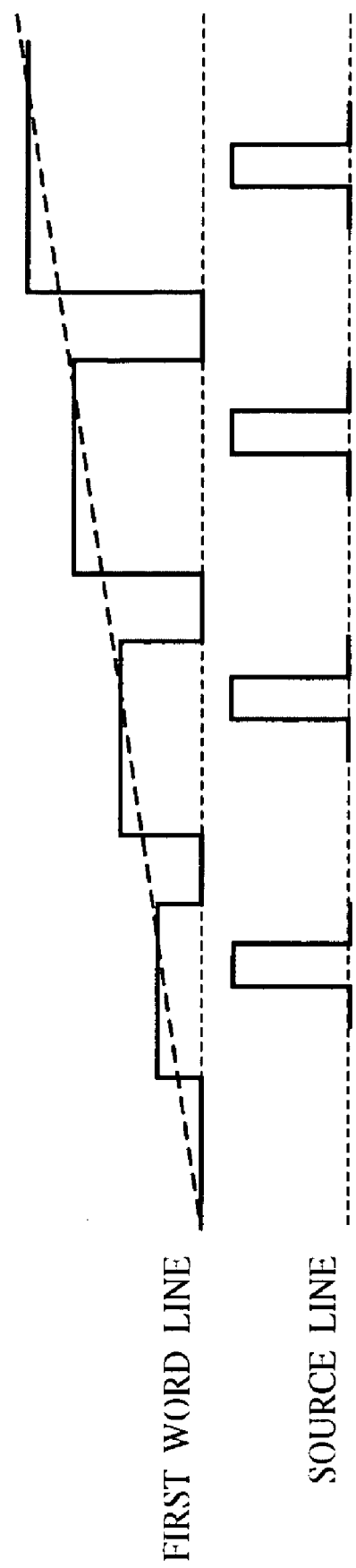
FIG. 46 is a time chart of another example of the writing method of the nonvolatile semiconductor memory device according to the sixth embodiment.

The present embodiment has been explained here by means of the example that, as illustrated in FIG. 44, the voltage to be applied to the selected first word line $WL_{(SELECT)}$ is gradually increased, but the voltage to be applied to the selected first word line $WL1_{(SELECT)}$ is not limited to the voltage illustrated in FIG. 44. For example, as indicated by the broken line in FIG. 46, the voltage to be applied to the selected first word line $WL1_{(SELECT)}$ may be continuously raised. FIG. 46 is the time chart of another example of the writing method of the nonvolatile semiconductor memory device according to the present embodiment. It is possible that as indicated by the solid lines in FIG. 46, the voltage is raised, then temporarily lowered and is further raised to be applied.

[g] Seventh Embodiment

Figure 47:
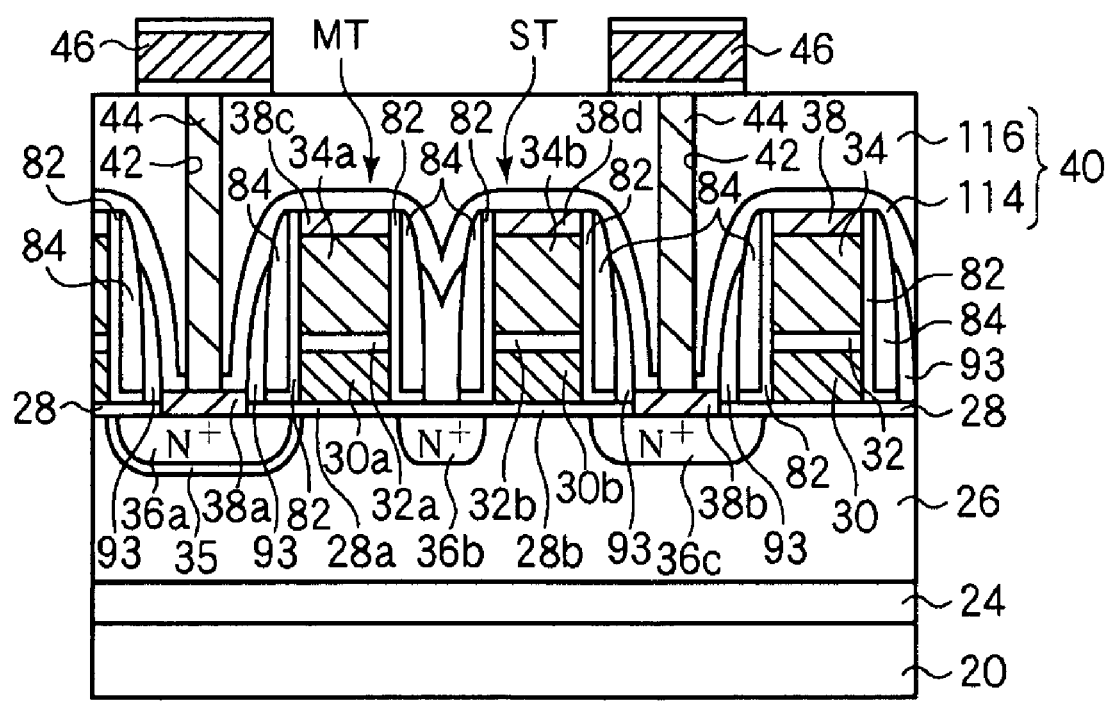
FIG. 47 is a sectional view of the nonvolatile semiconductor memory device according to a seventh embodiment.

A reading method of the nonvolatile semiconductor memory device according to a seventh embodiment will be explained with reference to FIGS. 47 and 48. FIG. 47 is the sectional view of the nonvolatile semiconductor memory device according to the present embodiment. FIG. 48 is a view illustrating a reading method, the writing method and an erasing method of the nonvolatile semiconductor memory device according to the present embodiment. In FIG. 48, the voltages in the parentheses are potentials of the non-selected lines. In FIG. 48, F indicates floating. The same members of the present embodiment as those of the nonvolatile semiconductor memory device according to the first to the sixth embodiments illustrated in FIGS. 1 to 46 are represented by the same reference numbers not to repeat or to simplify their explanation.

(Nonvolatile Semiconductor Memory Device)

The nonvolatile semiconductor memory device according to the present embodiment will be explained with reference to FIG. 47.

The nonvolatile semiconductor memory device according to the present embodiment is characterized mainly in that a P-type dopant impurity is implanted in the region where an N-type source diffused layer 36a is formed, whereby a P-type impurity diffused layer 35 is formed.

As illustrated in FIG. 47, a P-type dopant impurity is implanted in a region containing the region where the N-type source diffused layer 36a is formed. Thus, the P-type impurity diffused layer 35 is formed in the region containing the region where the N-type source diffused layer 36a is formed.

In the present embodiment, the P-type impurity diffused layer 35 is formed in the region containing the region where the N-type source diffused layer 36a is formed for the following reason.

That is, because of the P-type impurity diffused layer 35 is formed in the region containing the region where the N-type source diffused layer 36a is formed, the expansion of the depletion layer from the N-type source diffused layer 36a can be suppressed. With the expansion of the depletion layer from the N-type source diffused layer 36a being suppressed, the electric field intensity increases near the N-type source diffused layer 36a, and near the N-type source diffused layer 36a, carriers can be abruptly accelerated. In the present embodiment, carriers can be abruptly accelerated, whereby the speed of writing information into the memory cell transistors MT can be improved.

The P-type dopant impurity is not implanted in the region where the source/drain diffused layers 36b, 36c of the selecting transistors ST are formed, and the selecting transistors ST are never influenced by the P-type dopant impurity. Accordingly, the threshold voltage of the selecting transistor ST never rises, and the selecting transistor ST can make high speed operation.

(Reading Method)

The reading method of the nonvolatile semiconductor memory device according to the present embodiment is characterized mainly in that a voltage Vr which is higher than a source voltage $V_{CC}$ of the logic circuit is applied to the first word lines WL1.

In the present embodiment, since the P-type impurity diffuse layer 35 is formed in the region containing the N-type source diffused layer 36a of the memory cell transistors MT, the threshold voltage of the memory cell transistor MT is relatively high. Accordingly, when $V_{CC}$ which is a relatively low voltage is applied to the first word line WL1, there is a risk that sufficient current might not flow between the source and the drain of the memory cell transistor MT.

Thus, according to the present embodiment, when information written into the memory cell transistor MT, the voltage Vr, which is higher than the source voltage $V_{CC}$ of the logic circuit is applied to the first word line WL1. The relatively high voltage Vr is applied to the first word line WL1, whereby sufficient current can flow between the source and the drain of the memory cell transistor MT, and information written into the memory cell transistor MT can be read stably.

Modified Embodiments

The present invention is not limited to the above-described embodiments and can cover other various modifications.

For example, in the above-described embodiments, when information is written into a memory cell transistor MT, the potential of the selected source line $SL_{(SELECT)}$ is set at 5 V. The potential of the selected source line $SL_{(SELECT)}$ in writing information in the memory cell transistor MT is not limited to 5 V. The potential of the selected source line $SL_{(SELECT)}$ in writing information into the memory cell transistor MT may be higher than the source voltage $V_{CC}$ of the logic circuit. A voltage which is higher than at least the source voltage $V_{CC}$ of the logic circuit is applied to the selected source line $SL_{(SELECT)}$ to thereby increase the current flowing in the channel of the selecting transistor ST, and the write speed can be increased.

In the above-described embodiments, when information is written into a memory cell transistor MT, the potential of the selected first word line $WL1_{(SELECT)}$ is set at 9 V. However, the potential of the selected first word line $WL1_{(SELECT)}$ selected in writing information into the memory cell transistor MT is not limited to 9 V. The potential of the selected first word lie $WL1_{(SELECT)}$ in writing information into the memory cell transistor MT may be a potential which is higher than a potential of the selected source line $SL_{(SELECT)}$.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A nonvolatile semiconductor memory device comprising:

a memory cell array of a plurality of memory cells arranged in a matrix, each memory cell including a selecting transistor and a memory cell transistor connected to the selecting transistor;

a bit line commonly connecting drains of a plurality of said selecting transistors arranged in two adjacent columns;

a first word line commonly connecting control gates of a plurality of said selecting transistors arranged in a row;

a second word line commonly connecting select gates of a plurality of said selecting transistors arranged in a row;

a source line commonly connecting sources of a plurality of said memory cell transistors arranged in two adjacent columns;

a first column decoder connected to a plurality of said bit lines and a plurality of said source lines and controlling potentials of said plurality of bit lines and said plurality of source lines;

a first row decoder connected to a plurality of said first word lines and controlling potentials of said plurality of first word lines;

a second row decoder connected to a plurality of said second word lines and controlling potentials of said plurality of second word lines; and a second column decoder connected to a plurality of said source lines and controlling potentials of said plurality of source lines, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder.

2. The nonvolatile semiconductor memory device according to claim 1, further comprising a comparator comparing the potential of the bit line and the potential of the source line adjacent to the bit line.

3. The nonvolatile semiconductor memory device according to claim 1, in which said a plurality of bit lines are connected to the first column decoder respectively via first protection transistors;

said a plurality of source lines are connected to the first column decoder respectively via second protection transistors;

said a plurality of second word lines are connected to the second row decoder respectively via third protection transistors, and said nonvolatile semiconductor memory device further comprises a control circuit controlling said a plurality of first protection transistors, said a plurality of second protection transistors and said a plurality of third protection transistors.

4. The nonvolatile semiconductor memory device according to claim 1, wherein the memory cell transistor includes a floating gate formed over a semiconductor substrate with a tunnel insulation film therebetween; a control gate formed over the floating gate with an insulation film therebetween; a N-type first impurity diffused layer formed in the semiconductor substrate on one side of the floating gate and forming the source; and a N-type second impurity diffused layer formed in the semiconductor substrate on the other side of the floating gate and a P-type dopant impurity is implanted in a region containing the region where the first impurity diffused layer is formed.

5. A reading method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines and a plurality of said source lines and controlling potentials of said plurality of bit lines and said plurality of source lines; a first row decoder connected to a plurality of said first word lines and controlling potentials of said plurality of first word lines; a second row decoder connected to a plurality of said second word lines and controlling potentials of said plurality of second word lines; and a second column decoder connected to a plurality of said source lines and controlling potentials of said plurality of source lines, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

applying a first voltage by the first column decoder to one of said bit lines connected to the drain of the selecting transistor of one of said memory cells;

grounding by the first column decoder one of said source lines, which is positioned on a first side with respect to said one bit line and is connected to the source of the memory cell transistor of said one memory cell;

applying a second voltage by the first row decoder to one of the first word lines, which is connected to the control gate of the memory cell transistor of said one memory cell; and applying a third voltage by the second row decoder to one of the second word lines, which is connected to the select gate of the selecting transistor of said one memory cell, whereby information written into said one memory cell is read based on a potential of said one bit line.

6. The reading method of the nonvolatile semiconductor memory device according to claim 5, wherein the first voltage is further applied by the first column decoder to another of said source lines, which is positioned on a second side opposite to the first side with respect to said one bit line and which is adjacent to said one bit line.

7. The reading method of the nonvolatile semiconductor memory device according to claim 6, wherein the first voltage is further applied by the first column decoder to another of said bit lines, which is positioned on the second side with respect to said another source line and is adjacent to said another source line.

8. A reading method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines and a plurality of said source lines and controlling potentials of said plurality of bit lines and said plurality of source lines; a first row decoder connected to a plurality of said first word lines and controlling potentials of said plurality of first word lines; a second row decoder connected to a plurality of said second word lines and controlling potentials of said plurality of second word lines; and a second column decoder connected to a plurality of said source lines and controlling potentials of said plurality of source lines, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

applying a first voltage to said a plurality of first word lines by the first row decoder and applying the second voltage by the first column decoder to said a plurality of bit lines and said a plurality of source lines;

applying by the first column decoder selectively to one of said bit lines, that is connected to the drain of the selecting transistor of one of said memory cells a third voltage which is equal to the second voltage or higher than the second voltage, and grounding by the first column decoder one of said source lines, which is connected to the source of the memory cell transistor of said one memory cell;

applying a fourth voltage by the second row decoder to one of said second word lines, which is connected to the select gate of the selecting transistor of said one memory cell, and reading information written into said one memory cell, based on a potential of said one bit line.

9. A reading method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines and a plurality of said source lines and controlling potentials of said plurality of bit lines and said plurality of source lines; a first row decoder connected to a plurality of said first word lines and controlling potentials of said plurality of first word lines; a second row decoder connected to a plurality of said second word lines and controlling potentials of said plurality of second word lines; and a second column decoder connected to a plurality of said source lines and controlling potentials of said plurality of source lines, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

applying a first voltage to said a plurality of first word lines by the first row decoder and applying a second voltage by the first column decoder to said a plurality of bit lines and said a plurality of source lines;

applying by the first column decoder a third voltage higher than the second voltage selectively to one of said bit lines, which is connected to the drain of the selecting transistor of one of said memory cells, and grounding by the first column decoder one of said source lines, which is connected to the source of the memory cell transistor of said one memory cell; and applying a fourth voltage by the second row decoder to one of the second word lines, which is connected to the select gate of the selecting transistor of said one memory cell, and comparing a potential of another of said source lines different from said one source line and a potential of said one bit line with each other to thereby read information written into said one memory cell.

10. A writing method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines and a plurality of said source lines and controlling potentials of said plurality of bit lines and said plurality of source lines; a first row decoder connected to said plurality of first word lines and controlling potentials of said plurality of first word lines; a second row decoder connected to a plurality of said second word lines and controlling potentials of said plurality of second word lines; and a second column decoder connected to a plurality of said source lines and controlling potentials of said plurality of source lines, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

grounding by the first column decoder one of said bit lines, which is connected to the drain of the selecting transistor of one of said memory cells;

applying a first voltage by the second column decoder to one of said source lines, which is positioned on a first side with respect to said one bit line and is connected to the source of the memory cell transistor of said one memory cell;

applying a second voltage by the first column decoder to another of said bit lines, which is positioned on the first side with respect to said one source line and is adjacent to said one source line;

applying a third voltage by the first row decoder to one of the first word lines, which is connected to the control gate of the memory cell transistor of said one memory cell; and applying a fourth voltage by the second row decoder to one of the second word lines, which is connected to the select gate of the selecting transistor of said one memory cell, whereby information is written into said one memory cell.

11. The writing method of the nonvolatile semiconductor memory device according to claim 10, wherein applying the fourth voltage to said one second word line after said one bit line has been grounded, and the second voltage has been applied to said another bit line;

applying the third voltage to said one word line after the fourth voltage has been applied to the said one second word line; and applying the first voltage to said one source line after the third voltage has been applied to said one first word line, whereby information is written into said one memory cell.

12. The writing method of the nonvolatile semiconductor memory device according to claim 10, wherein applying to said one source line the first voltage in pulses while the third voltage on gradual increase is being applied to said one word line.

13. The writing method of the nonvolatile semiconductor memory device according to claim 12, wherein the first row decoder gradually raises the third voltage so that the third voltage is higher than a threshold voltage of the memory cell transistor by 2 to 3 V.

14. A writing method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines via first protection transistors and a plurality of said source lines via second protection transistors and controlling potentials of said plurality of bit lines and said plurality of source lines; a first row decoder connected to a plurality of said first word lines and controlling potentials of said plurality of first word lines; a second row decoder connected to a plurality of said second word lines via third protection transistors and controlling potentials of said plurality of second word lines; a second column decoder connected to a plurality of said source lines and controlling potentials of said plurality of source lines; and a control circuit controlling a plurality of said first protection transistors, a plurality of said second protection transistors and a plurality of said third protection transistors, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

controlling the second protection transistors by the control circuit to thereby electrically isolate said a plurality of source lines from the first column decoder;

grounding by the first column decoder one of said bit lines, which is connected to the drain of the selecting transistor of one of said memory cells;

applying a first voltage by the second column decoder to one of said source lines, which is positioned on a first side with respect to said one bit line and connected to the source of the memory cell transistor of said one memory cell;

applying a second voltage by the first column decoder to another of said bit lines, which is positioned on the first side with respect to said one source line and is adjacent to said one source line;

applying a third voltage by the first row decoder to one of the first word lines connected to the control gate of the memory cell transistor of said one memory cell; and applying a fourth voltage by the second row decoder to one of the second word lines connected to the select gate of the selecting transistor of said one memory cell, whereby information is written into said one memory cell.

15. An erasing method of a nonvolatile semiconductor memory device including a memory cell array of a plurality of memory cells arranged in a matrix, each memory cell including a selecting transistor and a memory cell transistor connected to the selecting transistor; a bit line commonly connecting drains of a plurality of said selecting transistors arranged in two adjacent columns; a first word line commonly connecting control gates of a plurality of said selecting transistors arranged in a row; a second word line commonly connecting select gates of a plurality of said selecting transistors arranged in a row; a source line commonly connecting sources of a plurality of said memory cell transistors arranged in two adjacent columns; a first column decoder connected to a plurality of said bit lines via first protection transistors and a plurality of said source lines via second protection transistors and controlling potentials of said plurality of bit lines and said plurality of source lines; a first row decoder connected to a plurality of said first word lines and controlling potentials of said plurality of first word lines; a second row decoder connected to a plurality of said second word lines via third protection transistors and controlling potentials of said plurality of second word lines; a second column decoder connected to a plurality of said source lines and controlling potentials of said plurality of source lines; and a control circuit controlling a plurality of said first protection transistors, a plurality of said second protection transistors and a plurality of said third protection transistors, the first column decoder being formed of a circuit whose withstand voltage is lower than a withstand voltage of a circuit within the first row decoder and the second column decoder, and the second row decoder being formed of a circuit whose withstand voltage is lower than a withstand voltage of a circuit within the first row decoder and the second column decoder, said method comprising:

controlling the first protection transistors by the control circuit to thereby electrically isolate said a plurality of bit lines from the first column decoder;

controlling the second protection transistors by the control circuit to thereby electrically isolate said a plurality of source lines from the first column decoder;

controlling the third protection transistors by the control circuit to thereby electrically isolate the second row decoder from said a plurality of second word lines; and applying a voltage to said a plurality of first word lines by the first row decoder to thereby erase information written into the memory cells.

\* \* \* \* \*